United States Patent [19]

Matsumura et al.

[11] Patent Number: 5,400,342

[45] Date of Patent: Mar. 21, 1995

[54] SEMICONDUCTOR MEMORY HAVING TEST CIRCUIT AND TEST METHOD THEREOF

[75] Inventors: Tsuneo Matsumura, Yokohama; Tsuneo Mano; Junzo Yamada, both of Ebina; Junichi Inoue, Yokohama, all of Japan

[73] Assignee: Nippon Telegraph & Telephone Corporation, Tokyo, Japan

[21] Appl. No.: 837,667

[22] Filed: Feb. 14, 1992

Related U.S. Application Data

[63] Continuation of Ser. No. 462,853, Jan. 4, 1990, abandoned, which is a continuation of Ser. No. 109,766, Oct. 16, 1987, abandoned.

[30] Foreign Application Priority Data

| Oct. 20, 1986 | [JP] | Japan | 61-247641 |
| Jun. 29, 1987 | [JP] | Japan | 62-159843 |
| Jul. 13, 1987 | [JP] | Japan | 62-173077 |
| Jul. 27, 1987 | [JP] | Japan | 62-185382 |
| Aug. 17, 1987 | [JP] | Japan | 62-203099 |
| Aug. 21, 1987 | [JP] | Japan | 62-208002 |
| Oct. 9, 1987 | [JP] | Japan | 62-253516 |

[51] Int. Cl.$^6$ ............................................. G11C 29/00
[52] U.S. Cl. ........................... 371/21.2; 365/200; 365/201; 371/10.3; 371/21.1
[58] Field of Search .......................... 371/21.1, 21.2

[56] References Cited

U.S. PATENT DOCUMENTS

| 4,055,754 | 10/1977 | Chesley | 235/302.3 |
| 4,601,019 | 7/1986 | Shah et al. | 365/200 |
| 4,654,827 | 3/1987 | Childers | 365/201 |
| 4,654,849 | 3/1987 | White, Jr. et al. | 371/21 |
| 4,661,930 | 4/1987 | Tran | 365/201 |
| 4,667,330 | 5/1987 | Kumagai | 371/71 |
| 4,670,878 | 6/1987 | Childers | 371/21 |

FOREIGN PATENT DOCUMENTS

| 0055594 | 7/1982 | European Pat. Off. |
| 0143624 | 6/1985 | European Pat. Off. |
| 3530591 | 3/1986 | Germany |

OTHER PUBLICATIONS

McAdams, H. et al., "A 1-Mbit CMOS Dynamic RAM With Design-For-Test Functions", IEEE Journal of Solid-State Circuits, vol. SC-21, No. 5, Oct. 1986, pp. 635-641.

Le, K. et al., "A Novel Approach for Testing Memories Using a Built-In Self Testing Technique", 1986 International Test Conf., pp. 830-839.

Lo, T. et al., "An Integrated Test Concept for Switched-Capacitor Dynamic MOS RAM's", IEEE Jour. of Solid-State Circuits, vol. SC-12, No. 6, Dec. 1977, pp. 693-703.

Mazumder, P. et al., "Design and Algorithms for Parallel Testing of Random Access and Content Addressable Memories", 24 ACM/IEEE Design Automation Conf., Jul. 1987, pp. 688-694.

Sridhar, T., "A New Parallel Test Approach for Large Memories", 1985 International Test Conf., pp. 462-470.

"A 90ns 1Mb DRAM with Multi-Bit Test Mode" by M. Kumanoya et al., 1985 IEEE International Solid-State Circuits Conference, pp. 240, 241.

"Redundancy Test for 1 Mbit DRAM using Multi-Bit-Test Mode" by Y. Nishimura et al., 1986 IEEE International Test Conference, pp. 826-829.

Primary Examiner—Stephen M. Baker
Attorney, Agent, or Firm—Wolf, Greenfield & Sacks

[57] ABSTRACT

A semiconductor memory includes a plurality of memory cells which are arranged in a matrix and respectively store data, a plurality of bit lines and a plurality of word lines, connected to the plurality of memory cells, for performing read/write access of data to the memory cells, and a test circuit. In the test circuit, an external terminal sends test data and expected value data written in the memory cells. A simultaneous write circuit simultaneously writes the test data from the external terminal in the plurality of memory cells connected to a selected word line. A simultaneous comparison circuit simultaneously compares the test data written in the plurality of memory cells connected to the selected word line with the expected value data supplied from the external terminal in correspondence with the selected word line.

36 Claims, 50 Drawing Sheets

FIG.2(a) $\phi_P$
FIG.2(b) $\phi_W$
FIG.2(c) $\phi_{SA}$
FIG.2(d) TEST DATA WRITE TERMINALS 13 AND 14
FIG.2(e) TEST DATA WRITE CONTROL TERMINAL 10
FIG.2(f) OUTPUT TERMINAL 18

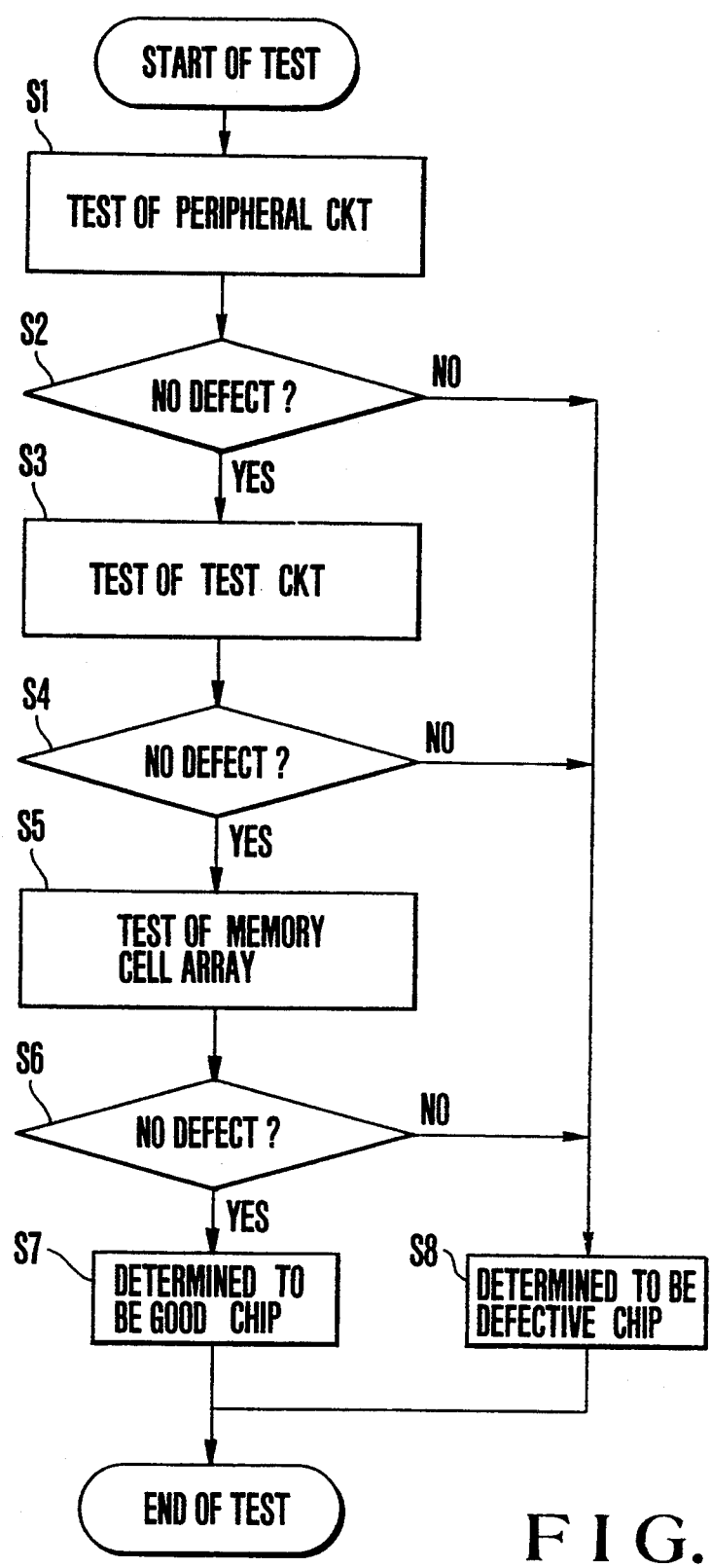
F I G. 9

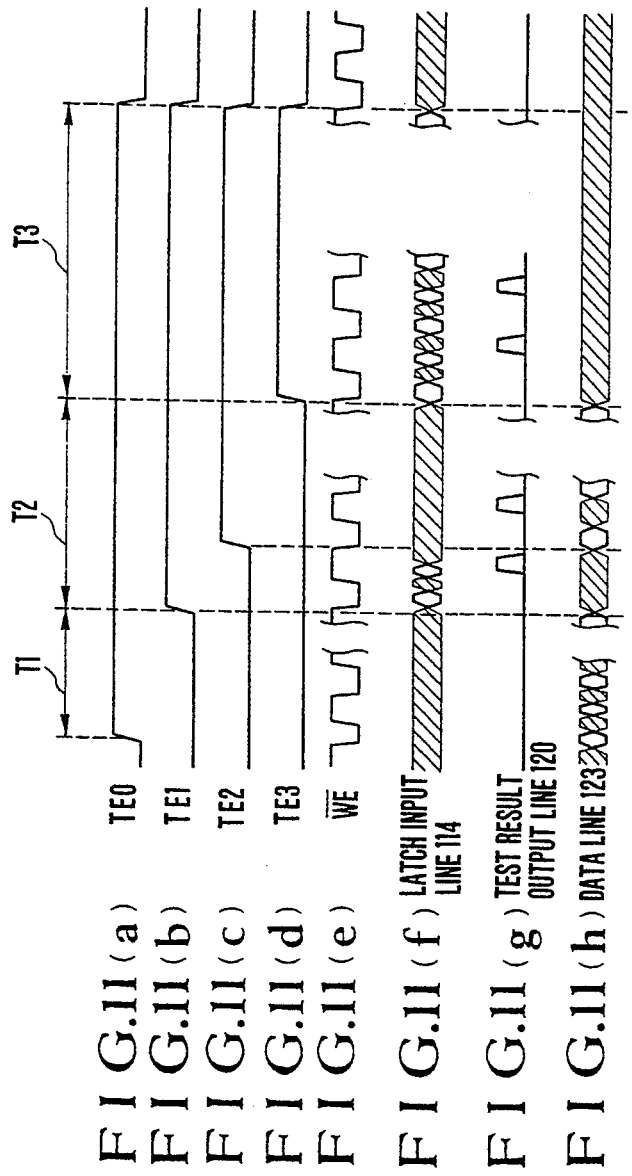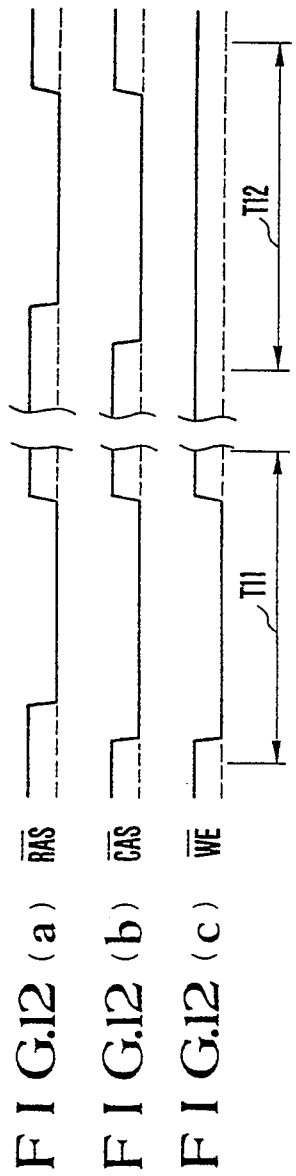

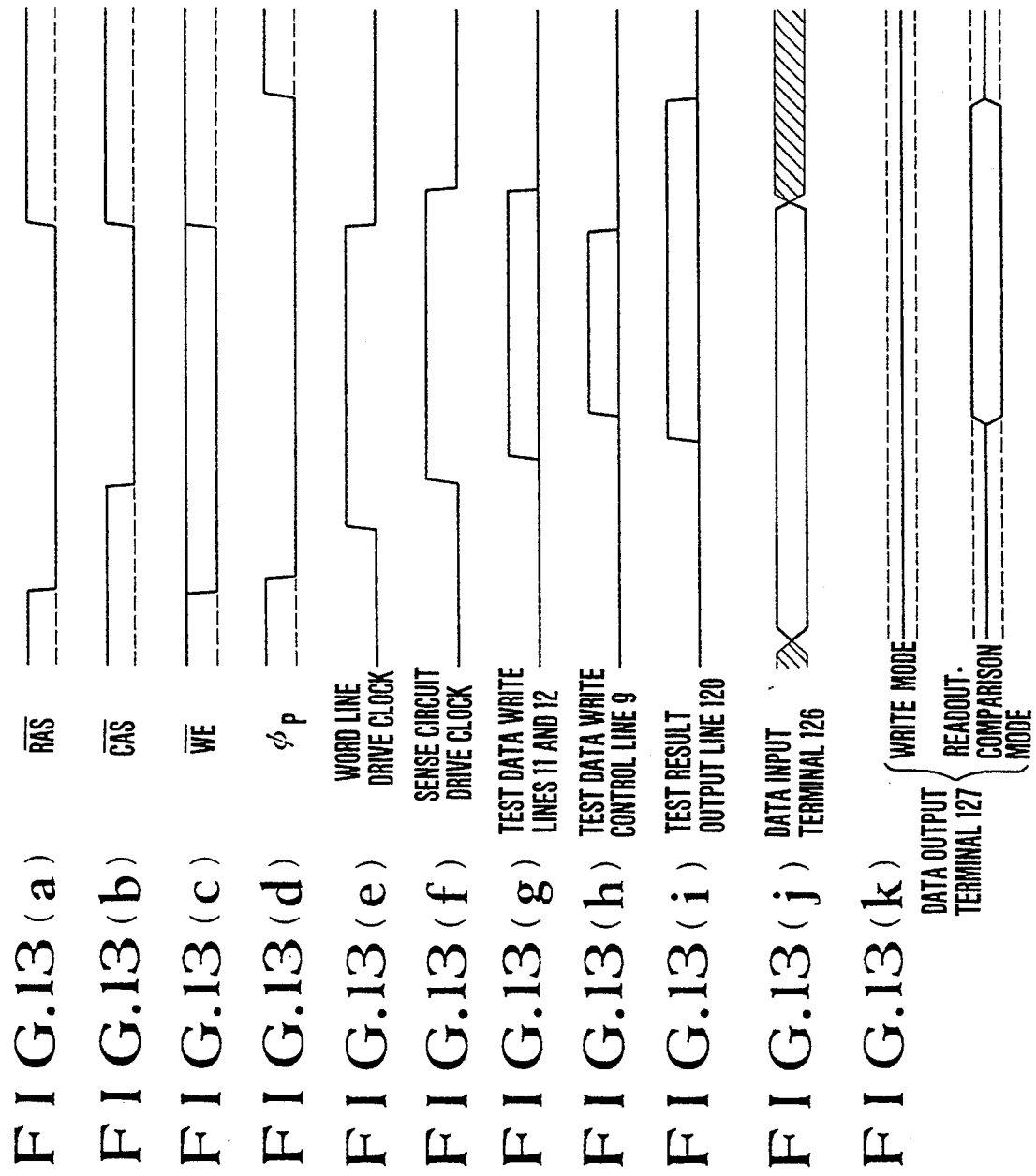

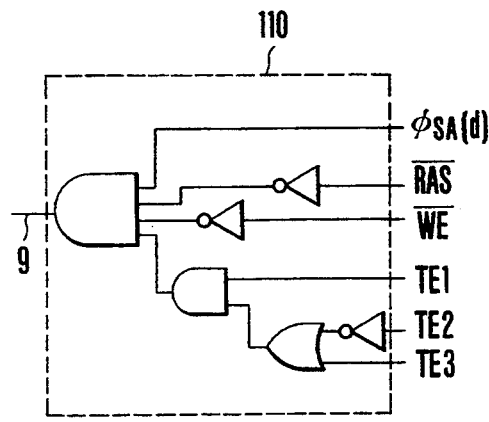
F I G. 14
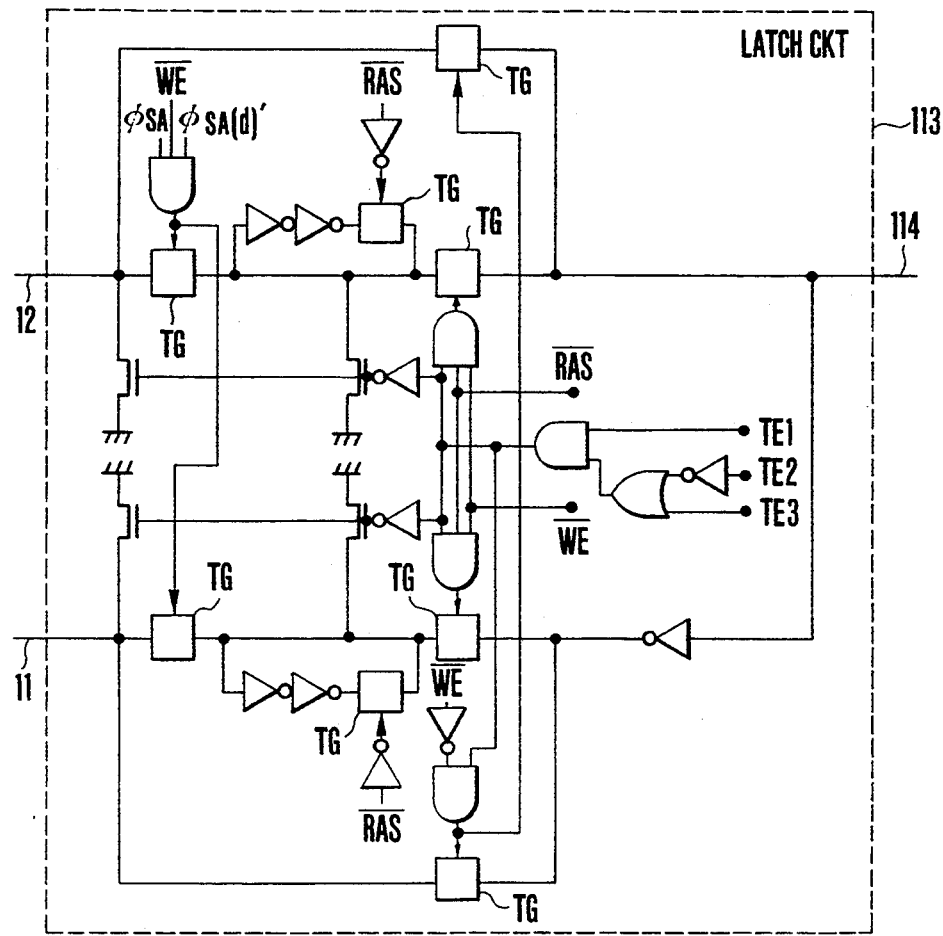
F I G. 15

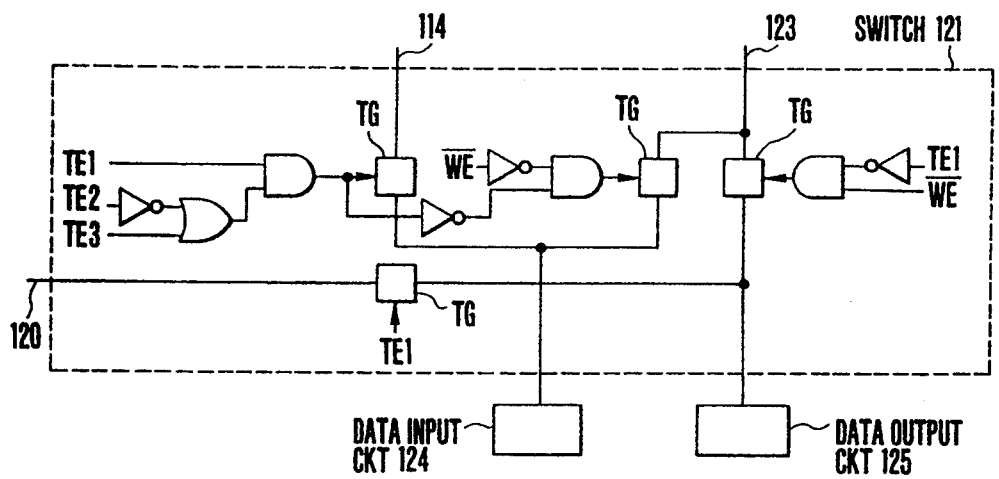
FIG.16
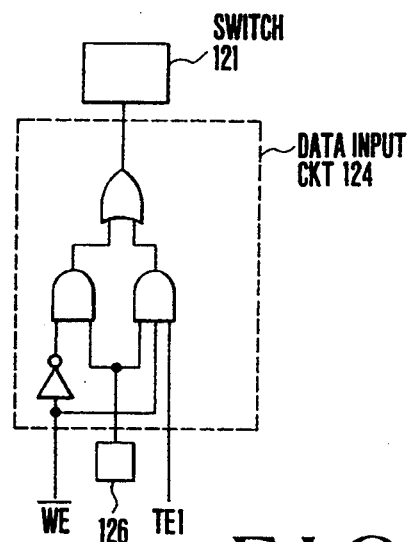 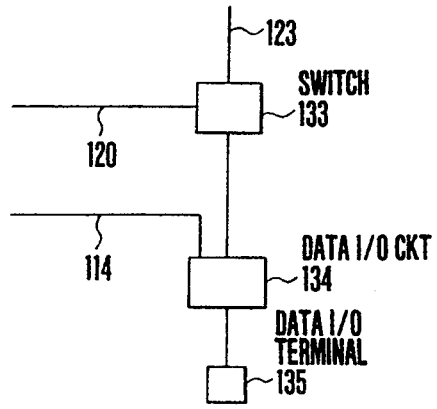
FIG.17　　FIG.18

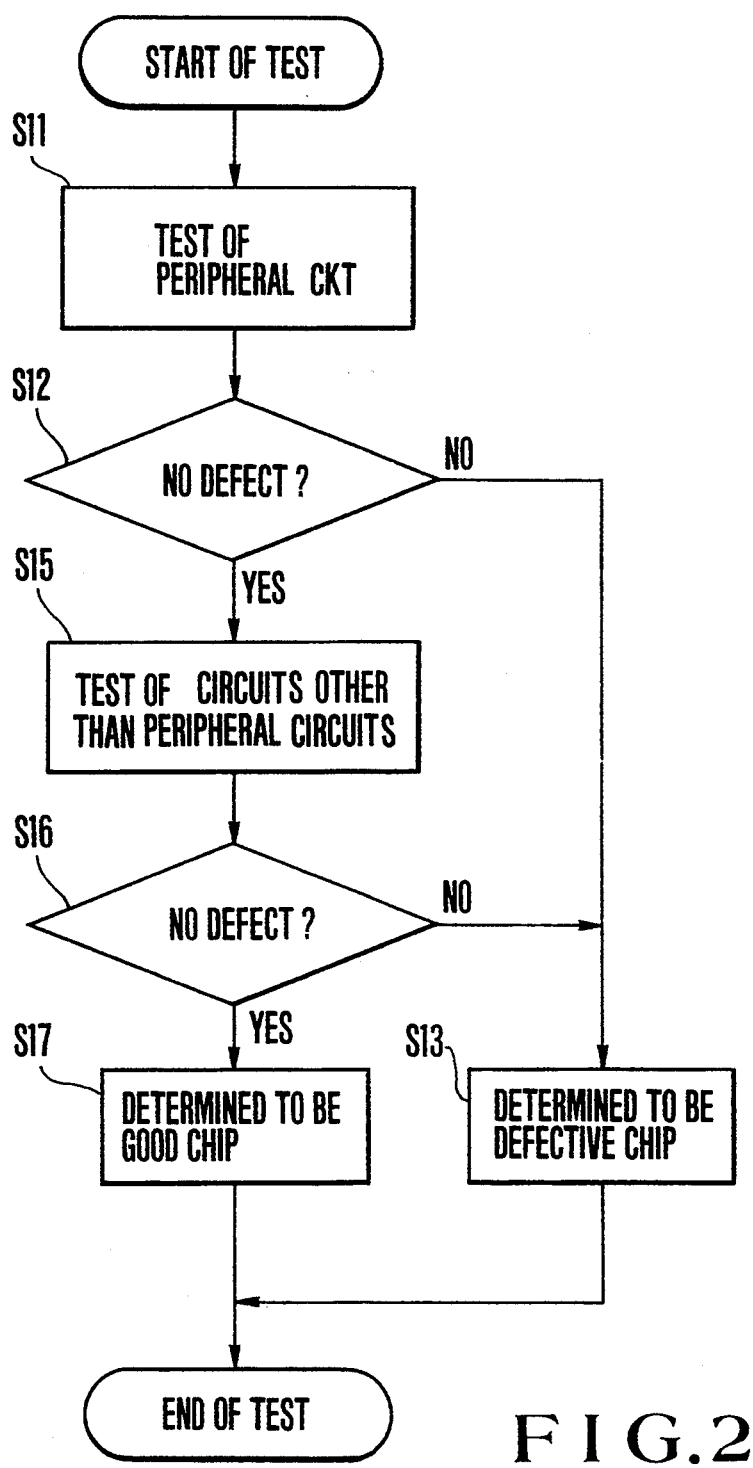
F I G. 25

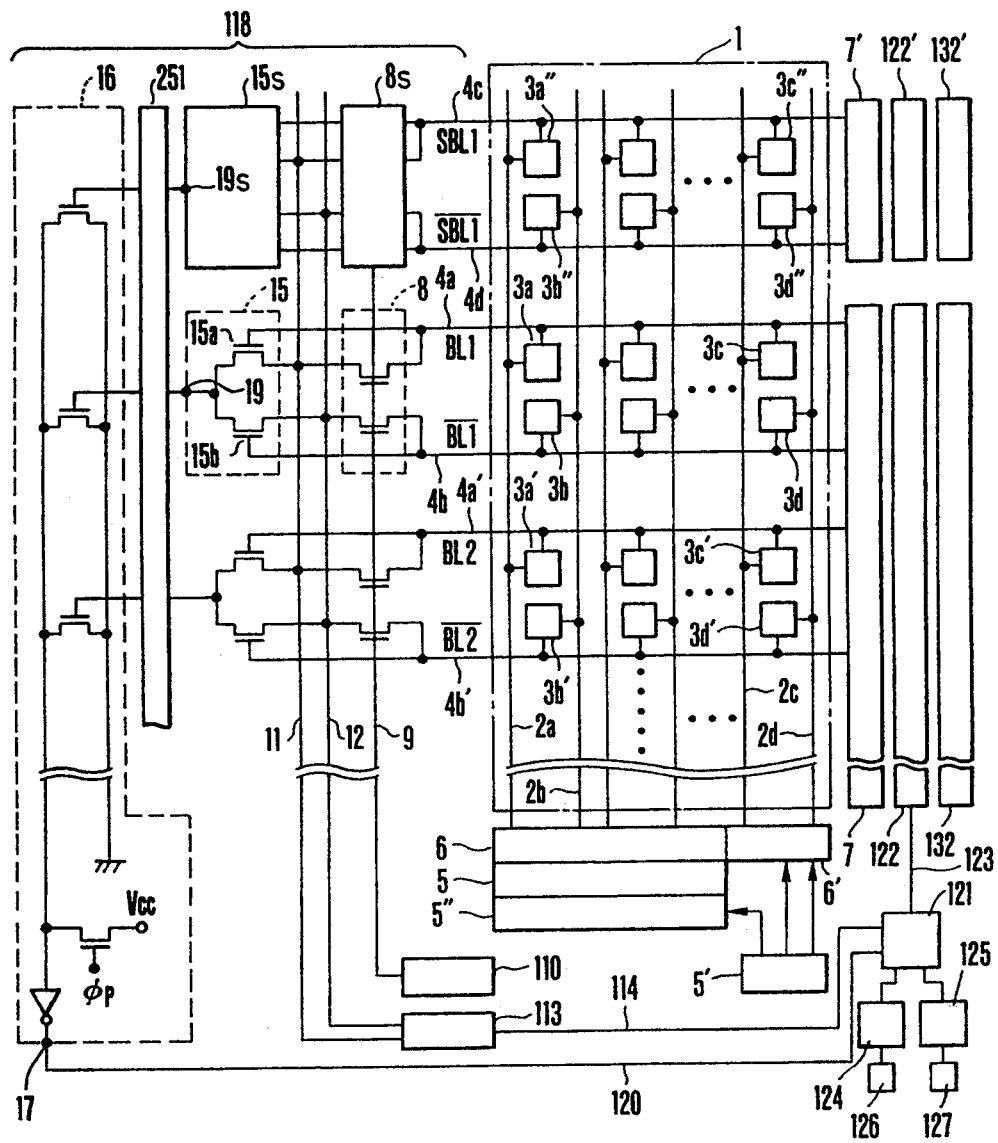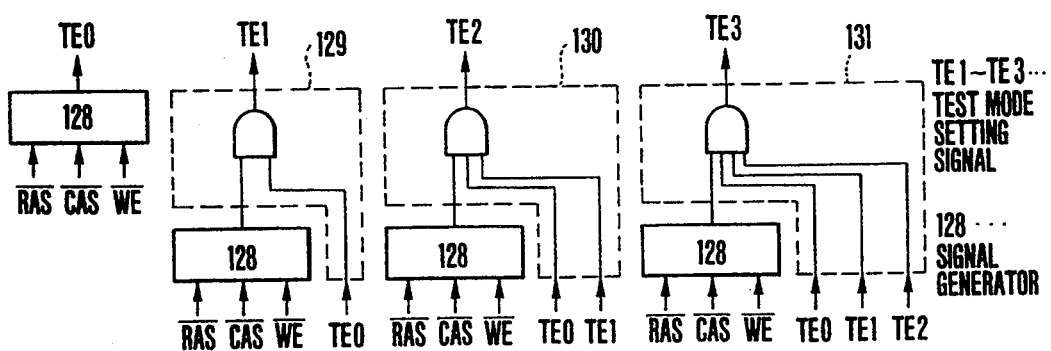
FIG. 37

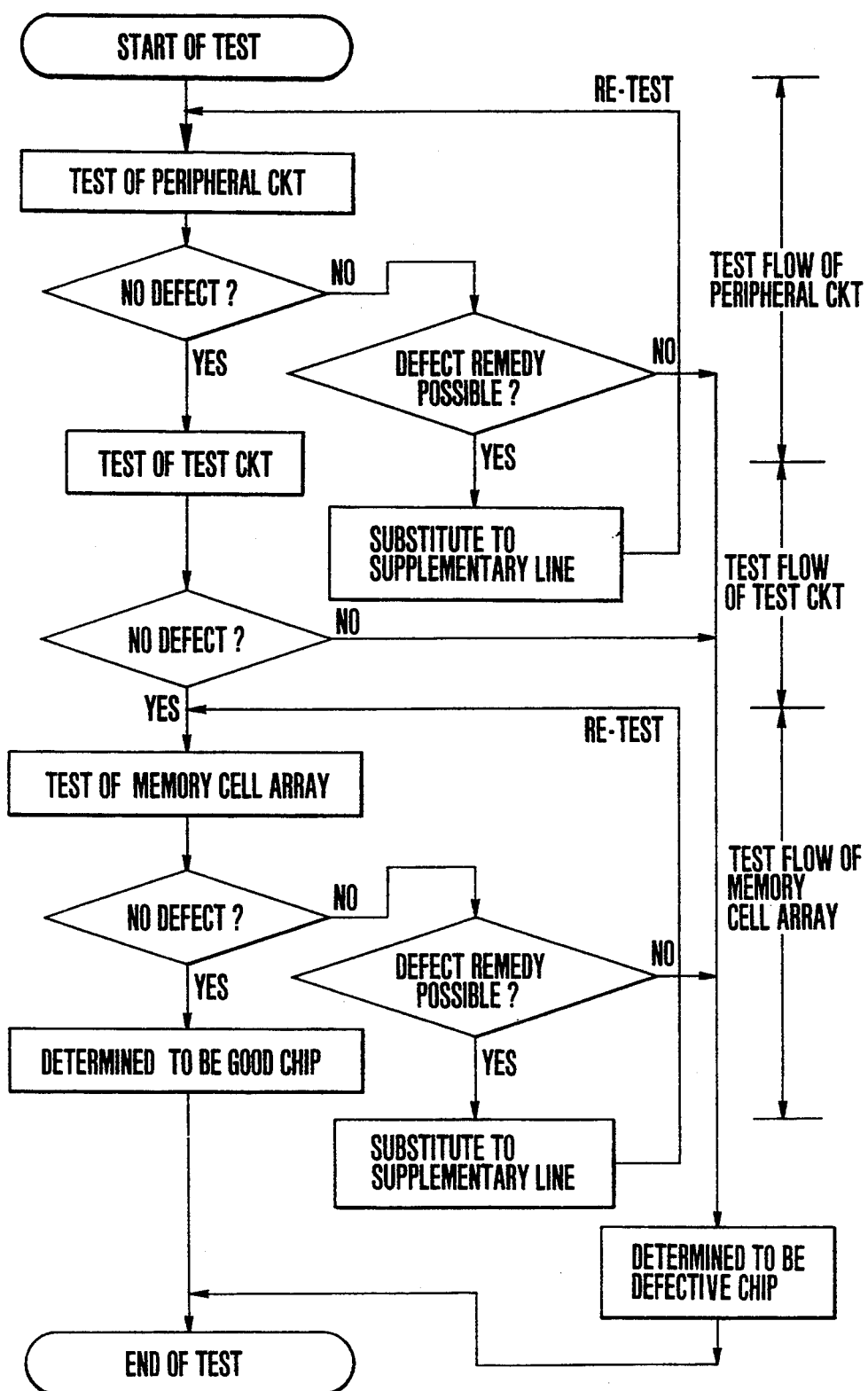
F I G. 38

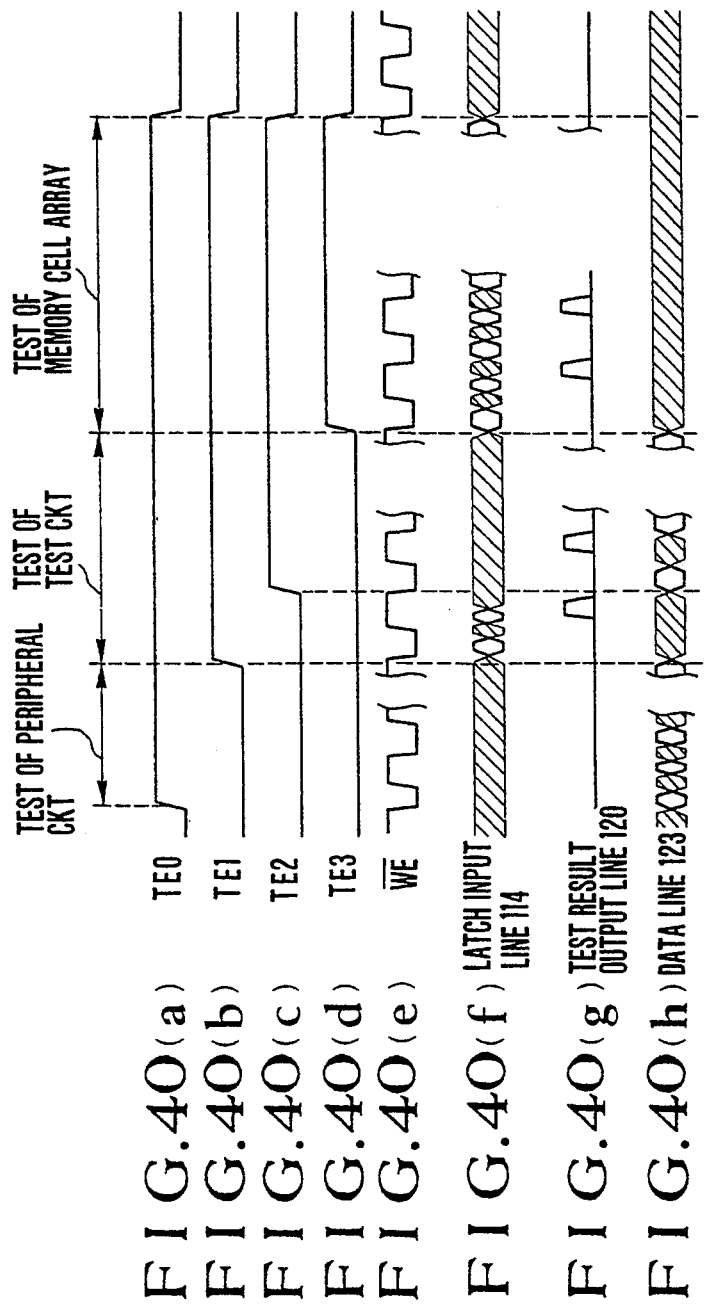

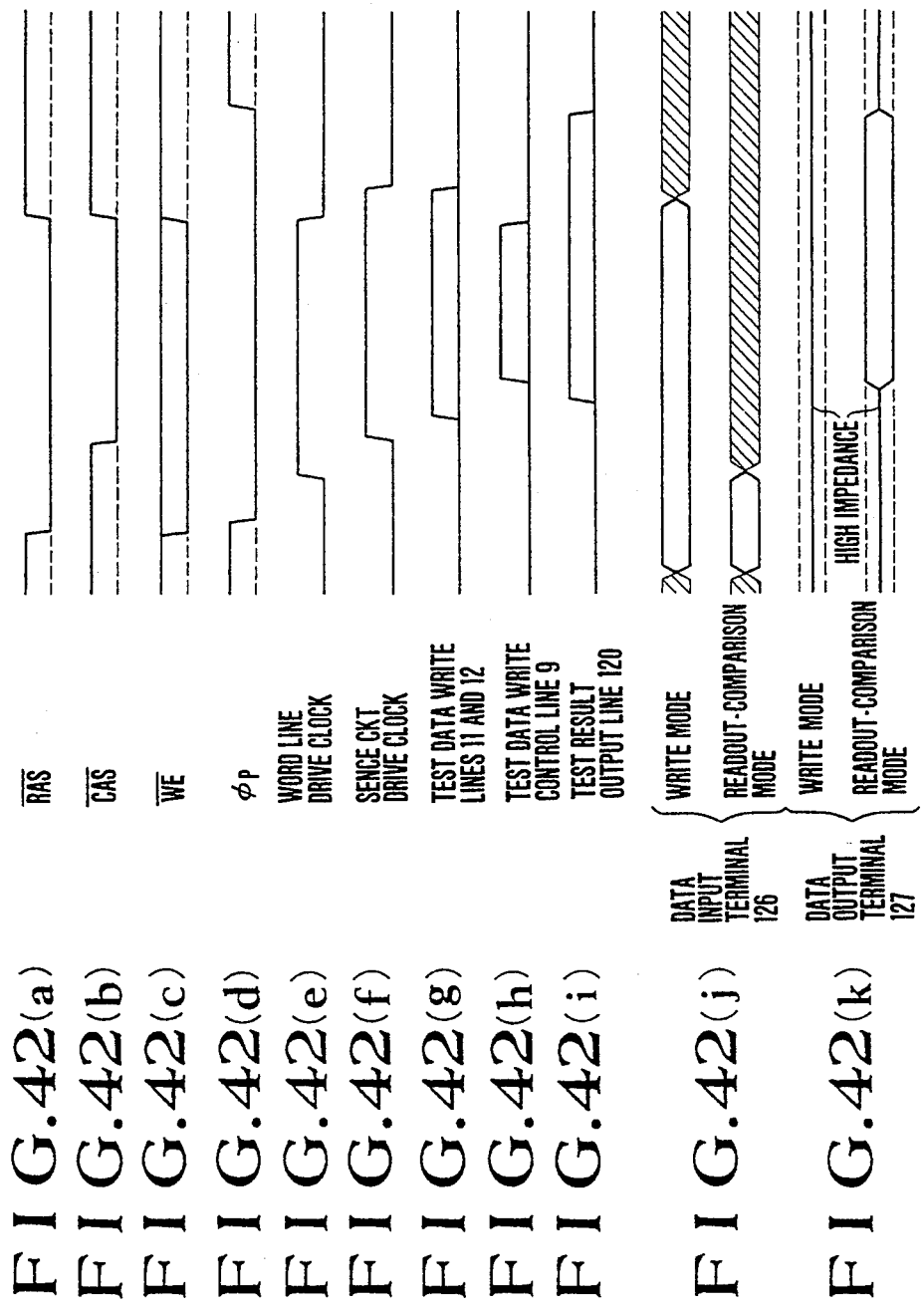

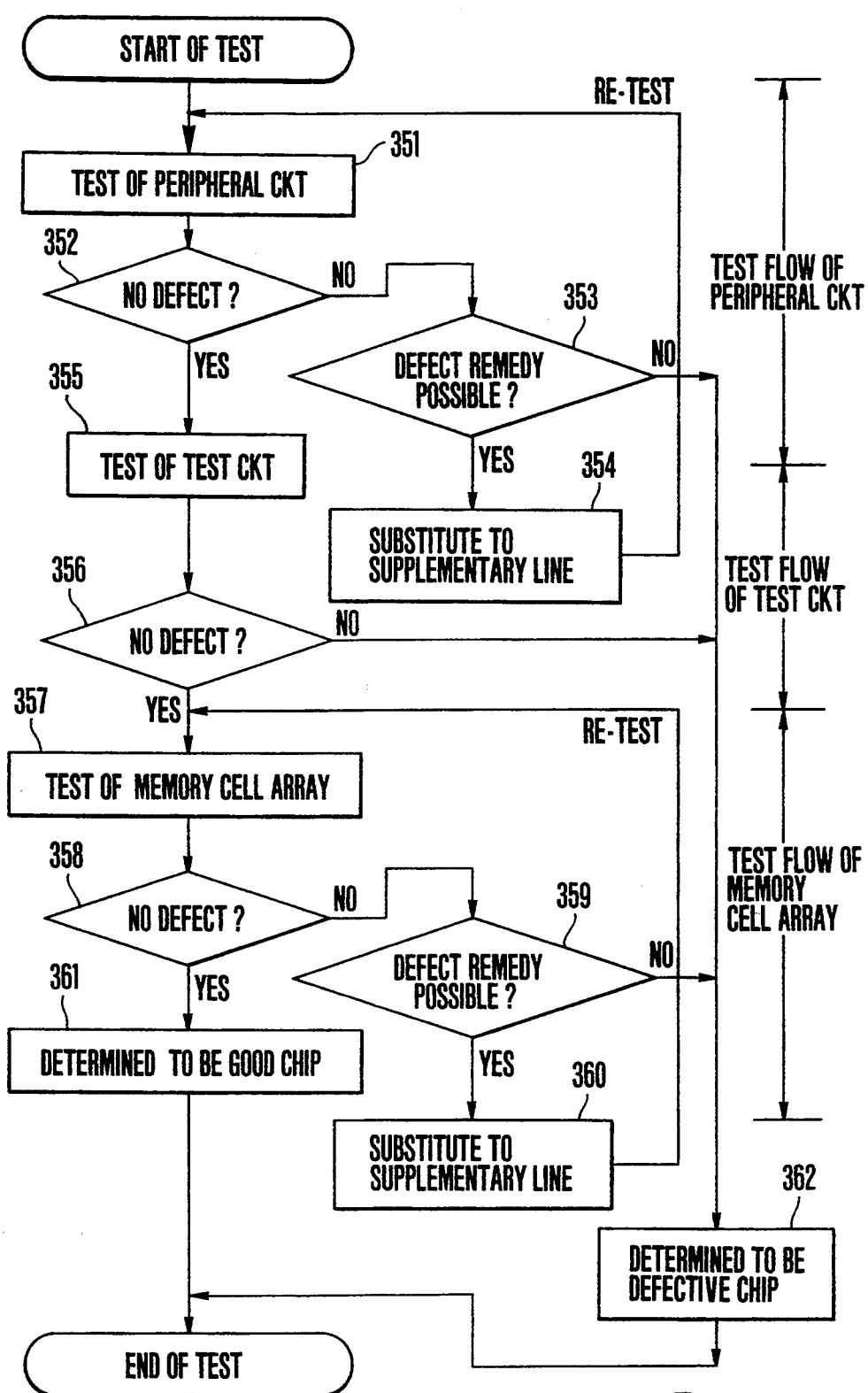
F I G. 45

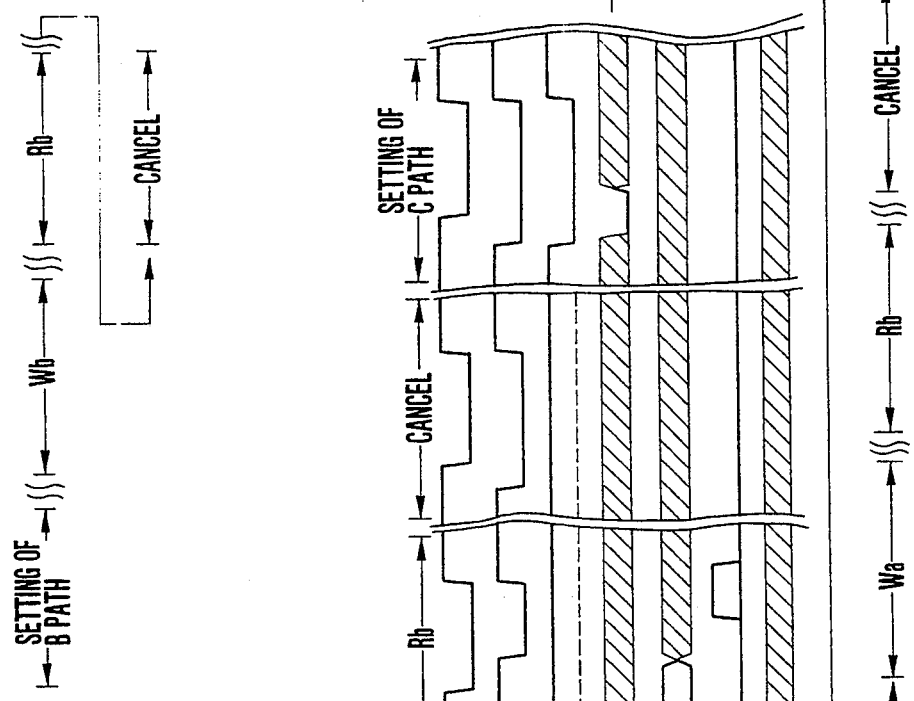
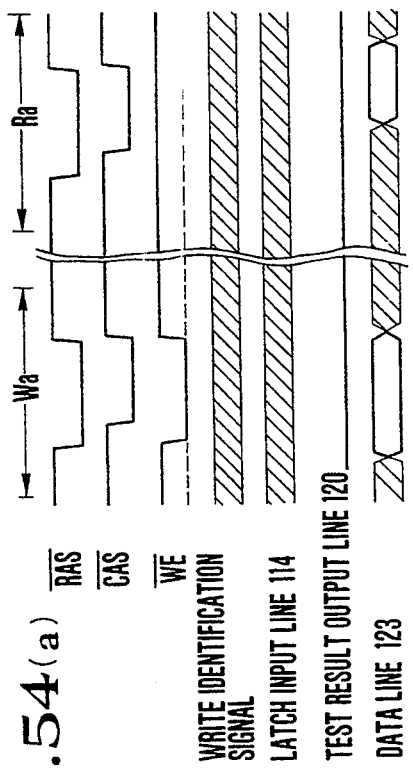
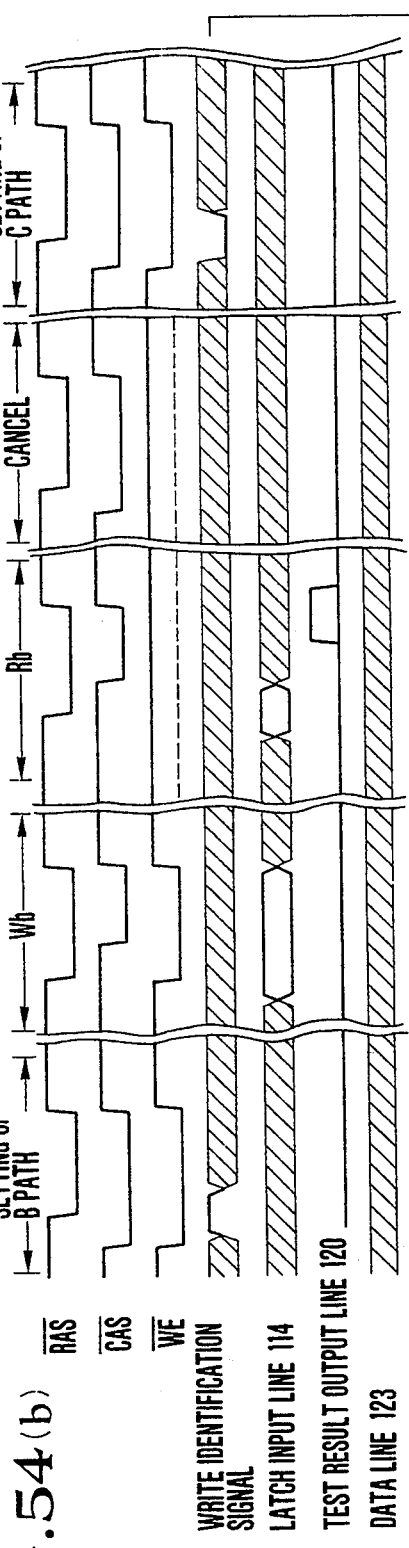

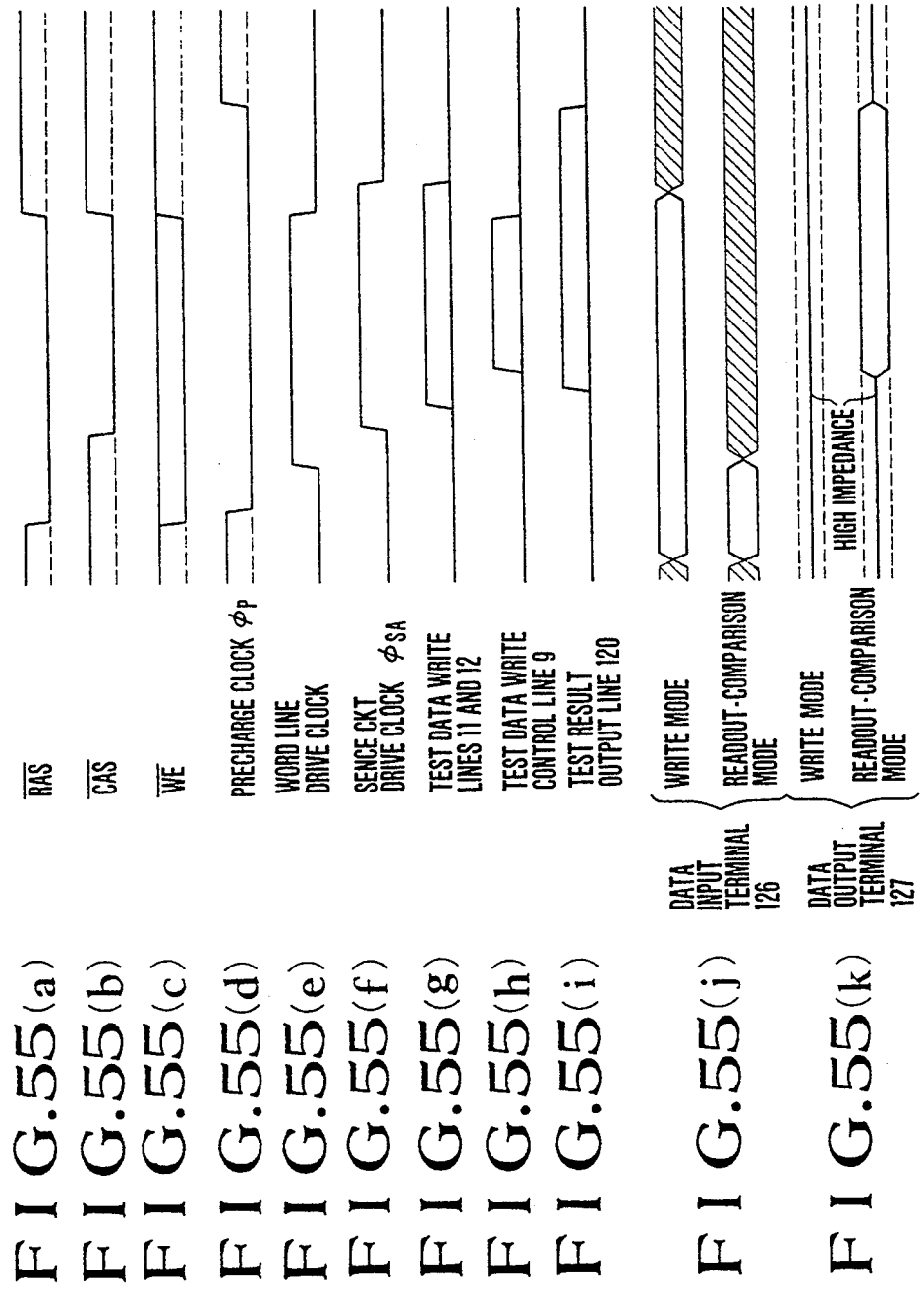

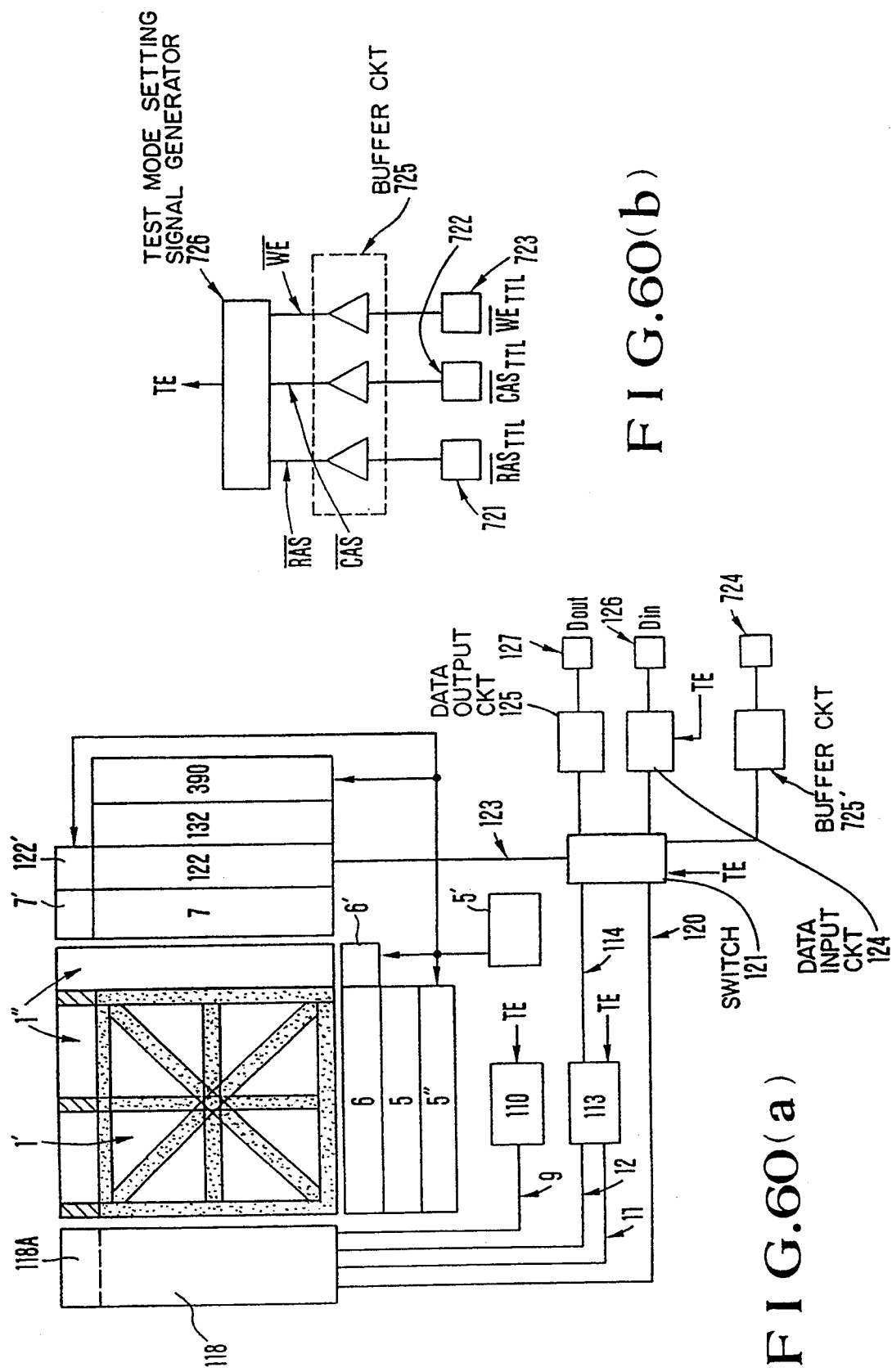

SEMICONDUCTOR MEMORY HAVING TEST CIRCUIT AND TEST METHOD THEREOF

This application is a continuation of application Ser. No. 07/462,853, filed Jan. 4, 1990, now abandoned which is a continuation of application Ser. No. 109,766, filed Oct. 16, 1987, abandoned.

BACKGROUND OF THE INVENTION

The present invention relates to a semiconductor memory.

A conventional semiconductor memory does not include a write means for simultaneously writing data in a plurality of memory cells during a test, and a means for comparing expected value data input during a test and data read out from the plurality of memory cells. Therefore, in the test of the semiconductor memory of this type, data read/write access is performed for each memory cell in a memory cell array, and comparison for detecting a coincidence between readout data and expected value data is performed by a memory tester. For the purpose of shortening a test time, identical test data is written in memory cells corresponding to four bits in a memory cell array. Then, an AND result of the data read out from these memory cells is sent to the memory tester so as to perform coincidence detection of all the readout data and comparison associated with coincidence detection with expected value data. This technique is described in 1985 IEEE, International Solid State Circuits Conference, pp. 240-241, A 90 ns 1M bit DRAM with multi bit test mode, KUMANOYA.

In a conventional semiconductor memory, the test is performed by a comparison operation for each memory cell. Therefore, along with an increase in memory capacity of the semiconductor memory, a test time is considerably prolonged. For example, when a test is conducted in 300-ns cycles using "MSCAN" as one of a simplest test data or "CHECKERBOARD" suitable for detecting interference between adjacent memory cells, a semiconductor memory having a memory capacity of 256 kb (kilobits) requires only a test time of 0.3 sec for each test data. In a similar test by an operation for simultaneously comparing several bits, the test time only takes 0.1 sec or less for each test data.

However, if the memory capacity is increased up to 16 Mb (megabits), the test times for the above test data are respectively prolonged to 20 sec and 5 sec. An increase in test time causes an increase in cost of the semiconductor memory, and disturbs mass production.

SUMMARY OF THE INVENTION

It is a principle object of the present invention to provide a semiconductor memory which can greatly shorten a test time, and a test method therefor.

It is another object of the present invention to provide a semiconductor memory which can simplify a circuit configuration of a test circuit as compared to a conventional semiconductor memory, and a test method therefor.

It is still another object of the present invention to provide a semiconductor memory which can arrange a test circuit on a single chip, and a test method therefor.

It is still another object of the present invention to provide a semiconductor memory with redundancy, which can greatly shorten a test time, and a test method therefor.

It is still another object of the present invention to provide a semiconductor memory with I/O common, which can greatly shorten a test time, and a test method therefor.

In order to achieve the above object, paying attention to the fact that all the memory cells on a single word line or multi-divided word lines which are divided in a memory cell array can be simultaneously selected, the present inventors can perform a simultaneous test in units of the word lines.

Therefore, according to an aspect of the present invention, there is provided a semiconductor memory comprising a plurality of memory cells which are arranged in a matrix and respectively store data, a plurality of bit lines and a plurality of word lines, connected to the plurality of memory cells, for performing read/write access of data to the memory cells, and a test circuit, the test circuit comprising external terminal means for sending test data and expected value data written in the memory cells, simultaneous write means for simultaneously writing the test data from the external terminal means in the plurality of memory cells connected to a selected word line, and simultaneous comparison means for simultaneously comparing the test data written in the plurality of memory cells connected to the selected word line with the expected value data supplied from the external terminal means in correspondence with the selected word line, whereby a test of the memory cells can be performed.

According to another aspect of the present invention, there is provided a method of testing a semiconductor memory comprising: using a semiconductor memory comprising a plurality of memory cells arranged in a matrix, a peripheral circuit for selectively writing data into or reading out data from selected ones of the memory cells, and a test circuit; sequentially testing predetermined portions by the test circuit in a predetermined order and stopping subsequent tests when a defect is detected; and simultaneously writing test data in predetermined memory cells connected to bit lines intersecting one word line when the memory cells serve as objects to be tested, and thereafter, comparing readout data with expected value data to check the memory cell connected to the word line.

According to still another aspect of the present invention, there is provided a method of testing a semiconductor memory comprising: using a semiconductor memory comprising a plurality of main memory cells for storing data, a plurality of supplementary memory cells for defect remedy, a peripheral circuit for selectively writing data into or reading out data from selected ones of the memory cells, and a test circuit; sequentially testing predetermined portions by the test circuit in a predetermined order and inhibiting subsequent tests when the defect remedy cannot be performed by substituting a defective memory cell with the supplementary memory cell; and simultaneously writing test data in predetermined memory cells connected to bit lines and supplementary bit lines intersecting one word line or one supplementary word line when the main memory cells and the supplementary memory cells serve as objects to be tested, and thereafter, comparing readout data with expected value data to check the memory cells connected to the word line or the supplementary word line.

BRIEF DESCRIPTION OF THE DRAWINGS

FIGS. 2(a) to 2(f) are timing charts showing timings during a test;

FIG. 9 is a flow chart of a test according to the embodiment shown in FIG. 8;

FIGS. 11(a) to 11(h) are timing charts of the test operation according to the embodiment shown in FIG. 8;

FIGS. 12(a) to 12(c) are timing charts showing changes in conventional clocks associated with setting and canceling of a test mode;

FIGS. 13(a) to 13(k) are timing charts associated with a test of a memory cell array according to the embodiment shown in FIG. 8;

FIG. 14 is a circuit diagram showing a test data write control circuit shown in FIG. 8;

FIG. 15 is a circuit diagram showing a latch circuit shown in FIG. 8;

FIG. 16 is a circuit diagram of an arrangement of a switch shown in FIG. 8;

FIG. 17 is a circuit diagram showing an arrangement of a data input circuit shown in FIG. 8;

FIG. 18 is a block diagram showing still another embodiment of the present invention;

FIG. 25 is a flow chart showing a test method of the memory having the arrangement shown in FIG. 24 or 26;

FIG. 37 is a circuit diagram showing still another embodiment of the present invention;

FIG. 38 is a flow chart showing a test method according to the embodiment shown in FIG. 37;

FIG. 40 is a timing chart for explaining the operation of FIG. 37;

FIGS. 42(a) to 42(k) are timing charts associated with a test of the memory cell array according to the embodiment shown in FIG. 37;

FIG. 45 is a flow chart showing still another embodiment of the present invention;

FIGS. 54(a) and 54(c) are timing charts for explaining the operation of the embodiment shown in FIG. 52;

FIGS. 55(a) to 55(k) are timing charts associated with a test of a memory cell array according to the embodiment shown in FIG. 52;

FIG. 60 is a circuit diagram showing still another embodiment of the present invention.

DESCRIPTION OF THE PREFERRED EMBODIMENTS

Figure 1:
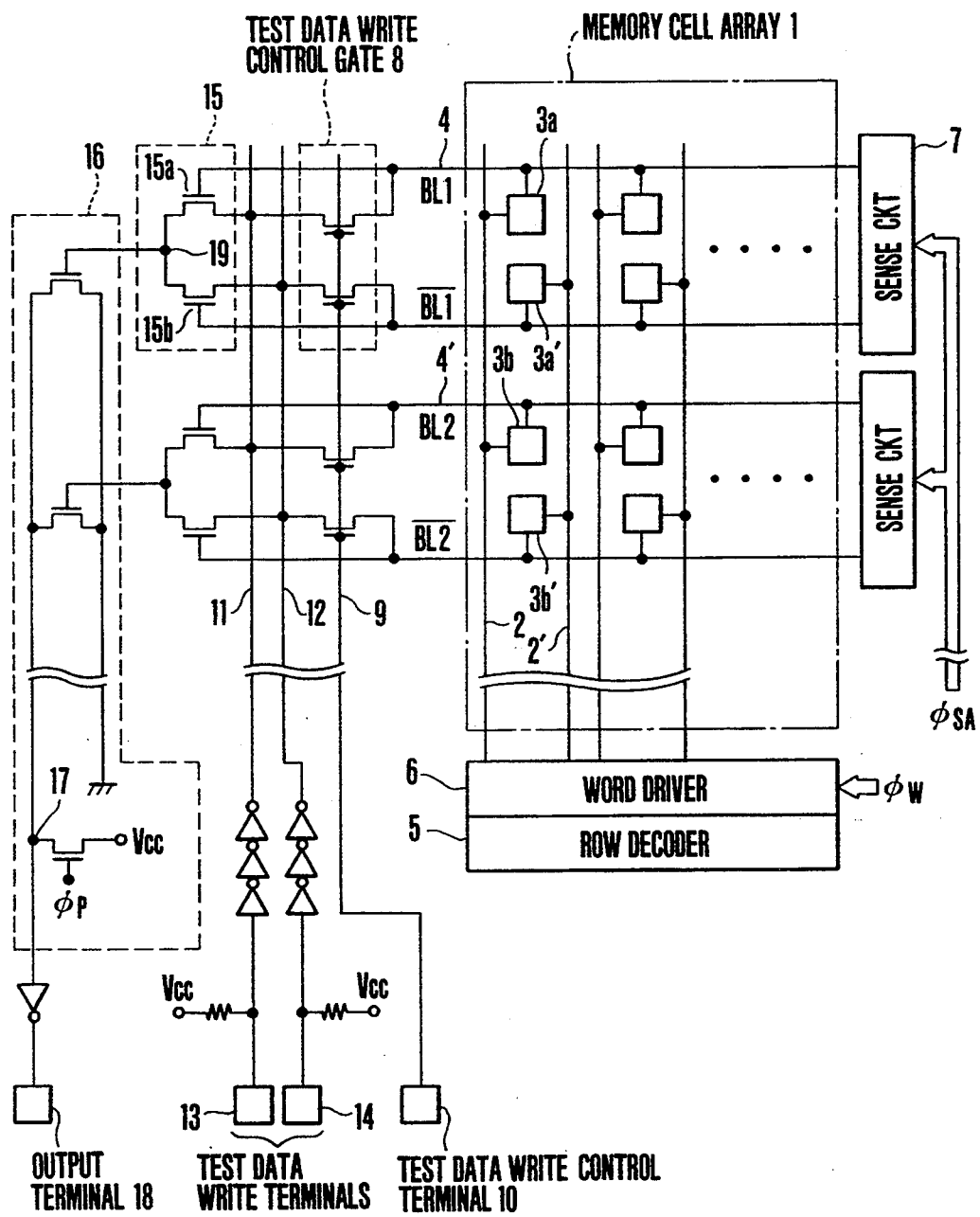
FIG. 1 is a circuit diagram showing an arrangement of a semiconductor memory according to an embodiment of the present invention.

FIG. 1 shows an arrangement of a semiconductor memory according to an embodiment of the present invention. FIG. 1 illustrates a case wherein simultaneous write access and comparison are performed in units of word lines in a folded bit line arrangement in which a bit line pair in a single memory cell array is connected to a sense circuit. In FIG. 1, reference numeral 1 denotes a memory cell array; 2 and 2', word lines; and 3a, 3b, 3a', and 3b', memory cells. In FIG. 1, all the memory cells connected to the word line 2 are represented by two cells for the sake of simplicity. Reference numerals 4 and 4' denote bit lines, which are also represented by two pairs for the sake of simplicity. Note that BL1 and $\overline{BL1}$, and BL2 and $\overline{BL2}$ form bit line pairs, and opposite data appear on the bit lines BL1 and $\overline{BL1}$ upon operation of a dummy cell (not shown) and a sense circuit 7. Reference numeral 5 denotes a row decoder; 6, a word driver; 7, a sense circuit; 8, test data write control gates corresponding to the bit line pairs, respectively; 9, a test data write control line; 10, a test data write control terminal; 11 and 12, test data write lines; and 13 and 14, test data write terminals, through which test data having opposite polarities are applied to the test data write lines 11 and 12, respectively. Reference numeral 15 denotes comparators corresponding to the bit line pairs, respectively; 16, a NOR circuit for detecting a coincidence with the readout data from the memory cells connected to the word lines based on the data output from the comparators 15; 17, an output node of the NOR circuit 16; 18, an output terminal of a simultaneous comparison result; and 19, output nodes of the comparators 15.

With the above arrangement, the test data write control gates 8, the test data write control line 9, the test data write control terminal 10, the test data write lines 11 and 12, the test data write terminals 13 and 14, and the like constitute a simultaneous write means. The test data write control line 9, the test data write control terminal 10, the test data write lines 11 and 12, the test data write terminals 13 and 14, the comparator 15, the NOR circuit 16, the output terminal 18, and the like constitute a simultaneous comparison means.

The test data write control terminal 10 is set at "H" level only when test data is written; otherwise, it is set at "L" level. The test data write terminals 13 and 14 are set at "H" or "L" level during a test; otherwise, they are set in an open state. In FIG. 1, the reason why a power supply voltage Vcc is supplied to the test data write lines 11 and 12 through resistors is to set the test data write lines 11 and 12 at "L" level in the open state. The simultaneous comparison result output terminal 18 is set at "L" level when the simultaneous comparison result represents that all the bits are good, and is set at "H" level when the comparison result represents that defective bits are obtained. $\phi_W$ applied to the word driver 6 is a word line drive clock signal, $\phi_{SA}$ applied to the sense circuit is a sense circuit drive clock signal, and $\phi_P$ in the NOR circuit 16 is a precharge clock signal.

A test mode according to the embodiment shown in FIG. 1 will be described with reference to the timing charts shown in FIGS. 2(a) to 2(f). First, a test data simultaneous write operation for the memory cells connected to word lines is performed as follows. The precharge clock signal $\phi_P$ shown in FIG. 2(a) is set at "L" level to drive the row decoder 5, thereby selecting one word line 2. Then, the word line drive clock signal $\phi_W$ shown in FIG. 2(b) is set at "H" level to drive the word driver 6, so that the selected word line goes to "H" level. After data from all the memory cells connected to the selected word line 2 appear on the bit lines, the sense circuit drive clock signal $\phi_{SA}$ shown in FIG. 2(c) is set at "H" level to drive the sense circuit 7. Upon operation of the sense circuit 7, the voltage levels of the bit lines are determined. Thereafter, as shown in FIG. 2(d), an "H"- or "L"-level voltage corresponding to test data is applied to the test data write terminals 13 and 14. As shown in FIG. 2(e), the test data write control terminal 10 is set at "H" level to apply a voltage level corresponding to the test data on the bit lines. At this time, the word line 2 is kept at "H" level, and the test data is simultaneously written for the memory cells connected to the word line. Then, the test data write control terminal 10 is set at "L" level, and the test data write terminals 13 and 14 are set at "H" level. Thereafter, the word line drive clock signal $\phi_W$ and the sense circuit drive clock signal $\phi_{SA}$ are set at "L" level at the same timing as in a normal memory operation, thus ending a series of write operations.

In this manner, the word lines 2, 2', ... are sequentially selected, and "H"- and "L"-level voltages are alternately applied to the test data write terminals 13 and 14, so that test data "MSCAN" can be simultaneously written. More specifically, in FIG. 1, "H" or "L" level data are written in all the memory cells 3a, 3b, 3a' and 3b'. "H"- and "L"-level voltages are alternately applied to the test data write terminals 13 and 14 every two word lines, so that test data "CHECKERBOARD" can be simultaneously written. That is, in FIG. 1, "H"- or "L"-level data is written in the memory cells 3a and 3b, and "L"- or "H"-level data is written in the memory cells 3a' and 3b'.

As can be seen from the description of the write operation, according to the test method of this embodiment, even in a semiconductor memory in which a physical arrangement of memory cells in a memory cell array is different from a logical address arrangement, these test data can be normally written. In order to facilitate the simultaneous write access, when the "H"-level voltage is applied to the test data write control terminal 10, the sense circuit drive clock signal $\phi_{SA}$ may be temporarily set at "L" level to cancel latching of the sense circuit 7. When the voltage levels of the bit lines can be satisfactorily determined by a voltage applied from the test data write control terminal 10, the sensor circuit 7 need not always be operated.

A simultaneous comparison sequence for the memory cells connected to word lines will be described blow. During a precharge period, the precharge clock signal $\phi_P$ is set at "H" level to precharge the simultaneous comparison output node 17 at the "H" level. Thereafter, the same operation as in the write operation is performed until a timing at which the sense circuit 7 is operated. After the voltage levels of the bit lines are determined, a voltage level opposite to the test data in the write operation is applied to the test data write terminals 13 and 14. In this case, the test data write control terminal 10 is kept at "L" level. As a result, when the voltage level of the test data applied to the test data write terminals 13 and 14 during the comparison operation coincides with the voltage level read out from each memory cell and appearing on the bit line, i.e., when the data read out from the memory cell is error data, the output node 19 of the comparator 15 is set at "H" level, and causes the output node 17 of the NOR circuit 16 to be changed from "H" level to "L" level. Therefore, it can be detected from observation of a change from "L" level to "H" level of the output terminal 18 that a defective bit is present in the memory cells connected to the selected word line. This state is shown in FIG. 2(f). In FIG. 2(f), "H" level indicated by the solid line represents that a defective bit is present, and "L" level indicated by the broken line represents that the all the bits are good or a write operation is being performed.

A practical operation wherein the voltage level of the test data coincides with data read out from a memory cell will be described. A case will be exemplified wherein the test data write terminal 13 is set at "L" level, and "H"-level data is written in the memory cell 3a during the simultaneous write mode. In this case, in the simultaneous comparison mode, an "H"-level voltage is applied to the test data write terminal 13, and an "L"-level voltage is applied to the test data write terminal 14, and these voltages are compared with data read out from the memory cell 3a. In the simultaneous comparison mode, if data read out from the memory cell 3a has erroneously "L" level, the bit line BL1, i.e., the gate of a transistor 15a of the comparator 15 is set at "L" level, and the transistor 15a is turned off. In this case, the bit line $\overline{BL1}$ is set at "H" level due to the effect of the dummy cell and the sense circuit 7, and the gate of a transistor 15b of the comparator 15 is set at "H" level. Thus, the transistor 15b is turned on, and the "H"-level voltage input from the test data write terminal 14 to the comparator 15 appears at the output node 19, thus causing the output node 17 of the NOR circuit 16 to be changed from "H" level to "L" level. The above operation has been exemplified when the test data write terminals 13 and 14 are respectively set at "L" and "H" levels in the write mode. However, the same operation can be performed when the test data write terminals 13 and 14 are respectively set at "H" and "L" levels.

In the above-mentioned simultaneous write and comparison test method, the test data "MSCAN" and "CHECKERBOARD" are used. Alternatively, a test using test data "MARCHING" can be performed. This test can be realized by the following sequences. More specifically, write access of background data with respect to all the memory cells and subsequent simultaneous comparison of readout data are performed in the same manner as in the test using "MSCAN", and the same simultaneous write and comparison operations as in the test using "MSCAN" are performed while the voltage levels applied to the test data write terminals 13 and 14 are inverted. However, in the present invention, since data of the same level is simultaneously written in all or a plurality of memory cells connected to a selected word line, defect detection of a decoding function by using column address which can be performed by the conventional test method cannot be performed. Therefore, for defect detection of the decoding function by using column address, a test using "MARCHING" is additionally performed for all the memory cells connected to one or a plurality of word lines in the memory cell array 1.

According to the embodiment of the test method described above, since simultaneous write and comparison operations can be performed for the memory cells connected to word lines, a test time can be shortened to 1/n that of a conventional semiconductor memory. In this case, n indicates the number of memory cells subjected to simultaneous write and comparison operations and connected to a word line, and normally takes a large value, e.g., 500 or 1000 or more.

Figure 3:
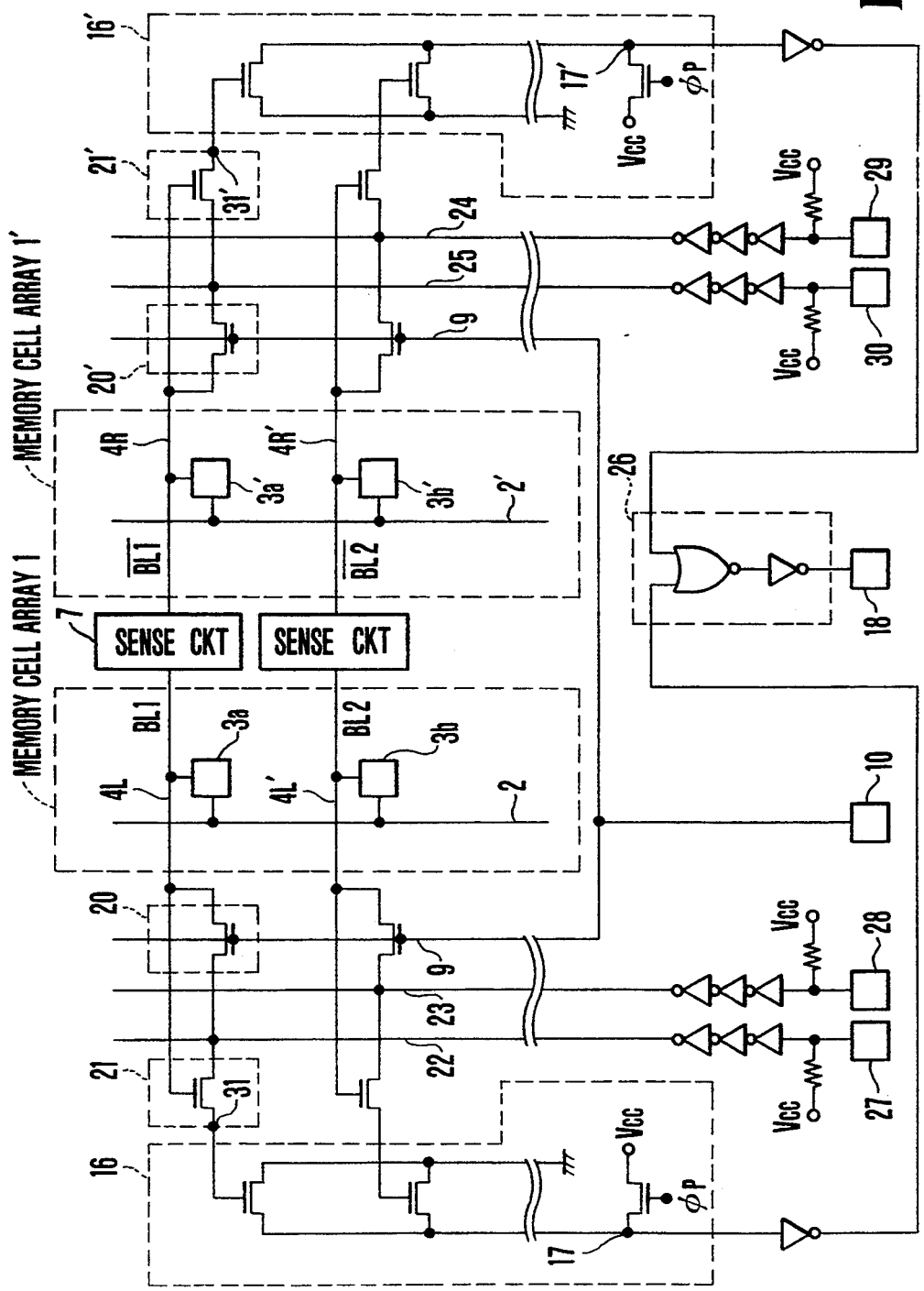
FIG. 3 is a circuit diagram showing an arrangement of a semiconductor memory according to another embodiment of the present invention.

FIG. 3 shows an arrangement according to another embodiment of the present invention. FIG. 3 illustrates a case wherein simultaneous write and comparison operations are performed in units of word lines in an open bit line arrangement wherein a bit line pair is formed by bit lines in different memory cell arrays sandwiching a corresponding sense circuit therebetween. In FIG. 3, reference numeral 1' denotes a memory cell array; and 4L, 4L', 4R, and 4R', bit lines. 4L and 4R, and 4L' and 4R' respectively form bit line pairs. Reference numeral 16' denotes a NOR circuit for detecting a coincidence with the readout data from the memory cells connected to word lines; 17', an output node of the NOR circuit 16'; 20 and 20', test data write control gates corresponding to the bit lines, respectively; 21 and 21', comparators corresponding to the bit lines, respectively; 22, 23, 24, and 25, test data write lines; 26, an OR circuit for detecting a coincidence with the readout data from the memory cells connected to word lines based on data output from the NOR circuits 16 and 16'; 27, 28, 29, and 30, test data write terminals; and 31 and 31', output nodes of comparators 21 and 21', respectively. The same reference numerals in FIG. 3 denote the same or corresponding parts as in FIG. 1.

An "H"- or "L"-level voltage is applied to the test data write terminals 27, 28, 29, and 30 in only a test mode; otherwise, these terminals are set in an open state. Note that the row decoder 5, the word driver 6, the word line drive clock signal $\phi_W$, and the sense circuit drive clock signal $\phi_{SA}$ shown in FIG. 1 are also necessary in this embodiment. However, they are omitted from FIG. 3.

A test according to this embodiment is substantially the same as that in the above embodiment, except that a control method of simultaneous write and comparison operation of test data is different therefrom. In this embodiment, the simultaneous write operation of the test data "CHECKERBOARD" can be achieved as follows. An "H"- or "L"-level voltage is applied to the test data write terminals 27 and 29, and an "L"- or "H"-level voltage is applied to the test data write terminals 28 and 30 to sequentially select word lines, and the "H" and "L" levels applied to these terminals are sequentially alternated. The simultaneous write operation of the test data "MSCAN" can be achieved such that an "H"- or "L"-level voltage is applied to the test data write terminals 27 and 28, and an "L"- or "H"-level voltage is applied to the terminals 29 and 30, and the word lines are sequentially selected while retaining the voltage levels applied to these terminals.

The simultaneous comparison operation of these test data is performed such that the voltage levels opposite to the above levels are applied to the respective terminals, and are compared with voltage levels appearing on the bit lines by a normal readout operation. As a characteristic feature of this embodiment, defective bits are detected using OR results of the output data from the NOR circuits 16 and 16'. The output terminal 18 is set at "L" level when the simultaneous comparison result represents that all the bits are good, and is set at "H"

level when the comparison result represents that the defective bits are obtained.

For test data of "MARCHING", the simultaneous write operation of background data for all the memory cells is performed in the same manner as "MSCAN". Then, the test data of "CHECKERBOARD" is simultaneously written, and simultaneous comparison is subsequently performed for the memory cells of the word line subjected to the simultaneous write operation. Thereafter, the inverted data of the data "CHECKERBOARD" is simultaneously written in the memory cells of the word line. This sequence is repeated each time a word line is selected, so that a simultaneous test by the test data "MARCHING" can be performed.

According to the test method of this embodiment, in a semiconductor memory wherein the physical arrangement of memory cells in the memory cell array is different from the logical address arrangement, the test data can be normally written. Canceling of latching associated with the sense circuit 7 described in the above embodiment can also be applied to this embodiment. According to the test method of this embodiment, since simultaneous write and comparison operations can be performed for the memory cells connected to word lines, a test time can be shortened to 1/n that of a conventional semiconductor memory. In this case, n indicates the number of memory cells subjected to simultaneous write and comparison operations and connected to a word line, and normally takes a large value, e.g., 500 or 1000 or more.

Figure 4:
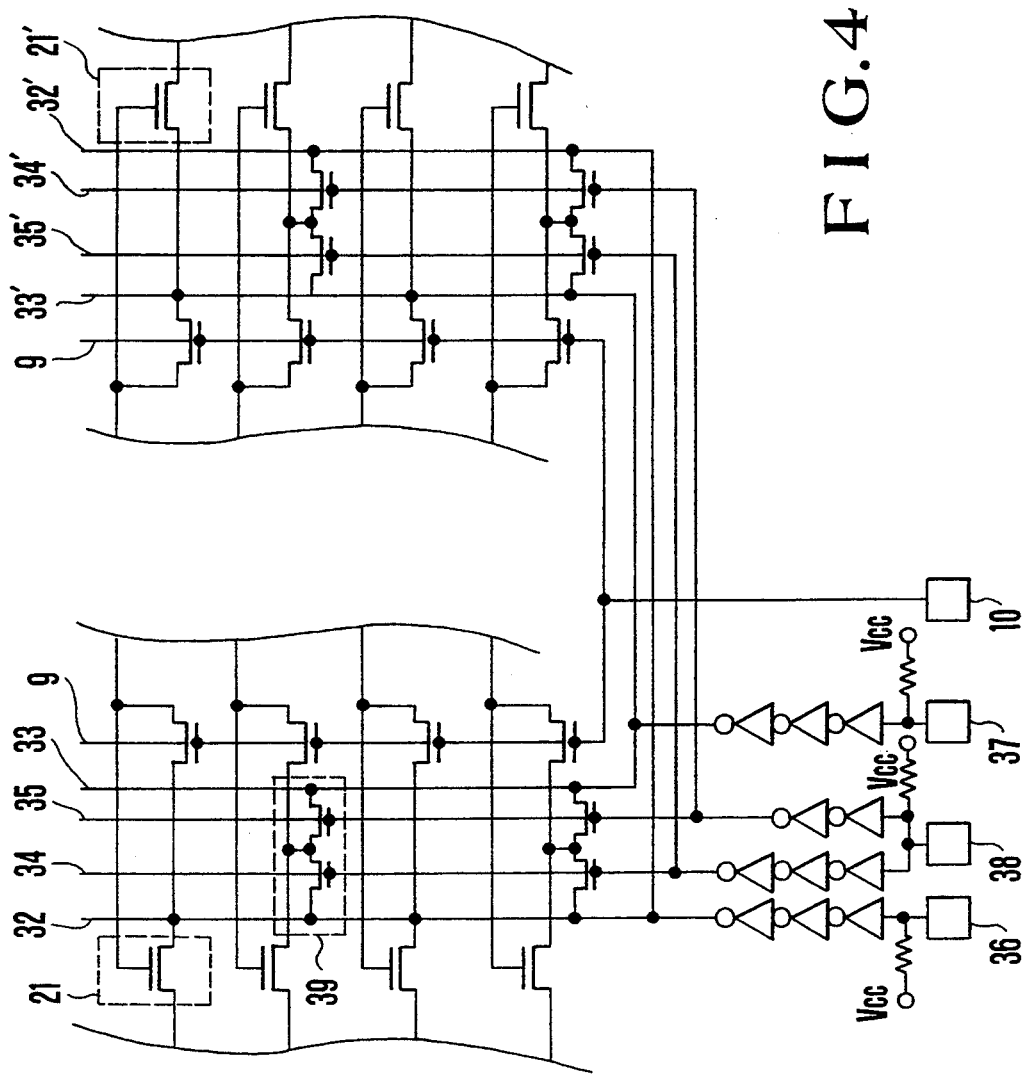
FIG. 4 is a circuit diagram showing a modification of the semiconductor memory shown in FIG. 3.

FIG. 4 is a modification of FIG. 3, showing a circuit system including test data write sections and test data write terminals between the test data write control gate 20 and the comparator 21, and the test data write control gate 20' and the comparator 21'. In the characteristic feature of this arrangement, a test data selection terminal is additionally provided, so that the number of test data write terminals is decreased to half that in the arrangement shown in FIG. 3. In FIG. 4, reference numerals 32, 32', 33 and 33' denote test data write lines; 34, 34', 35 and 35', test data selection lines; 36 and 37, test data write terminals; 38, a test data selection terminal; and 39, test data selection gates which are provided every other bit lines. The same reference numerals in FIG. 4 denote the same parts or corresponding parts as in FIG. 3.

The test data write terminals 36 and 37 they are set at "H" or "L" level during only the test; otherwise, are set in an open state.

The test method with the arrangement shown in FIG. 4 is the same as that in the above embodiment, except that a control method of simultaneous write and comparison operations is different therefrom. In this arrangement, the simultaneous write operation of the test data "CHECKERBOARD" can be achieved as follows. An "H"- or "L"-level voltage is applied to the test data write terminal 36, an "L"- or "H"-level voltage is applied to the test data write terminal 37, and an "H"-level voltage is applied to the test data selection terminal 38, so as to sequentially select the word lines and sequentially alternate the "H" and "L" levels applied to the terminals 36 and 37. The simultaneous write operation of the test data "MSCAN" is achieved as follows. An "H"- or "L"-level voltage is applied to the test data write terminal 36, an "L"- or "H"-level voltage is applied to the test data write terminal 37, and an "L"-level voltage is applied to the test data selection terminal 38, so that the word lines are sequentially selected while fixing the voltage levels applied to these terminals.

The simultaneous comparison operation of these test data is performed such that the voltage levels opposite to the above-mentioned levels are applied to the terminals 36 and 37, and are compared with the voltage levels appearing on the bit lines by a normal readout operation. According to the test method with the arrangement shown in FIG. 4, the test time can also be shortened as in the above embodiments. The same sequence as in FIG. 3 can be applied to the test data "MARCHING".

In the open bit line arrangement shown in FIG. 3, when a bit line extending from the memory cell array 1' to the array 1 can be arranged in a sense circuit pitch, and the test data write control gate 8 and the comparator 15 in FIG. 1 can also be arranged, the NOR gate 16 on the side of the memory cell array 1 need only be arranged. With this arrangement, the test time can also be shortened in the same manner as in the above embodiments.

Figure 5:
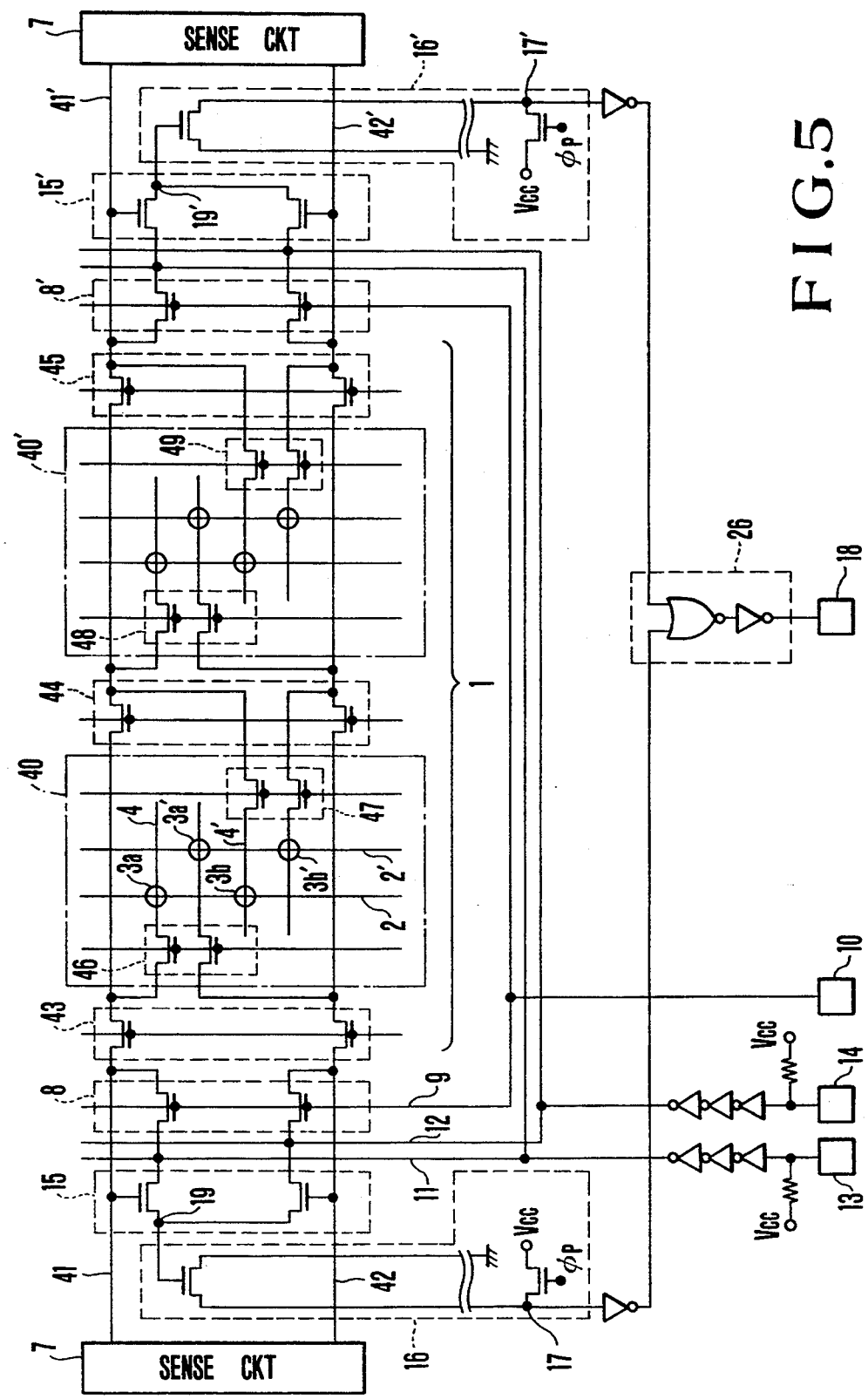
FIG. 5 is a circuit diagram showing an arrangement of a semiconductor memory according to still another embodiment of the present invention.

FIG. 5 shows an arrangement according to still another embodiment of the present invention. In this case, the present invention is applied to a high-density memory array structure for a very large capacity semiconductor memory. The characteristic feature of this memory array structure is as follows.

(1) In order to suppress a decrease in sense circuit pitch due to a reduction in memory cell area, sense circuits are separately arranged on both sides of a memory cell array.
(2) In order to reduce a bit line parasitic capacitance, bit lines are divided.
(3) Main bit lines which are not connected to memory cells and are formed by a wiring layer different from that of the bit lines are arranged, and the main bit lines and the bit lines are electrically connected.

FIG. 5 basically employs a folded bit line arrangement, and shows an arrangement corresponding to only a main bit line pair in which the memory cell array 1 is divided into two subarrays 40 and 40'. With this arrangement, sense circuits 7 are arranged on both sides of the memory cell array 1, so that the sense circuit pitch can be widened to 4 times a memory cell pitch. In FIG. 5, reference numeral 8' denotes a test data write control gate; 15', a comparator corresponding to a bit line pair; 19', an output node of the comparator 15'; 41, 41', 42, and 42', main bit lines; 43, 44, and 45, switches associated with the main bit lines; and 46, 47, 48, and 49, switches for connecting the bit lines and the main bit lines. The same reference numerals in FIG. 5 denote the same or corresponding parts as in FIGS. 1 and 3. The row decoder 5, the word driver 6, the word line drive clock signal $\phi_W$, the sense circuit drive clock signal $\phi_{SA}$ shown in FIG. 1 are also necessary in this embodiment, but are omitted from FIG. 5.

A readout operation upon selection of the word line 2 will be explained as a normal memory operation with the arrangement of FIG. 5. Only the switches 43, 45, 46, and 47 are turned on at substantially the same timing as that of selection of the word line 2. As a result, data stored in the memory cell 3a is supplied to a left sense circuit 7 through the switches 46 and 43, and is amplified. Data stored in the memory cell 3b is supplied to a right sense circuit 7 through the switches 47 and 45, and is amplified. Thereafter, a multiplexer and a data output circuit (neither are shown) are operated to read out data from memory cells of interest.

An example of a test operation according to this embodiment will be described. A simultaneous write operation of test data for the memory cells connected to word lines will be described with reference to a case wherein the word line 2 in FIG. 5 is selected as an object to be tested. Upon selection of the word line 2, the switches 43, 45, 46, and 47 are turned on. Data stored in the memory cells 3a and 3b appear on the main bit lines 41 and 41' respectively through the switches 46 and 43 and the switches 47 and 45. Thereafter, the right and left sense circuits 7 are operated. Since the switch 44 is kept off, the main bit lines 41 and 41' on which the data from the memory cells 3a and 3b appear are electrically disconnected. After the voltage levels of the main bit lines are determined upon operation of the sense circuits 7, an "H"- or "L"-level voltage corresponding to the test data is applied to test data write terminals 13 and 14. Then, an "H"-level voltage is applied to a test data write control terminal 10 so that the voltage levels corresponding to the test data are transmitted onto the bit lines 4 and 4' respectively through a path consisting of a test data write control gate 8, and the switches 43 and 46, and a path consisting of a test data write control gate 8', and the switches 45 and 47. At this time, since the word line 2 is held at "H" level, the simultaneous write operation of the test data is performed for the memory cells connected to each word line. Next, after the test data write control terminal 10 is set at "L" level and the test data write terminals 13 and 14 are set at "H" levels, the word line is set in a nonselection state at the same timing as in the normal memory operation, thus ending a series of write operations. In this manner, the word lines 2 and 2' are sequentially selected, and the "H"- and "L"-level voltages applied to the test data write terminals 13 and 14 are sequentially alternated, thereby simultaneously writing the test data "MSCAN". More specifically, in FIG. 5, "H"- or "L"-level data is written in all the memory cells 3a, 3b, 3a', and 3b'. When the word lines 2 and 2' are sequentially selected and the "H"- and "L"-level voltages applied to the test data write terminals 13 and 14 are alternated every two word lines, thereby simultaneously writing the test data "CHECKERBOARD". More specifically, in FIG. 5, "H"- or "L"-level data is written in the memory cells 3a and 3b, and the "L"- or "H"-level data is written in the memory cells 3a' and 3b'.

As can be seen from the description of the write operation, according to the test operation of this embodiment, even in a semiconductor memory wherein the physical arrangement of memory cells in a memory cell array is different from the logical address arrangement, these test data can be normally written. In order to facilitate the simultaneous write operation, when the "H"-level voltage is applied to the test data write control terminal 10, latching of the sense circuits 7 can be canceled. When the voltage levels of the bit lines 4 and 4' can be satisfactorily determined by a voltage applied from the test data write control terminal 10, the sense circuits 7 need not always be operated.

A simultaneous comparison sequence for the memory cells connected to the word lines will be described below. During a precharge period, output nodes 17 and 17' for the simultaneous comparison results are precharged to be "H"level. Thereafter, the same operation as in the above write operation is performed until a timing at which the sense circuits 7 are operated. After the voltage levels of the main bit lines are determined, the voltage level opposite to that of the test data in the write operation is applied to the test data write terminals 13 and 14. As a result, when the voltage level of the test data applied to the test data write terminals 13 and 14 coincides with the voltage level read out from the memory cell and appearing on the main bit line, output nodes 19 and 19' of comparators 15 and 15' go to "H" level, thus causing the output nodes 17 and 17' of NOR circuits 16 and 16' to be changed from the "H" level to "L" level. Therefore, it can be detected from observation of a change from "L" level to "H" level of an output terminal 18 that defective bits are present in all the memory cells connected to the selected memory cell. Note that the same sequence as in FIG. 1 can be applied to the test data "MARCHING". According to the test method of this embodiment as described above, since simultaneous write and comparison operations can be performed for the memory cells connected to word lines, a test time can be shortened to 1/n that of a conventional semiconductor memory. In this case, n indicates the number of memory cells connected to the word line and subjected to simultaneous write and comparison operations, and normally takes a large value, e.g., 500 or 1000 or more.

When the test data write control gate 8, the comparator 15, the NOR circuit 16, and the like are provided not to correspond to the sense circuit but on the side of either sense circuit, and the output node 17 is directly connected to the output terminal 18 without going through an OR circuit 26, this arrangement also belongs to the scope of the present invention. In this case, since a half the memory cells connected to a word line is subjected to simultaneous write and comparison operations, the test time can be shortened to 2/n that of a conventional semiconductor memory. In this case, n is the number of memory cells connected to the word line and subjected to simultaneous write and comparison operations.

The present invention is not limited to the arrangement of the sense circuits 7 shown in FIG. 5. Therefore, for example, the sense circuits 7 may be arranged in correspondence with the subarrays 40 and 40', and this arrangement also belongs to the scope of the present invention.

The present invention is not limited to the connection relationship between the main bit lines and the bit lines in FIG. 5, either. Therefore, for example, in the memory cell array arrangement wherein the test data write control gate 8, and the like are provided on the side of only one sense circuit, the switches 43, 44, and 45 associated with the main bit lines in FIG. 5 are unnecessary. The present invention is also effective for such a memory cell array arrangement.

Figure 6:
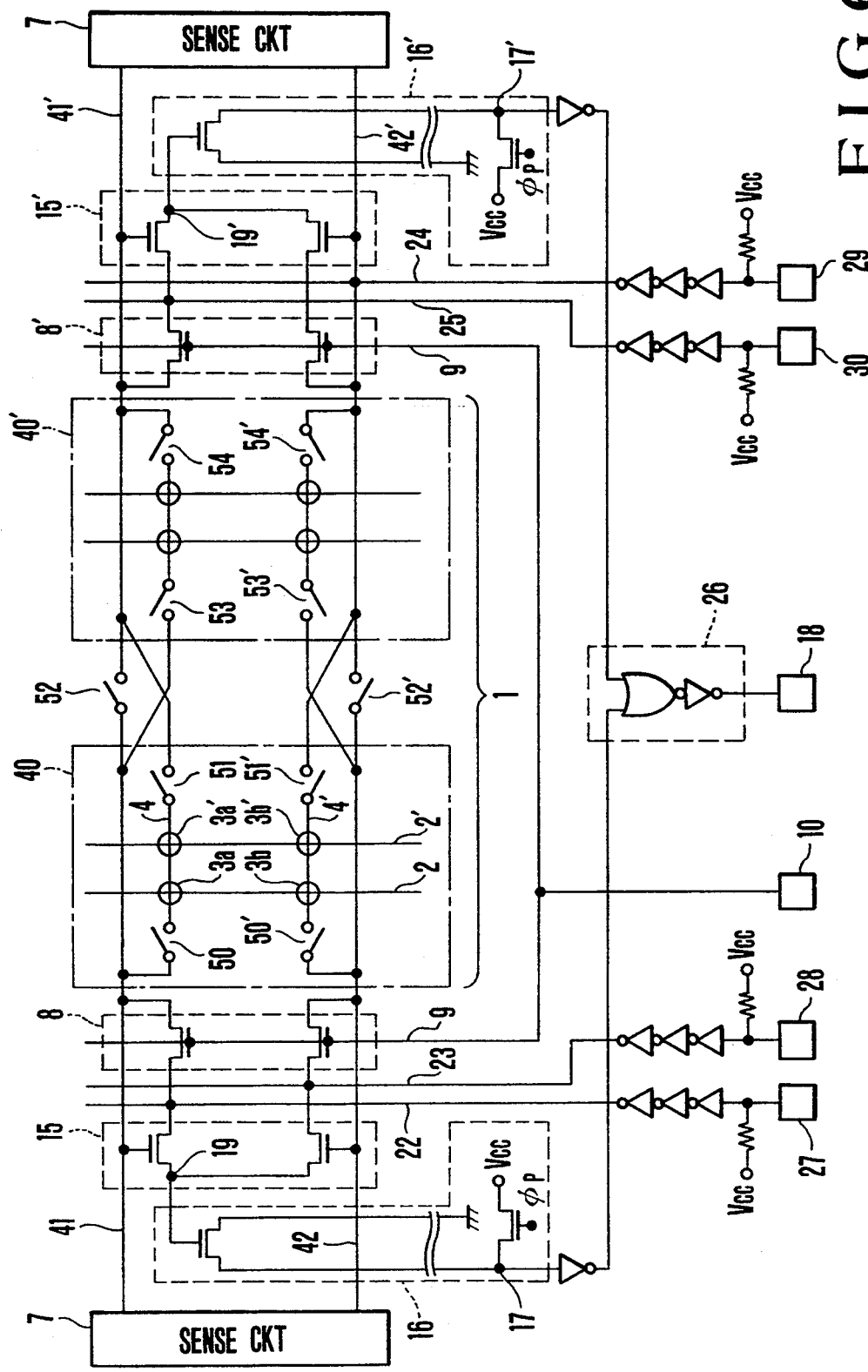
FIG. 6 is a circuit diagram showing a modification of the semiconductor memory shown in FIG. 5.

The present invention is not limited to the high-density memory cell array arrangement based on the folded bit line arrangement shown in FIG. 5. For example, FIG. 6 shows its modification showing a high-density memory cell array arrangement based on an open bit line arrangement to which the present invention is applied. FIG. 6 illustrates an arrangement, corresponding to one main bit line pair, in which the memory cell array 1 is divided into the two subarrays 40 and 40' in the same manner as in FIG. 5. For the sake of illustrative simplicity, various switches are represented by bar switches in place of transistors. In FIG. 6, reference numerals 50, 50', 51, 51', 53, 53', 54 and 54' denote switches for connecting the bit lines and the main bit lines; and 52 and 52' switches associated with the main bit lines. The same reference numerals in FIG. 6 denote the same or corresponding parts as in FIGS. 1, 3, and 5. Although the row decoder 5, the word driver 6, the word line drive clock signal $\phi_W$, the sense circuit drive clock signal $\phi_{SA}$ shown in FIG. 1 are also necessary in this modification, they are omitted from FIG. 6 for the sake of simplicity.

A test method with the arrangement of FIG. 6 will be described below by way of the embodiment shown in FIG. 5. First, a simultaneous write operation of a test data for the memory cells connected to the word lines will be described with reference to a case wherein the word line 2 is selected as an object to be tested. Upon selection of the word line 2, the switches 50 and 50' are turned on. Data stored in the memory cells 3a and 3b appear on the main bit lines 41 and 42' respectively through the switches 50 and 51'. Thereafter, the left and right sense circuits 7 are operated. Since the switches 52 and 52' are kept off, the main bit lines 41, 41', 42 and 42' are electrically disconnected. After the voltage levels of the main bit lines are determined upon operation of the sense circuits 7, an "H"- or "L"-level voltage corresponding to the test data is applied to the test data write terminals 27, 28, 29, and 30. Then, an "H"-level voltage is applied to the test data write control terminal 10, so that the voltage levels corresponding to the test data are transmitted onto the bit lines 4 and 4' respectively through a path consisting of the test data write control gate 8 and the switch 50, and a path consisting of the test data write control gate 8' and the switch 51'. At this time, since the word line 2 is held at "H" level, the test data is simultaneously written for the memory cells connected to the word lines. Then, the test data write control terminal 10 is set at "L" level, and all the test data write terminals 27 to 30 are set at "H" level. Thereafter, the word lines are set in a nonselection state at the same timing as in the normal memory operation, thus ending a series of write operations. In this manner, the "H"- or "L"-level voltage is applied to the test data write terminals 27 and 30, and the "L"- or "H"-level voltage is applied to the terminals 28 and 29, so that the word lines are sequentially selected and the "H"- and "L"-level voltages applied to these terminals are sequentially alternated, thereby simultaneously writing the test data "CHECKERBOARD". When the "H"- or "L"-level voltage is applied to the test data write terminals 27 and 29, and the "L"- or "H"-level voltage is applied to the terminals 28 and 30, the word lines are sequentially selected while fixing the voltage levels applied to these terminals, thereby simultaneously writing the test data "MSCAN". As can be seen from the above description, according to the test method of the modification shown in FIG. 6, even in a semiconductor memory wherein the physical arrangement of memory cells in a memory cell array is different from the logical address arrangement, these test data can be normally written. Note that in order to further facilitate the simultaneous write operation, when the "H"-level voltage is applied to the test data write control terminal 10, latching of the sense circuits 7 can be canceled. When the voltage levels of the bit lines 4 and 4' can be satisfactorily determined by a voltage applied from the test data write control terminal 10, the sense circuits 7 need not always be operated.

A simultaneous comparison sequence for the memory cells connected to word lines will now be described. The same operation as in the above write operation is performed until a timing at which the sense circuits 7 are operated. After the voltage levels of the main bit lines are determined, the voltage levels opposite to that of the test data in the write operation are applied to the test data write terminals 27 to 30. As a result, when the applied opposite voltage levels coincide with the voltage levels appearing on the main bit lines by the normal readout operation, the output nodes 19 and 19' of the comparators 15 and 15' go to "H" level and cause the output nodes 17 and 17' of the NOR circuits 16 and 16' to be changed from "H" level to "L" level. Therefore, it can be detected from observation of a change from "L" level to "H" level of the output terminal 18 that defective bits are present in all the memory cells connected to the selected word line. Note that the same sequence as in FIG. 3 can be applied to the test data "MARCHING".

According to the test method of the modification shown in FIG. 6 as described above, since the simultaneous write and comparison operations can be performed for the memory cells connected to word lines, a test time can be shortened to 1/n that of a conventional semiconductor memory. In this case, n indicates the number of memory cells connected to the word line and subjected to simultaneous write and comparison operations, and normally takes a large value, e.g. 500 or 1000 or more.

Note that when the test data write control gate 8, the comparator 15, the NOR circuit 16, the test data write lines 22 and 23, the test data write terminals 27 and 28, and the like are provided on the side of either one sense circuit, and the output node is directly connected to the output terminal 18 without going through the OR circuit 26, this arrangement also belongs to the scope of the present invention. In this case, since a half the memory cells connected to the word line is subjected to the simultaneous write and comparison operations, a test time can be shortened to 2/n that of a conventional semiconductor memory. In this case, n indicates the number of memory cells connected to the word line and subjected to the simultaneous write and comparison operations.

The present invention is not limited to the connection relationship between the main bit lines and the bit lines in FIG. 6. Therefore, the present invention can be effectively applied to a memory cell arrangement wherein bit lines are electrically connected to main bit lines using either one pair of switches arranged at two ends of the bit lines.

Figure 7:
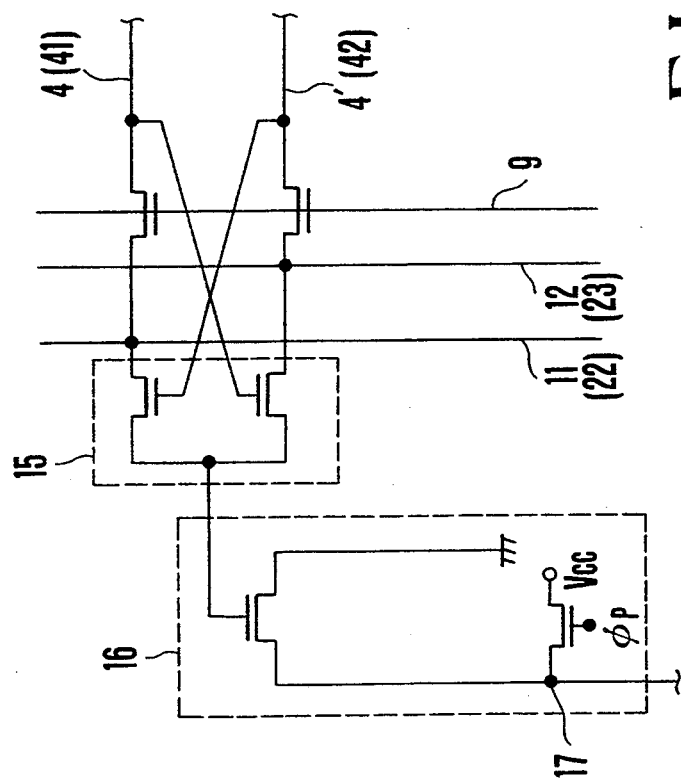
FIG. 7 is a circuit diagram showing another circuit configuration in which a connecting relationship between a comparator and bit lines or main bit lines is changed in FIGS. 1, 5, and 6.

FIG. 7 shows another circuit arrangement in which the connection relationship between the comparator 15, the bit lines 4 and 4' or the main bit lines 41 and 42 in FIGS. 1, 5, and 6 is changed. The characteristic feature of this arrangement is as follows. More specifically, the bit lines 4 and 4' or the main bit lines 41 and 42 are cross-connected to the gates of transistors in the comparator 15. With this arrangement, upon simultaneous comparison for the memory cells connected to the word lines, the same voltage levels (not inverted data) as that of the test data in the write operation can be applied to the test data write terminals. Therefore, a desired test data can be applied regardless of the simultaneous write and comparison operations upon testing. The test data write control gates 8, 8', 20, and 20', the test data write control line 9, the test data write control terminal 10, the test data write lines 11, 12, 22, 23, 24, and 25, and the test data write terminals 13, 14, and 27 to 30 shown in FIGS. 1, 3, 5, 6, and 7 are not limited to the illustrated arrangements. Therefore, for example, in FIG. 1, a single line may be used instead of the test data write lines 11 and 12, a single terminal may be used instead of the test data write terminals 13 and 14, two test data write control lines 9 may be arranged, and two test data write control terminals 10 may be arranged, so that the two transistors in the test data write control gates 8 and 8' are independently controlled by the two test data write control lines 9.

In the above embodiments of the present invention, the simultaneous write and comparison operations for the memory cells connected to word lines have been described. However, for example, if a plurality of word lines are simultaneously multiple-selected, test data can be written in all the memory cells in a memory cell array by several times of write operations. Therefore, in the present invention, the simultaneous write and comparison operations need not be performed in units of word lines. For example, the operation may be performed for one word line, or for a plurality of word lines, or for a part of a word line. The present invention is not limited to a DRAM as a semiconductor memory but can be similarly applied to a static RAM, ROM, and the like.

According to the present invention as described above, "0" or "1" test data is simultaneously written from an external terminal in a plurality of memory cells connected to a selected word line, and the test data written in the plurality of memory cells connected to the selected memory cells are simultaneously compared with "0" or "1" expected value data applied from the external terminal to the plurality of memory cells connected to the selected word line, thereby greatly shortening a write/comparison time. Therefore, a semiconductor memory which can greatly shorten a test time can be realized.

If a plurality of word lines are multiple-selected, a specific test data can be written in all the memory cells by a single or several times of write operation, and the same effect as described above can be provided.

Figure 8:
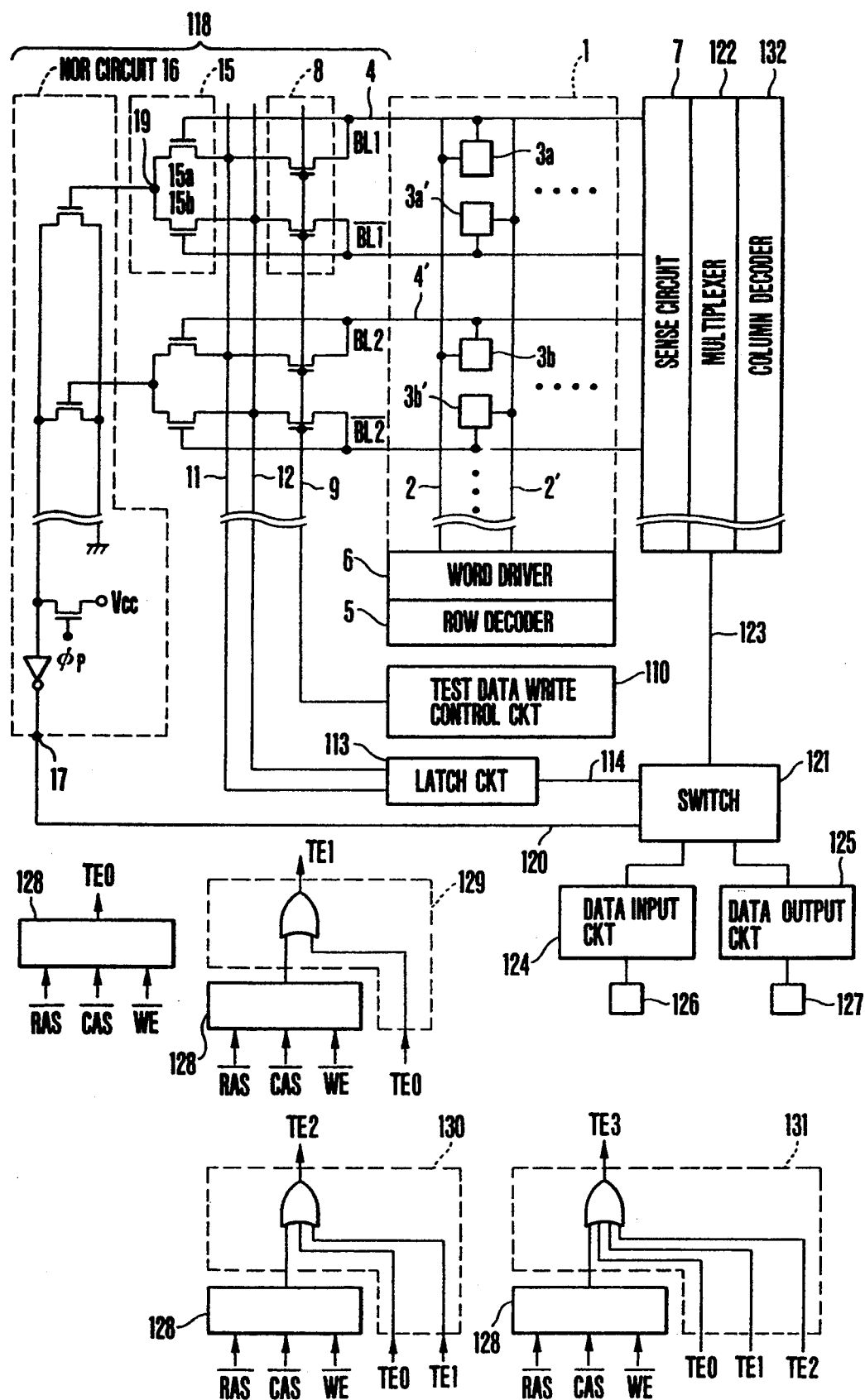
FIG. 8 is a circuit diagram showing an arrangement of a semiconductor memory according to still another embodiment of the present invention.

FIG. 8 is a circuit diagram showing still another embodiment of the present invention. FIG. 8 illustrates a case wherein simultaneous write and comparison operations are performed for all the memory cells in units of word lines in a folded bit line arrangement in which a bit line pair in an identical memory cell array is connected to a sense circuit.

The same reference numerals in FIG. 8 denote the same parts as in FIG. 1. In FIG. 8, reference numeral 113 denotes a latch circuit. The latch circuit 113 latches test data and supplies test data having opposing polarities to each other, i.e., complementary voltage levels, to test data write lines 11 and 12. Reference numeral 114 denotes a latch input line; 118, a test circuit constituted by a test data write control gate 8, a test data write control line 9, the test data write control lines 11 and 12, a comparator 15, and a NOR circuit 16; 120, a test result output line; 121, a switch; 122, a multiplexer; 123, a data line; 124, a data input circuit; 125, a data output circuit; 126, a data input terminal; 127, a data output terminal; 128 to 131 test mode signal generators; and 132, a column decoder. In addition, $\phi_P$ in the NOR circuit 16 is a precharge clock signal, and Vcc is a power supply voltage. $\overline{RAS}$ and $\overline{CAS}$ respectively indicate fundamental row and column clock signals of the semiconductor memory, $\overline{WE}$ indicates a write control clock, and TE0 to TE3 indicate test mode setting signals.

With the above arrangement, the test data write control gate 8, the test data write control line 9, the test data write control circuit 10, the test data write lines 11 and 12, the latch circuit 113, and the like constitute a simultaneous write circuit. The test data write control line 9, the test data write control circuit 10, the test data write lines 11 and 12, the latch circuit 113, the comparator 15, the NOR circuit 16, and the like constitute a simultaneous comparison circuit. In the circuit configuration in which data input and output systems are separated, as shown in FIG. 8, the latch circuit need not always be arranged, and such an arrangement also belongs to the scope of the present invention. The test data write control gate 8, the test data write control line 9, and the test data write lines 11 and 12 shown in FIG. 8 are not limited to the illustrated arrangements. Therefore, in FIG. 8, a single write line may be used in place of the test data write lines 11 and 12, and instead, two test data write control lines 9 may be arranged, so that the two transistors in the test data write control gate 8 may be independently controlled by the two control lines 9.

The test mode setting signal generator 128 comprises a circuit for detecting transition timings of clocks $\overline{RAS}$, $\overline{CAS}$, and $\overline{WE}$ determined by the JEDEC, and can be realized by a known arrangement.

FIG. 9 is a flow chart of the test method according to the embodiment shown in FIG. 8. In FIG. 9, a "peripheral circuit" in step S1 means a circuit section excluding the memory cell arrays and the test circuit constituted by the simultaneous write and comparison circuits. This flow chart has the following two features. The first feature is the order of the test. The second feature is that when a bit error is detected as the test result in the test of the peripheral circuits or the test circuit, the test for the test circuit or the memory cell array corresponding to the subsequent flow is stopped, and all the tests are stopped.

Figure 10:
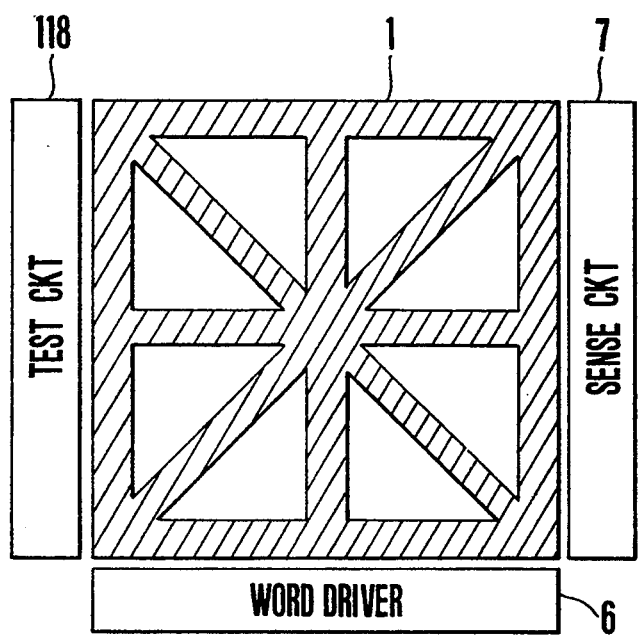
FIG. 10 is a view showing a memory cell array which is used as an object in a test of a peripheral circuit according to the embodiment shown in FIG. 8.

FIG. 10 shows an arrangement of a plurality of memory cell lines serving as objects in a test of the peripheral circuits according to the embodiment shown in FIG. 8. In FIG. 10, the memory cell arrays indicated by a hatched portion are used as test objects, so that the test time of the peripheral circuits can be shortened. Since this operation has been described in association with the embodiment shown in FIG. 1, a detailed description thereof will be omitted.

FIGS. 11(a) to 11(h) are timing charts showing the relationship of level determinations among the test mode setting signals TE0 to TE3, the write control clock signal $\overline{WE}$, a signal on the latch input line 114, a signal on the test result output line 120, and a signal on the data line 123 in the embodiment of FIG. 8. In FIGS. 11(f) and 11(h), hatched portions represent arbitrary level periods. The test mode setting signal TE0 serves as a test start signal for the peripheral circuits. The test mode setting signal TE1 serves as a test start signal for the test circuit; TE2, a second-step test start signal; and TE3, a test start signal for the memory cell arrays. On the other hand, portions other than the hatched portions represent periods during which the levels of the lines must be determined.

In the example shown in FIG. 11, the write control clock signal WE is changed every cycle to alternately perform write access (corresponding to "L" level) and read access (corresponding to "H" level). However, the present invention is not limited to this sequence. Therefore, after test data write access is performed for all the word lines, read access may then be performed. In FIG. 11, the test start period for the peripheral circuits is defined by the test mode setting signal TE0. However, the signal TE0 need not always be provided. As will be described later, in the test of the peripheral circuits, test data read/write access is performed through the data line 123 and the multiplexer 122 in the same manner as in normal read/write access. The transition timings of the $\overline{RAS}$, $\overline{CAS}$, and $\overline{WE}$ with respect to setting and canceling of the test mode are described in Nikkei Micro Device, extra issue No. 1 (May, 1987, pp. 73-80), and are shown in FIG. 12. The test mode setting signal generators 128 to 131 in FIG. 8 detect the test modes at the transition timings of the clocks $\overline{RAS}$, $\overline{CAS}$, and WE shown in FIGS. 12(a), 12(b), and 12(c), and thereafter latch the test mode setting signals TE0 to TE3 at "H" level. Therefore, if the clock timing is arbitrarily set after the test mode is detected, the test mode setting signals TE0 to TE3 are held at "H" level.

An example of the test according to the embodiment shown in FIG. 8 will be described with reference to FIGS. 8 to 11(h). As shown in step S1 (FIG. 9), the test of the peripheral circuits is performed for the memory cell lines shown in FIG. 10. More specifically, test data is applied to the data input terminal 126 in FIG. 8. The test data is written in a single memory cell in the hatched portion in FIG. 10 selected by the row and column decoders 5 and 132 through the data input circuit 124, the switch 121, the data line 123, and the multiplexer 122. The written test data is read out to the data output terminal 127 through the multiplexer 122, the data line 123, the switch 121, and the data output circuit 125. The readout data is transferred to a tester outside the semiconductor memory, and is compared with expected value data by the tester. The above operation is repeated while sequentially shifting the position of the memory cell in the hatched portion of FIG. 10. In the test of the peripheral circuits, the test data is transmitted not through the latch input line 114 and the test result output line 120 but through only the data line 123. A semiconductor memory which is determined to be a defect by the tester is excluded from a series of test flows (steps S2 and S8). If the tester determines that the corresponding semiconductor memory is good, the transition timings of the clocks $\overline{RAS}$, $\overline{CAS}$, and $\overline{WE}$ are set to be the test mode to generate the test mode setting signal TE1. Then, control advances to the test flow of the test circuit (steps S2 and S3).

In the test flow of the test circuit, the switch 121 is switched by the test mode setting signal TE1 so that the data input circuit 124 and the data output circuit 125 are respectively connected to the latch input line 114, and the test result output line 120. The test data is simultaneously written in all the memory cells on a single word line serving as an object in the test of the peripheral circuits through the latch input line 114, the latch circuit 113, the test data write lines 11 and 12, and the test data write control gate 8. The written test data is simultaneously compared with expected value data input to the comparator 15 through the latch input line 114, the latch circuit 113, and the test data write lines 11 and 12. The NOR circuit 16 receives all the comparison results, and simultaneously performs defect detection. The test result is read out to the data output terminal 127 through the test result output line 120, the switch 121, and the data output circuit 125. The test result is transferred to the tester, and its voltage level is detected thereby. If the test result representing that a defective test circuit is present is output, the corresponding semiconductor memory is excluded from a series of test flows (steps S4 and S8). Contrarily to this, if the test result indicating that no defect is detected is output, the transition timings of the clocks $\overline{RAS}$, $\overline{CAS}$, and $\overline{WE}$ are set to be the test mode to generate the test mode setting signal TE2. Then, control advances to the next test flow for the test circuit.

In the next test flow, the switch 121 is switched by the test mode setting signal TE2 so that the data input circuit 124 and the data output circuit 125 are respectively connected to the data line 123 and the test result output line 120. Inverted data of the test data simultaneously written in the previous test flow is written in a bit of the memory cell on the single word line selected by the column decoder through the data line 123 and the multiplexer 122. The test result subjected to defect detection in the NOR circuit 116 is transferred to the tester, and its voltage level is detected thereby in the same manner as in the previous test flow. A memory cell to which the inverted data is written is shifted to the selected word line, and the above operation is repeated. When the test circuit outputs no defect detection result, the corresponding semiconductor memory is excluded from a series of test flows (steps S4 and S8). On the contrary, when the test circuit outputs the defect detection result, the transition timings of the clocks $\overline{RAS}$, $\overline{CAS}$, and $\overline{WE}$ are set to be the test mode to generate the test mode setting signal TE3. Then, control advances to the test flow for the memory cell arrays (steps S4 and S5).

In the test flow of the memory cell arrays, the switch 121 is switched by the test mode setting signal TE3 so that the data input circuit 124 and the data output circuit 125 are respectively connected to the latch input line 114 and the test result output line 120. The test data is simultaneously written in all the memory cells on a word line selected by the row decoder 5, through the latch input line 114, the latch circuit 113, the test data write lines 11 and 12, and the test data write control gate 8. The written test data are simultaneously compared with expected value data input to the comparator 15, through the latch input line 114, the latch circuit 113, and the test data write lines 11 and 12. The NOR circuit 16 receives all the comparison results, and simultaneously performs defect detection. The test result is read out to the data output terminal 127 through the test result output line 120, the switch 121, and the data output circuit 125. The test result is transferred to the tester, and its voltage level is detected thereby. The above operation is repeated while sequentially shifting the positions of the word lines. In this case, if the detection result representing that defective bits are detected is output, the corresponding semiconductor memory is excluded from a series of test flows (steps S6 and S8). In contrast to this, if the detection result indicating no defective bits is output, the semiconductor memory is determined to be good (steps S6 and S7).

The series of test operations is canceled by the transition timings of the clocks $\overline{RAS}$, $\overline{CAS}$, and $\overline{WE}$ shown in FIGS. 12(a), 12(b), and 12(c). Note that in FIG. 11, T1 indicates a period of the test of the peripheral circuits; T2, a period of the test for the test circuit; and T3, a period of the test for the memory cell arrays. In FIG. 12, T11 indicates a period corresponding to a setting cycle of the test mode; and T12, a period corresponding to a canceling cycle of the test mode.

FIGS. 13(a) to 13(k) are detailed timing charts paying attention to the test of the memory cell arrays according to the embodiment shown in FIG. 8. Numerals and the like in FIGS. 13(a) to 13(k) correspond to those in FIG. 8.

The test of the memory cell arrays according to the embodiment shown in FIG. 8 will be described in more detail with reference to FIGS. 8 and 13(a) to 13(k). A simultaneous write operation of test data in units of word lines is performed as follows. The clocks $\overline{RAS}$ and $\overline{WE}$ shown in FIGS. 13(a) and 13(c) go to "L" level, and the semiconductor memory is set in a write mode. Then, the precharge clock signal $\phi_P$ shown in FIG. 13(d) goes to "L" level, and thereafter, the row decoder 5 is operated to select, e.g., the word line 2. The word line drive clock signal shown in FIG. 13(e) is set at "H" level to operate the word driver 6, thereby setting the selected word line 2 at "H" level. After data from all the memory cells connected to the word line 2 appear on the bit lines, the sense circuit drive clock signal shown in FIG. 13(f) goes to "H" level, thereby operating the sense circuit 7. Upon operation of the sense circuit 7, the voltage levels of the bit lines are determined, and thereafter, as shown in FIG. 13(g) "H"- or "L"-level complementary signals corresponding to the test data are supplied to the test data write lines 11 and 12. The test data is input from the data input terminal 126 while the clock $\overline{WE}$ is kept at "L" level, as shown in FIG. 13(j). In a read mode, data is read out during a transition period of the clock $\overline{RAS}$ changing from "H" level to "L" level. As shown in FIG. 13(h), the test data write control line 9 is set at "H" level, and a voltage level corresponding the test data is applied onto the bit lines. At this time, since the word line 2 is held at "H" level, and the simultaneous write operation of the test data is performed in units of word lines. During the simultaneous write mode, the voltage level of the data output terminal 127 shown in FIG. 13(k) has a high impedance, as indicated by a solid line.

In this manner, the word lines 2, 2', . . . are sequentially selected, and the "H"- and "L"-level voltages applied to the test data write lines 11 and 12 are sequentially alternated, thereby simultaneously writing test data "MSCAN". More specifically, in FIG. 8, "H"- or "L"-level test data is written in the memory cells 3a, 3b, 3a', and 3b'. When the "H"- and "L"-level voltages applied to the test data write lines 11 and 12 are alternated every two word lines, test data "CHECKERBOARD" can be simultaneously written. More specifically, in FIG. 8, "H"- or "L"-level data is written in the memory cells 3a and 3b and "L"- or "H"-level data is written in the memory cells 3a' and 3b'. In order to further facilitate the simultaneous write operation, when the test data write control line 9 is set at "H" level, the sense circuit drive clock signal may be temporarily set at "L" level so as to cancel latching of the sense circuit 7. When the voltage levels of the bit lines are satisfactorily determined by a voltage applied from the test data write control line 9, the sense circuit 7 need not always be operated.

A simultaneous comparison sequence in units of word lines will now be described. The same operation as the normal write operation is performed until a timing at which the sense circuit 7 is operated. After the voltage levels of the bit lines are determined, expected value data is supplied onto the test data write lines 11 and 12 through the data input circuit 124 and the switch 121. In this case, the test data write control line 9 is kept at "L" level. As a result, when data read out from the memory cell coincides with the expected value data, i.e., when the data read out from the memory cell is error data, the output node 19 of the comparator 15 goes to "H" level, and causes the output node 17 of the NOR circuit 16 to be changed from "L" level to "H" level. Therefore, it can be detected from observation of a change in voltage level appearing at the data output terminal 127 that defective bits are present in all the memory cells connected to the selected word line. This state is shown in FIG. 13(k). In FIG. 13(k), "H" level indicates that defective bits are present, and "L" level indicates that all the bits are good or the write operation is being performed.

A practical operation when the test data coincides with data read out from the memory cell will now be described. A case will be described wherein "H"-level test data is written in the memory cell 3a through the test data write line 11. In this case, in the simultaneous comparison mode, "L"-level data is transmitted to the test data write line 11, and "H"-level data is transmitted to the test data write line 12. Then, these data are compared with the data read out from the memory cell 3a. When the data read out from the memory 3a has a wrong level, e.g., "L" level, the bit line BL1, i.e., the gate of the transistor 15a of the comparator 15 goes to "L" level, and the transistor 15a is turned off. In this case, the bit line $\overline{BL1}$ is set at "H" level upon operation of the dummy cell and the sense circuit 7. The gate of the transistor 15b of the comparator 15 goes to "H" level. Thus, the transistor 15b is turned on, and the "H"-level data input from the test data write line 12 to the comparator 15 appears at the output node 19, thus causing the output node 17 of the NOR circuit 16 to be changed from "L" level to "H" level.

In the above operation, the case has been exemplified wherein the test data write lines 11 and 12 are respectively set at "H" and "L" levels in the write mode. If the test data write lines 11 and 12 are respectively set at "L" and "H" levels in the write mode, the same operation as described above is performed.

In the simultaneous write and comparison test method described above, "MSCAN" and "CHECKERBOARD" have been exemplified as test data. A test using "MARCHING" can be performed. This test can be achieved by the following sequences. Write access of background data with respect to all the memory cells and subsequent simultaneous comparison of the readout data are performed in the same manner as in the operations using "MSCAN", and the same simultaneous write and comparison operations are performed while the voltage levels applied to the test data write lines 11 and 12 are inverted. However, in the present invention, since data of the same level is simultaneously written in all or a plurality of memory cells or supplementary memory cells connected to a selected word line, defect detection of a decoding function by using column address which can be performed by the conventional test method cannot be performed. Therefore, for defect detection of the decoding function by using column address, a test using "MARCHING" is additionally performed for all the memory cells and supplementary memory cells connected to one or a plurality of word lines in the memory cell array 1.

With the test method according to the embodiment shown in FIG. 8 as described above, since simultaneous write and comparison operations can be performed for the memory cells connected to word lines, a test time can be shortened to 1/n that of a conventional semiconductor memory. In this case, n indicates the number of memory cells subjected to simultaneous write and comparison operations and connected to a word line, and normally takes a large value, e.g., 500 or 1000 or more.

As a matter of course, the modification shown in FIG. 7 can be applied to the embodiment shown in FIG. 8.

FIG. 14 shows an arrangement of the test data write control circuit 110 shown in FIG. 8. In FIG. 14, $\phi_{SA}(d)$ indicates a delay signal of the sense circuit drive clock signal, which sets a timing at which the test data write control line 9 is set at "H" level. The logic defined by the test mode setting signals TE1 to TE3 controls not to erroneously cause a simultaneous write operation of test data during the test of the peripheral circuits and the second half test of the test circuit. The test data write control line 9 is set at "H" level only during the first-half test of the test circuit and during the test of the memory cell arrays. During the test of the memory cell arrays, in order to internally set start and end timings of the write and read operations of the test data for all the word lines in the semiconductor memory, output data from an address counter circuit may be input to the test data write control circuit 110 and may be used as a control signal.

FIG. 15 shows an arrangement of the latch circuit 113 shown in FIG. 8. In FIG. 15, reference symbol TG denotes a transfer gate. Data is latched by the transfer gate TG and two inverters. When an input signal indicated by an arrow is set at "H" level, the transfer gate TG is turned on. The data latch operation is performed at a timing at which the clock $\overline{RAS}$ goes from "H" level to "L" level in the read mode. The latched data is sent onto the test data write lines 11 and 12 at a timing at which a signal $\phi_{SA}(d)'$ goes from "L" level to "H" level. The signal $\phi_{SA}(d)'$ is a delayed signal of the sense circuit drive clock signal, which is delayed by a smaller delay amount than that of the signal $\phi_{SA}(d)$.

FIG. 16 shows an arrangement of the switch 121 shown in FIG. 8. The switch 121 connects the data input circuit 124 or the data output circuit 125 to any one of the latch input line 114, the test result output lines 120, and the data line 123. In FIG. 16, reference symbol TG represents a transfer gate, which is turned on when an input signal indicated by an arrow is set at "H" level.

FIG. 17 shows an arrangement of the data input circuit 124 shown in FIG. 8. The data input circuit 124 fetches test data or normal input data, and can fetch expected value data from the data input terminal 126 in the read mode during the tests of the test circuit and the memory cell arrays.

FIG. 18 shows an arrangement according to still another embodiment of the present invention. In FIG. 18, the present invention is applied to an I/O COMMON semiconductor memory. FIG. 18 shows only the peripheral circuits of a data input/output circuit. The circuit shown in FIG. 18 is adopted in place of the circuit constituted by the switch 121, the data input circuit 124, the data output circuit 125, the data input terminal 126, and the data output terminal 127 shown in FIG. 8. The circuitry including the memory cell arrays, the test circuit, the latch circuit, and the like shown in FIG. 8 (not shown in FIG. 18) can be employed. In FIG. 18, reference numeral 133 denotes a switch; 134, a data input/output (I/O) circuit; and 135, a data I/O terminal. The relationship of level determination between the test mode setting signals, the write control clock signals, the latch input line 114, the test result output line 120, and the data line 123 when all the test are carried out according to this embodiment is the same as that defined by the timing chart shown in FIGS. 11(a) to 11(h).

FIGS. 19(a) to 19(j) are timing charts paying attention to the test of the memory cell arrays, in which the data input terminal 126 and the data output terminal 127 shown in the timing chart in FIG. 13 are replaced with the data I/O terminal 135. Reference numerals and the like in FIGS. 19(a) to 19(j) correspond to those in FIGS. 8 and 18.

Figure 19:
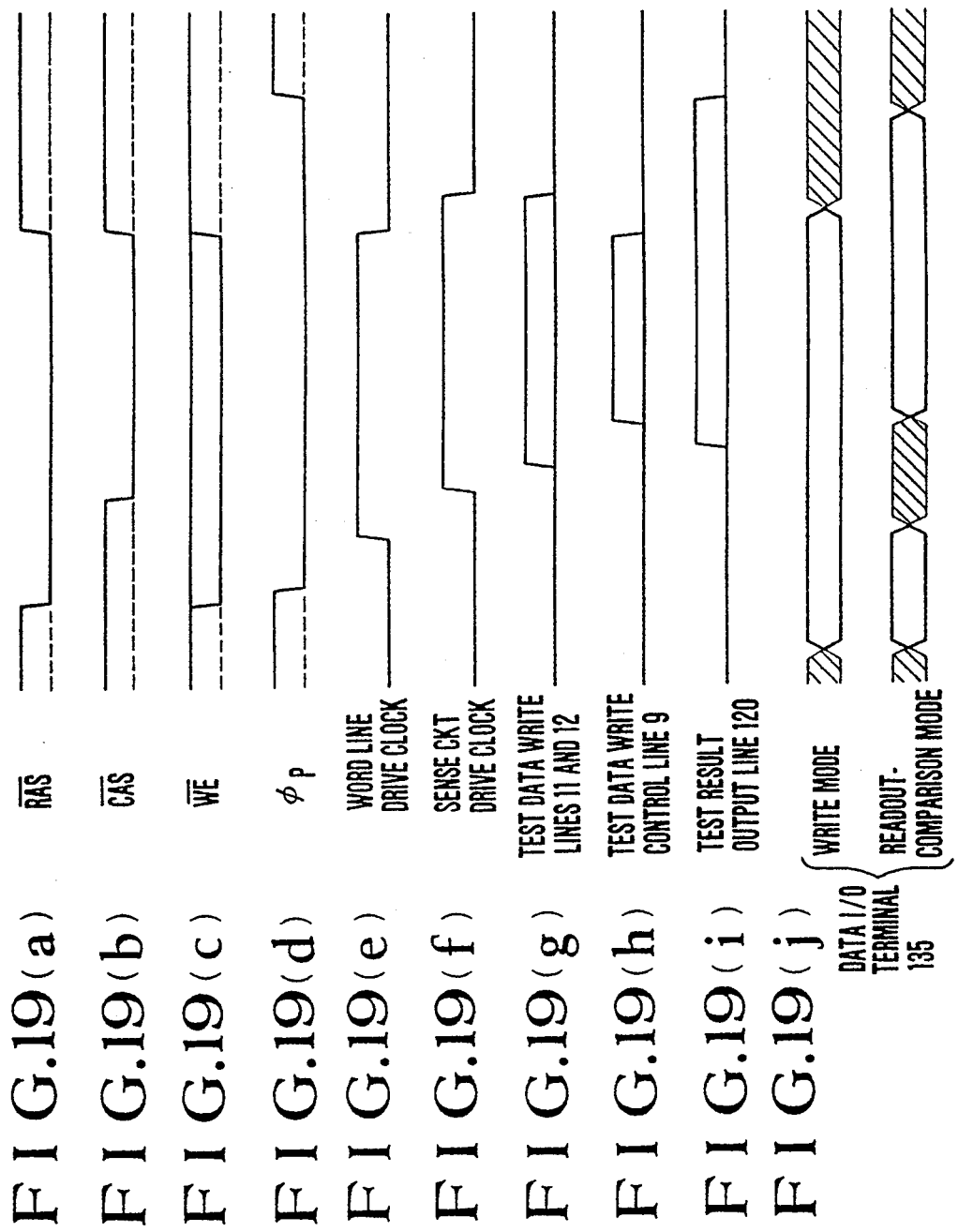
FIGS. 19(a) to 19(j) are timing charts associated with a test of the memory cell array according to the embodiment shown in FIG. 18.

A simultaneous comparison sequence in units of word lines of the test of the memory cell array according to the embodiment shown in FIG. 18 will be described with reference to FIGS. 8, 18, and 19. Note that since the simultaneous write sequence can be explained in the same manner as in the embodiment shown in FIG. 8, a description thereof will be omitted. At a timing at which the clock $\overline{RAS}$ shown in FIG. 19(a) goes to "L" level, expected value data from the data I/O terminal 135 shown in FIG. 19(j) is fetched by the latch circuit 113. After the expected value data is latched, the data I/O circuit 134 sets the latch input line 114 in a floating state. After the voltage levels of the bit lines are-determined upon operation of the sense circuit 7, the expected value data fetched by the latch circuit 113 is transmitted to the test data write lines 11 and 12. At this time, the test data write control line 9 is held at "L" level. As a result, when data read out from the memory cell is error data, the output node 19 of the comparator 15 goes to "H" level, and causes the output node 17 of the NOR circuit 16 to be changed from "L" level to "H" level. Therefore, upon observation of a change in voltage level appearing at the data I/O terminal 135 through the switch 133, it can be detected that defective bits are present in all the memory cells connected to the selected word line. More specifically, in FIG. 19(j), "H" level indicates that defective bits are present, and "L" level indicates that all the bits are good or the write operation is being performed.

Figure 20:
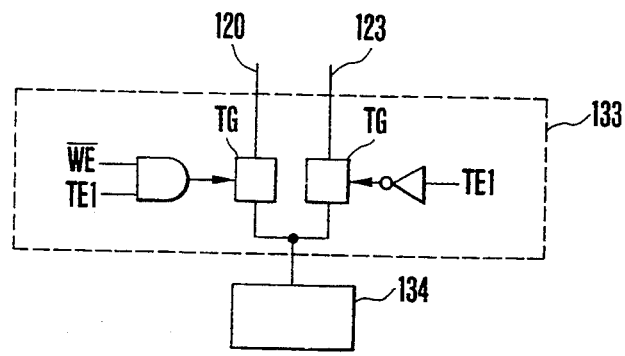
FIG. 20 is a circuit diagram showing an arrangement of a switch shown in FIG. 18.

FIG. 20 shows an arrangement of the switch 133 shown in FIG. 18. In FIG. 20, reference symbol TG denotes a transfer gate, which is turned on when an input signal indicated by an arrow is set at "H" level.

Figure 21:
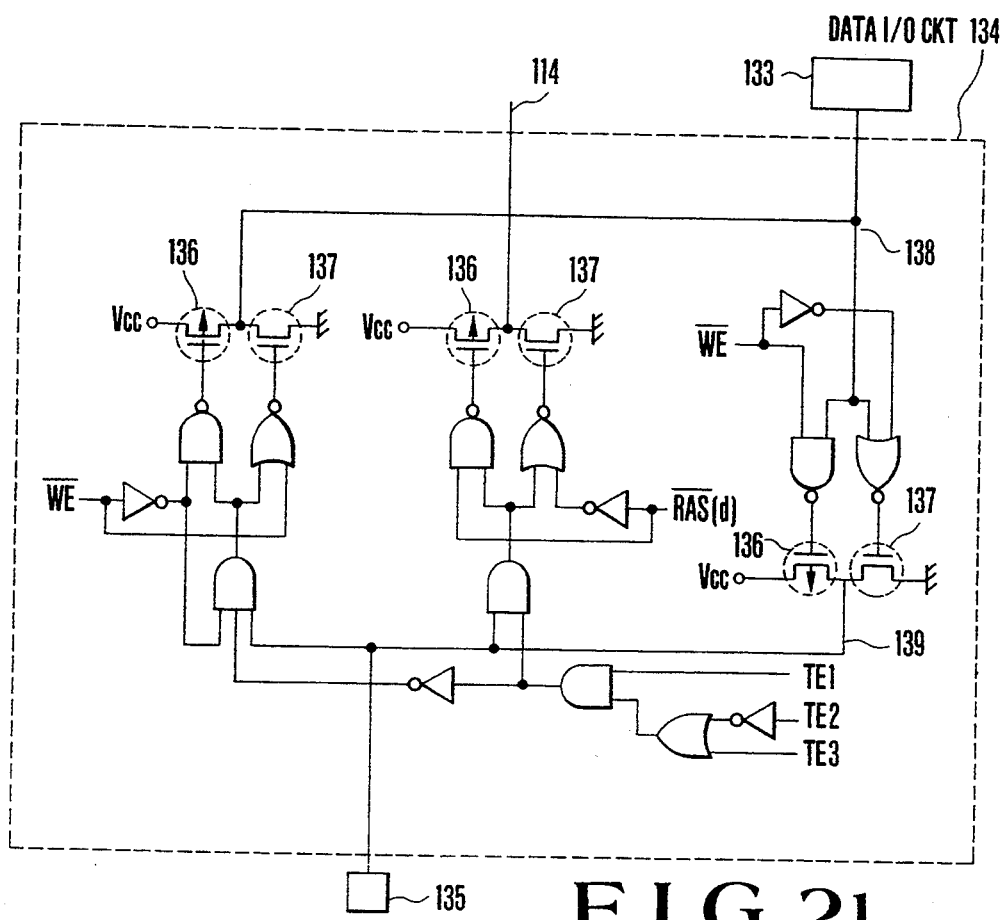
FIG. 21 is a circuit diagram showing an arrangement of a data input/output circuit in FIG. 18.

FIG. 21 shows an arrangement of the data I/O circuit 134 in FIG. 18. In FIG. 21, $\overline{RAS}(d)$ indicates a delay signal of the clock signal $\overline{RAS}$, which serves to set the latch input line 114 in the floating state after the expected value data is fetched by the latch circuit 113. Reference numeral 136 denotes PMOS transistors; and 137, NMOS transistors. These transistors serve to realize floating of the latch input line 114, floating of the signal line 138 in the test data read mode, and floating of the signal line 139 in the test data write mode in accordance with outputs from a NAND circuit and a NOR circuit.

In the above embodiments of the present invention, the simultaneous write and comparison operations for the memory cells connected to word lines have been described. However, for example, if a plurality of word lines are simultaneously multiple-selected, test data can be written in all the memory cells in a memory cell array by several times of write operations. Therefore, in the present invention, the simultaneous write and comparison operations need not be performed in units of word lines. For example, the operation may be performed for a single word line, or for a plurality of word lines, or for a part of a word line.

The above embodiments employ a folded bit line arrangement as a memory cell array arrangement. However, the present invention is not limited to this memory cell array arrangement. For example, the present invention can be similarly applied to an open bit line arrangement in which a bit line pair is formed by bit lines in different memory cell arrays sandwiching a sense circuit therebetween.

Figure 22:
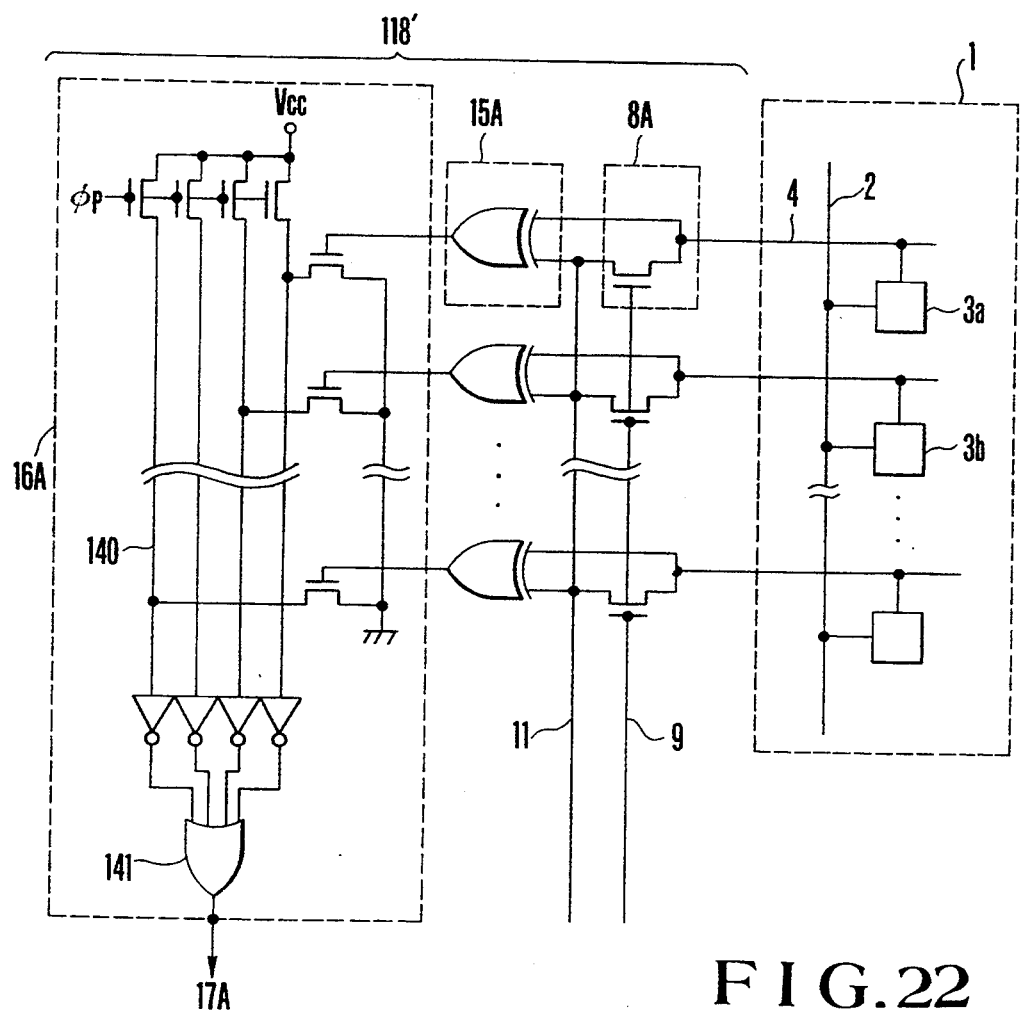
FIG. 22 is a circuit diagram showing an arrangement wherein a test circuit of the present invention is applied to a semiconductor memory having an open bit line arrangement.

FIG. 22 shows an arrangement of a test circuit in a semiconductor memory adopting the open bit line arrangement, and illustrates only a main part associated with one of memory cell arrays sandwiching a sense circuit therebetween. In FIG. 22, reference numeral 8A denotes a test data write control gate corresponding to a bit line; and 15A, a logical comparator. In this case, the comparator 15A adopts the transistor 15a in the comparator 15 shown in FIG. 8. Reference numeral 16A denotes a NOR circuit whose circuit configuration is modified. In order to determine the voltage level of the output result earlier, a plurality of output lines 140 are provided, and the outputs therefrom are input to an OR circuit 141. Reference numeral 17A denotes an output node of the NOR circuit 16A. Other reference numerals in FIG. 22 denote the same parts as in FIG. 8. In FIG. 22, the word driver, the sense circuit, and the like in FIG. 8 are omitted. The simultaneous write and comparison operations of test data by a test circuit 118' of this embodiment are the same as in the embodiment shown in FIG. 8. However, in this case, test data is limited to "MSCAN".

Figure 23:
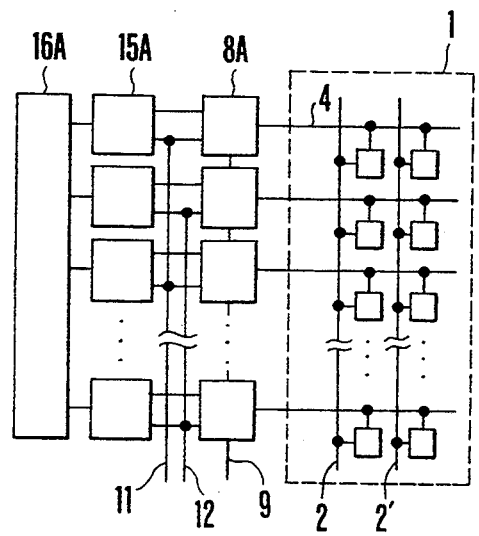
FIG. 23 is a circuit diagram showing a modification of the test circuit shown in FIG. 22.

FIG. 23 shows an arrangement wherein two test data write lines are provided. With this arrangement, test data "CHECKERBOARD" and "MARCHING" can be employed in the same manner as in the embodiment shown in FIG. 8. In this case, the simultaneous write operation of "MSCAN" can be realized by fixing an identical voltage level applied to the test data write lines 11 and 12 regardless of sequential selection of word lines. The simultaneous write operation of "CHECKERBOARD" can be realized by alternating different voltage levels applied to the test data write lines 11 and 12 upon sequential selection of word lines. As for "MARCHING" first the simultaneous write operation of background data for all the memory cells is performed in the same manner as in the test using "MSCAN". Then, for example, data read out from the memory cells connected to the word line 2 in FIG. 23 are simultaneously compared with expected value data. Thereafter, different voltage levels are applied to the test data write lines 11 and 12 to simultaneously write data in the memory cells connected to one word line 2. Thereafter, the simultaneous comparison operation is similarly executed. A voltage level opposite to that of the background data is simultaneously applied to the test data write lines 11 and 12 to simultaneously write data in all the memory cells connected to the word line 2. Thereafter, the simultaneous comparison operation is similarly executed. The above operations are sequentially performed for the word line 2' and the subsequent lines. In this manner, "MARCHING" in units of word lines can be realized. When the open bit line arrangement is employed as an object to be controlled, there are both a case wherein an identical voltage level is applied to the test data write lines 11 and 12 (in the case of "MARCHING"), and a case wherein complementary voltage levels are respectively applied to the test data write lines 11 and 12 (in the cases of "MSCAN" and "CHECKERBOARD"). For this reason, the latch circuit 113 shown in FIG. 15 must be modified so as to output not only different voltage levels but also an identical voltage level to the test data write lines 11 and 12.

The present invention can be similarly applied to a high-density memory cell array arrangement for a very large capacity semiconductor memory wherein bit lines have a hierarchical structure, and sense circuits are provided on two sides of memory cell arrays.

For details of modifications in the open bit line arrangement shown in FIGS. 22 and 23 and the simultaneous write and comparison method of test data for the high-density memory cell array arrangement, the descriptions associated with FIGS. 5 and 6 may be referred to.

In the present invention, a semiconductor memory is not limited to a DRAM. For example, the present invention can be similarly applied to a static RAM, a ROM, and the like.

With the arrangement according to the embodiment shown in FIGS. 8 to 23, "0" or "1" test data is simultaneously written from an external terminal for inputting/outputting normal data in a plurality of memory cells connected to a selected word line, and the test data written in the plurality of memory cells connected to the selected memory cells are simultaneously compared with "0" or "1" expected value data applied from the external terminal to the plurality of memory cells connected to the selected word line, thereby greatly shortening a write/comparison time. Therefore, a semiconductor memory which can greatly shorten a test time can be realized.

If a plurality of word lines are multiple-selected, a specific test pattern can be written in all the memory cells by once or several times of the write operation, the same effect as described above can be provided.

Figure 24:
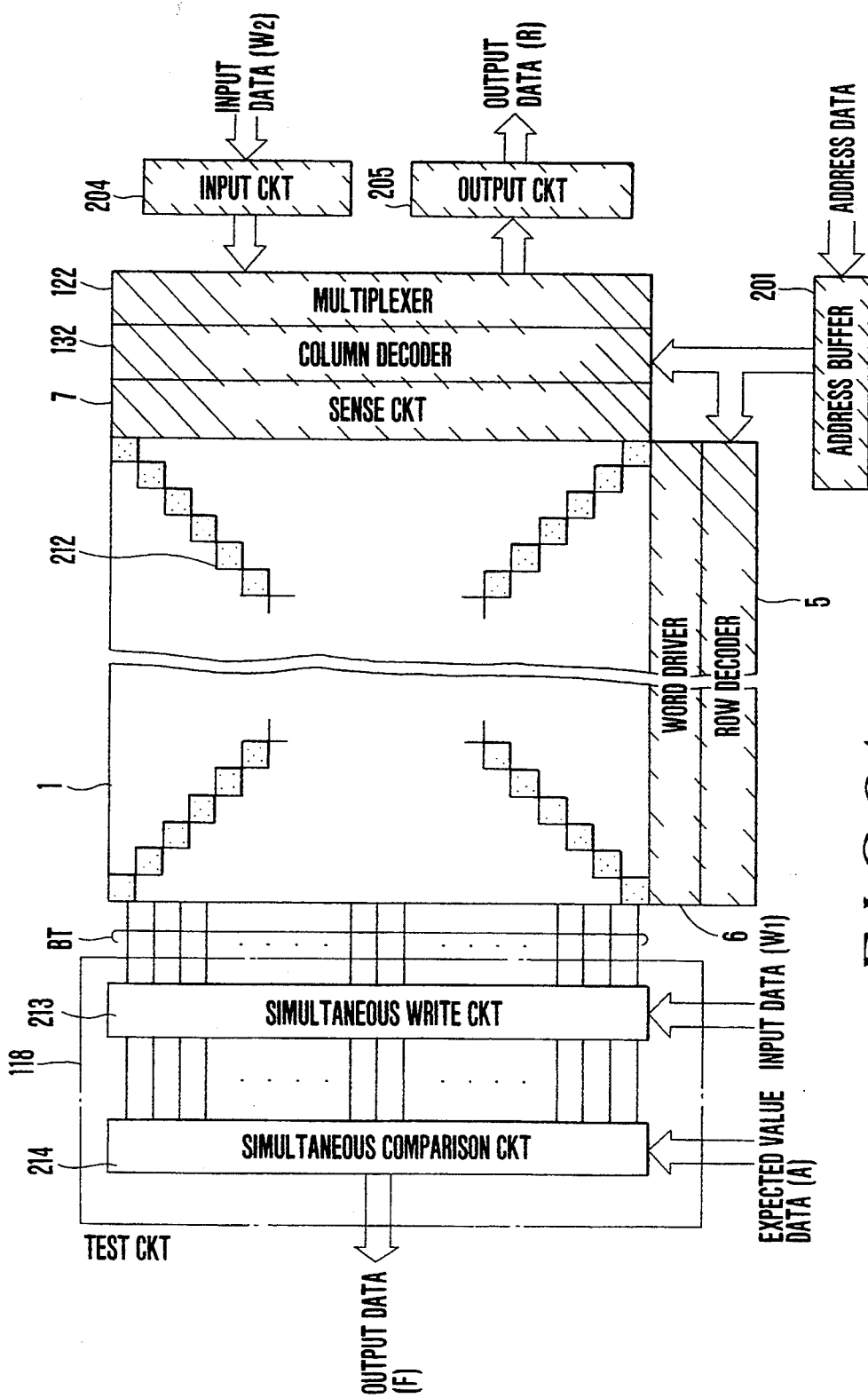
FIG. 24 is a diagram showing still another embodiment of the present invention.

FIG. 24 shows a circuit configuration of a semiconductor memory to which the present invention is applied. The same reference numerals in FIG. 24 denote the same parts as in FIG. 8. Reference numeral 201 denotes an address buffer; 204, a data input circuit; and 205, a data output circuit. Circuits indicated by hatched portions in FIG. 24 correspond to peripheral circuits. A memory cell line 212 indicated by dots in a memory cell array 1 is connected in a diagonal direction. Reference symbol BT denotes bit lines. Reference numeral 213 denotes a simultaneous write circuit; and 214, a simultaneous comparison circuit. The circuits 213 and 214 constitute a test circuit 118. Reference symbol $W_1$ denotes input data corresponding to test data; $W_2$, input data corresponding to the test data $W_1$ or inverted data thereof; R, output data corresponding to readout data; and F, output data corresponding to a comparison result from the test circuit 118. The data $W_1$, $W_2$, R, and F and expected value data A are connected to a memory tester through external connecting terminals in the semiconductor memory. These terminals can be independently arranged, but a data input terminal and the like can be commonly used therefor. For the detailed circuit arrangements of the simultaneous write circuit 213 and the simultaneous comparison circuit 214, refer to the previous embodiments.

FIG. 25 is a flow chart of a test method. Table 1 summarizes types of input/output data, positions of comparison and defect detection operations, and memory cells as objects to be tested when the test is conducted in accordance with the flow chart shown in FIG. 25. In FIG. 25 and Table 1, peripheral circuits other than memory cell arrays and a test circuit are simply called a "peripheral circuit". In addition, the memory cell array and the test circuit are simply called "other than peripheral circuit". The flow chart shown in FIG. 25 has the feature in the order of tests. In addition, in the flow chart shown in FIG. 25, when the test result of the peripheral circuits represents a defect, the flow advances to step S13 "defective chip". Therefore, a test for circuits other than the peripheral circuits in step S15 corresponding to the next flow is stopped, and the tests for the entire semiconductor memory are inhibited. For this reason, a test time can be saved.

More specifically, a defect is not determined after all the tests are completed but is determined when a defect is detected, the subsequent tests are inhibited. Therefore, the test time can be saved.

TABLE 1

| Circuit to be Tested | Input Data | Output Data | Portion to be Subjected to Comparison | Portion to be Subjected to Defect Detection | Memory Cell to be Tested |
|---|---|---|---|---|---|
| Peripheral Circuit | Test Data $W_2$ | Readout Data R | Outside Semiconductor Memory | Outside Semiconductor Memory | Memory Cells on One Line or More |
| Other Than Peripheral Circuit | Test Data $W_1$ | Comparison Result F | Inside Semiconductor Memory | Inside Semiconductor Memory | All Memory Cells |

The test of the memory with the above arrangement is performed as follows. A test of the peripheral circuits indicated by the hatched portion is performed using the memory cell line 212 indicated by dots as test objects. More specifically, the input (test) data $W_2$ is fetched from the data input circuit 204, and the readout data R from the data output circuit 205 are transferred to a tester outside the semiconductor memory. The transferred data is compared with expected value data, and defect detection is performed by the tester. When a semiconductor memory is determined to be a defect, the flow reaches step S13 "defective chip", and the corresponding memory is excluded from the series of test flows. If a semiconductor memory is determined to be good, control advances to the next test flow. In a test of circuits other than the peripheral circuits, the test is performed using only the test circuit 118 without operating the data input circuit 204 and the data output circuit 205. First, the input (test) data $W_1$ is written in all the memory cells connected to one word line in the memory cell array 1 through the simultaneous write circuit 213. Thereafter, the written data of all the memory cells as the objects are simultaneously compared with expected value data using the simultaneous comparison circuit 214, and the comparison result F is transferred to the tester outside the semiconductor memory. If the memory cells on this word line include a defective cell, the comparison result F goes to "H" level. The tester detects the level of the comparison result F to determine presence/absence of defects. All the memory cells are tested while shifting the position of the word line as the test object. As the test data in the series of test procedures described above, any test data of an N pattern, an $N^2$ pattern, and an $N^{3/2}$ pattern may be used. In a test in a mass production process for large-capacity semiconductor memories, the N pattern test data is mainly used in order to prevent an increase in test time regardless of a conventional test method and the test method of the present invention. When a test data length of the conventional test method is in proportion to N/n (where N indicates the number of memory cells in a memory cell array, and n indicates the number of memory cells which can be simultaneously tested), the test data length of the test method according to the present invention is in proportion to $N^{\frac{1}{2}}$. In this case, n is a small value, e.g., about 4 to 16, while N corresponds to a storage capacity of a semiconductor memory, and may be a very large value, e.g., 1M (mega=one million) in a large-capacity semiconductor memory. Therefore, the test time according to the test method of the present invention can be greatly reduced (about 1/100) as compared to the conventional test method.

In the above embodiment, input data is simultaneously written in all the memory cells on one word line in the memory cell array 1. However, if the memory cells on this word line are divisionally tested, input data is simultaneously written in all the memory cells in each divided section.

Figure 26:
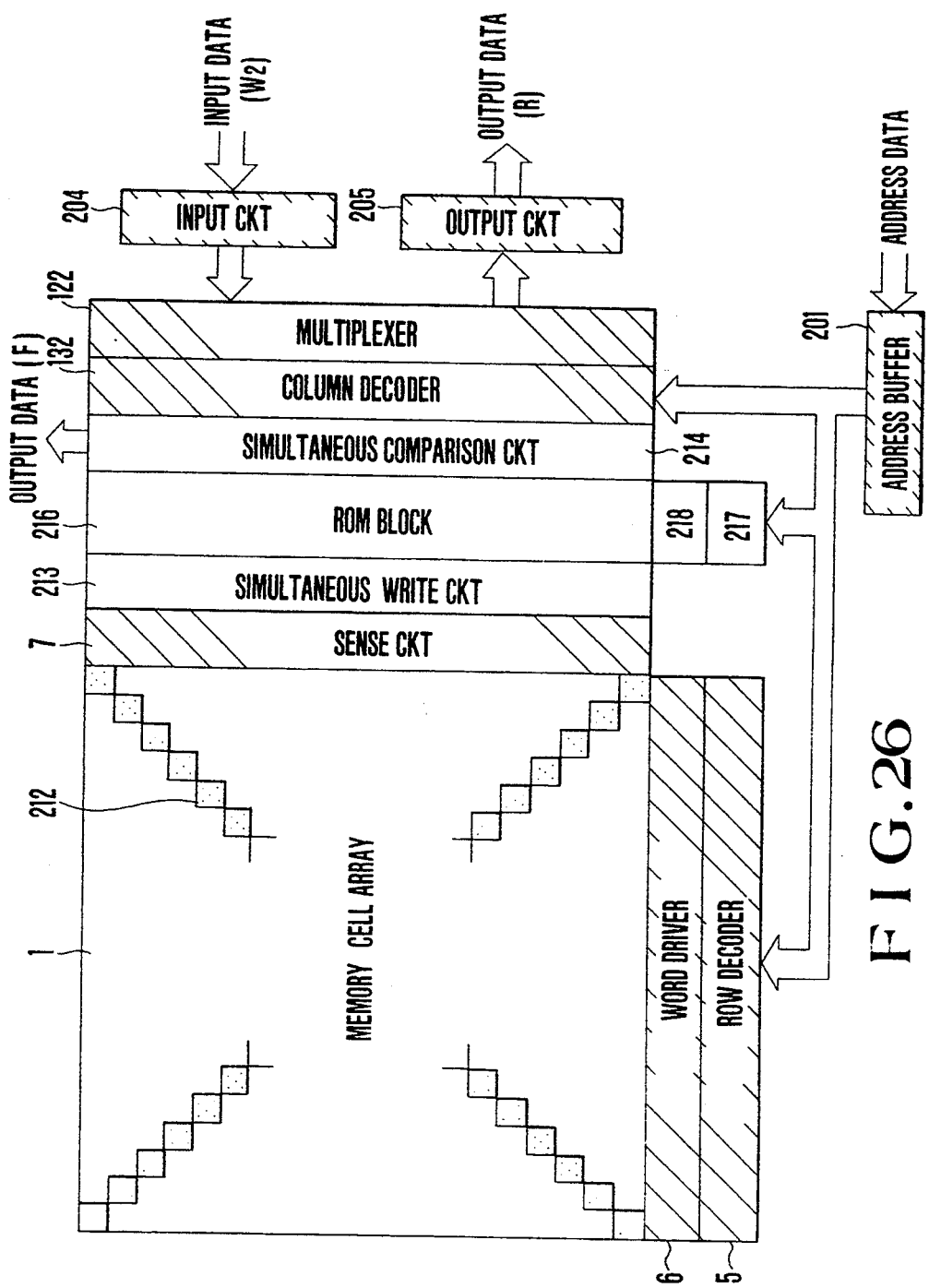
FIGS. 26, 27, and 29 are diagrams showing other embodiments of the present invention, respectively.

In the above embodiment, the test data is externally supplied as input data. FIG. 26 exemplifies a case wherein a ROM block 216 comprising a plurality of ROM elements stores some test data, and the test data is selected externally. In FIG. 26, reference numeral 216 denotes a ROM block comprising a plurality of ROM elements; 217, a ROM element decoder; and 218, a ROM element word driver. Other reference numerals correspond to those in FIG. 24. Address data applied to the ROM element decoder 217 is ROM element selection address data, and a plurality of address data are provided in accordance with the number of ROM element word lines (not shown). The number of ROM element word lines depends on the number of test data written in memory cells. For example, two test data corresponding to all "0" and all "1" or test data corresponding to two types of "CHECKERBOARD" in which "0"s or "1"s alternately appear at the even- and odd-numbered ROM elements connected to the ROM element word lines are written in the memory cells on a word line, four ROM element word lines are required. Note that the detailed arrangements of the ROM block 216, the simultaneous write circuit 213, and the simultaneous comparison circuit 214 are described in Japanese Patent Application No. 60-282491 "Semiconductor Memory" as a ROM element array and two types of switching circuits, respectively.

The flow chart of the test method for the semiconductor memory shown in FIG. 26 corresponds to that shown in FIG. 25. Table 2 shows the types of input/output data, portions subjected to comparison and defect detection, and memory cells to be tested when the test is conducted in accordance with the flow chart shown in FIG. 25.

TABLE 2

| Circuit to be Tested | Input Data | Output Data | Portion to be Subjected to Comparison | Portion to be Subjected to Defect Detection | Memory Cell to be Tested |
|---|---|---|---|---|---|
| Peripheral Circuit | Test Data $W_2$ | Read-Out Data R | Outside Semiconductor Memory | Outside Semiconductor Memory | Memory Cells on One Line or More |
| Other Than Periph- | Data in ROM | Comparison | Inside Semiconductor | Inside Semiconductor | All Memory Cells |

TABLE 2-continued

| Circuit to be Tested | Input Data | Output Data | Portion to be Subjected to Comparison | Portion to be Subjected to Defect Detection | Memory Cell to be Tested |
|---|---|---|---|---|---|
| eral Circuit | Element | Result F | Memory | Memory | |

The operation of the memory shown in FIG. 26 is as follows. First, a test of peripheral circuits indicated by hatched portions is carried out using the memory cell line 212 indicated by dots. Input (test) data $W_2$ is written from the data input circuit 204, and readout data R from the data output circuit 205 is transferred to a tester outside the semiconductor memory. Then, the readout data is compared with expected value data by the tester to detect defects. If a semiconductor memory is determined to be defective, it is excluded from the series of test flows. If a semiconductor memory is determined to be good, control advances to the next test flow. In a test of circuits other than the peripheral circuits, stack data of all (or a plurality of) ROM elements connected to the ROM element word lines (not shown) in the ROM block 216 are written in all the memory cells on one word line in the memory cell array 1 through the simultaneous write circuit 213. Thereafter, the read out data from all (or a plurality of) memory cells on this word line are simultaneously compared with the stack data of all (or a plurality of) ROM elements connected to the ROM element word lines. Then, a comparison result F is transferred to the tester outside the semiconductor memory. The tester detects the level of the comparison result F to discriminate the presence/absence of defects. All the memory cells are tested while sequentially shifting the position of the word line to be tested. According to the test method of this embodiment, the test time can also be shortened in the same manner as in the test method of a semiconductor memory shown in FIG. 24.

Figure 27:
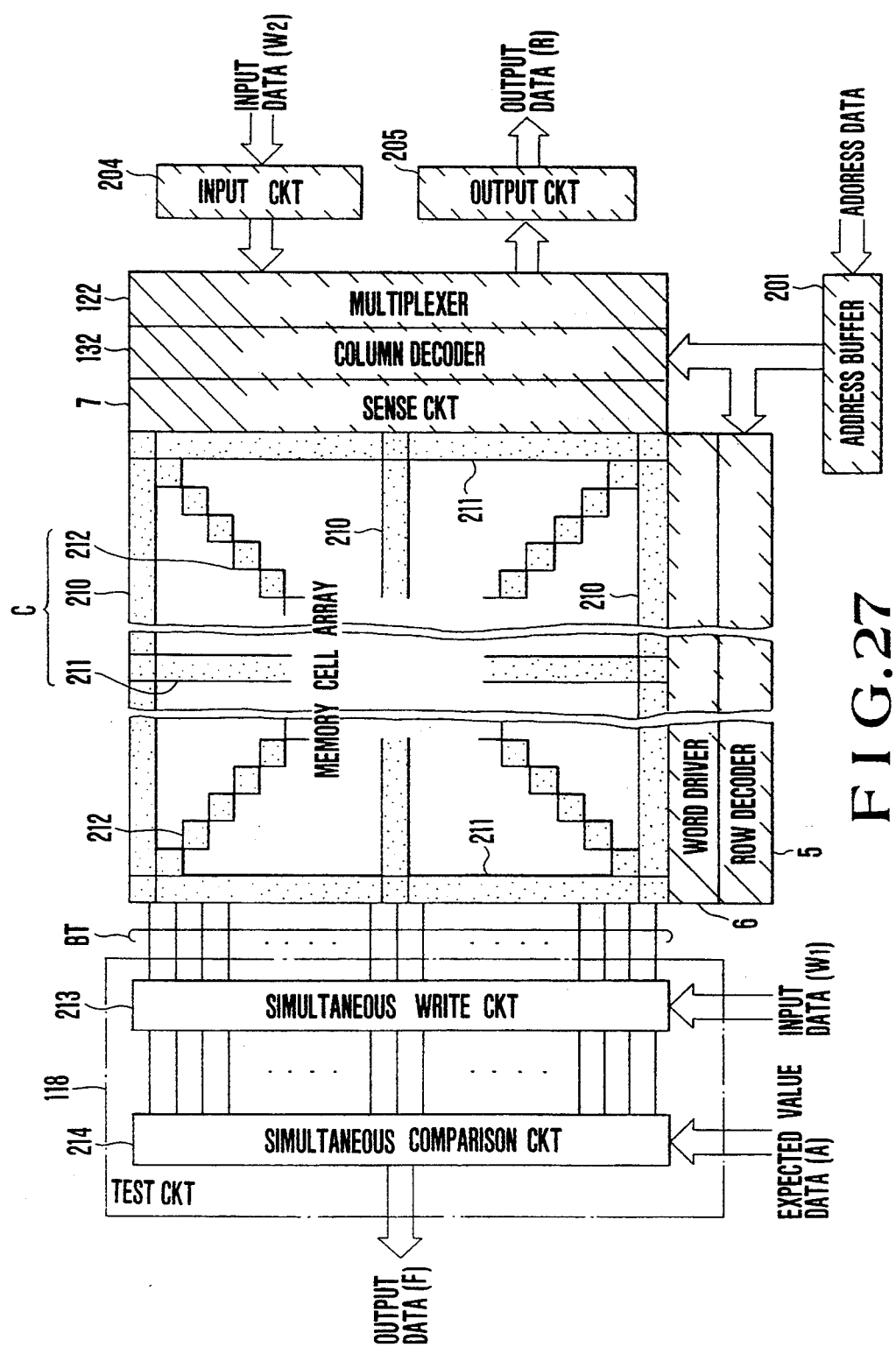

FIG. 27 shows an arrangement of a semiconductor memory according to still another embodiment of the present invention. In FIG. 27, memory cell lines 210 indicated dots are connected to bit lines to which a plurality of memory cells serving as objects in a test of other peripheral circuits excluding memory cell arrays and a test circuit. Memory cell lines 211 are connected to word lines to which a plurality of memory cells serving as objects in a test of other peripheral circuits excluding memory cell arrays and a test circuit. Other reference numerals correspond to those in FIG. 24. Note that the number of memory cell lines indicated by 210 to 212 is not limited to eight illustrated in FIG. 27. At least one memory cell line 211 connected to word lines, and at least one memory cell line 210 connected to bit lines are required. The number of memory cell lines indicated by 210 to 212 can be arbitrarily set within a range satisfying the above conditions. Furthermore, the present invention is not limited to the illustrated arrangement of the memory cell lines 210 to 212. For example, at least one word line may be arranged adjacent to the memory cell line 211. The detailed circuit arrangements of a simultaneous write circuit 213 and a simultaneous comparison circuit 214 are described in the embodiment shown in FIG. 8.

Figure 28:
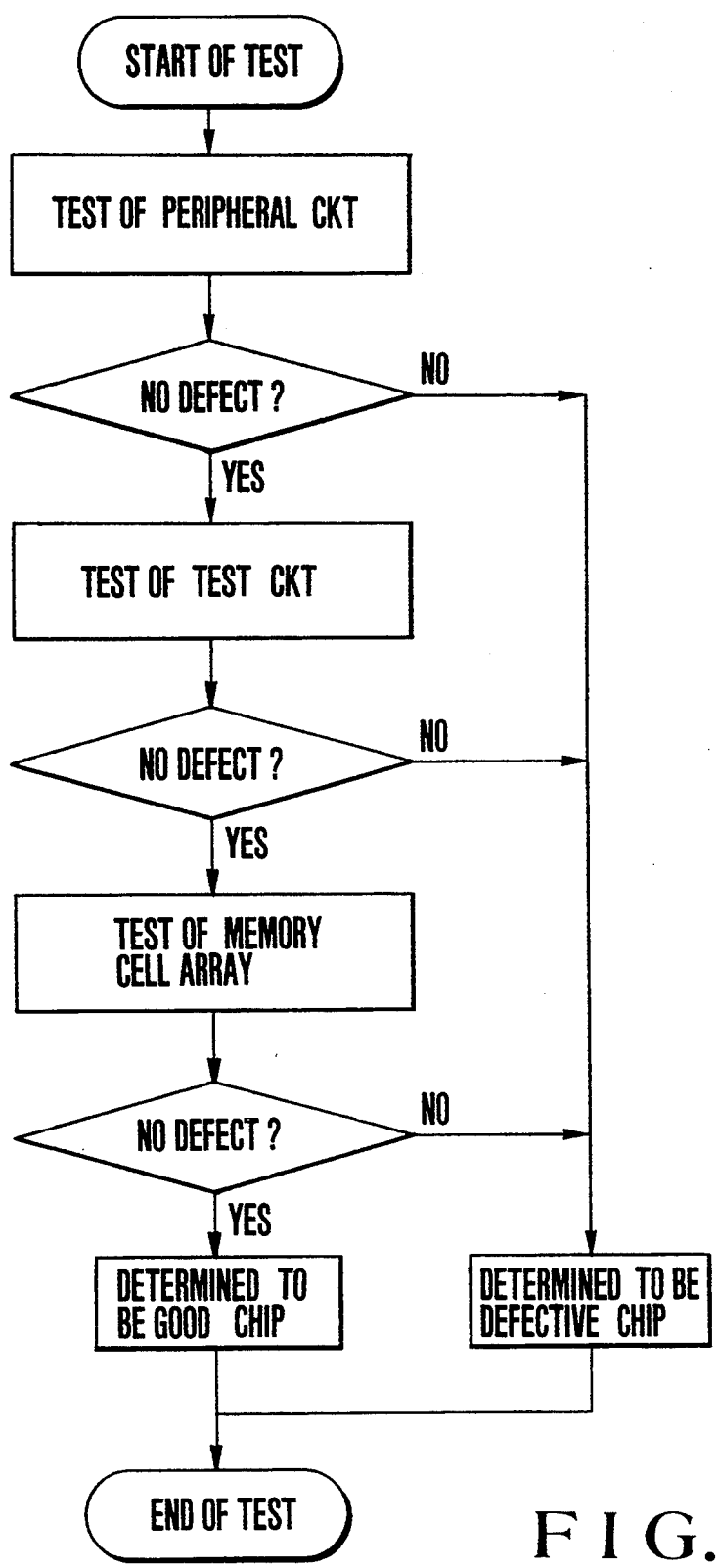
FIG. 28 is a flow chart showing a test method of the memory shown in FIG. 27 or 29.

FIG. 28 is a flow chart showing a test method of the circuit shown in FIG. 27, and Table 3 shows types of input/output data, portions to be subjected to comparison and defect detection, and the like.

TABLE 3

| Circuit to be Tested | Input Data | Output Data | Portion to be Subjected to Comparison | Portion to be Subjected to Defect Detection | Memory Cell to be Tested |
|---|---|---|---|---|---|
| Peripheral Circuit | Test Data $W_2$ | Read-out Data R | Outside Semiconductor Memory | Outside Semiconductor Memory | Memory Cells on Several Lines or more |
| Test Circuit | Test Data $W_1$ | Comparison Result F | Inside Semiconductor Memory | Outside Semiconductor Memory | Memory Cells on One Word Line |
| | Inverted Data $W_2$ of $W_1$ | Comparison Result F | Inside Semiconductor Memory | Outside Semiconductor Memory | |
| Memory Cell Array | Test Data $W_1$ | Comparison Result F | Inside Semiconductor Memory | Inside Semiconductor Memory | All Memory Cells |

In the tests of the semiconductor memory with the above arrangement, a test of peripheral circuits indicated by hatched portions is performed using the memory cell lines 210 to 212 as test objects indicated by dots in FIG. 27. In this case, the selection order of the memory cell arrays can be arbitrarily determined when the test is started. However, the memory cell lines 212 along the diagonal lines are preferably selected first in view of an improvement of a defect detection ratio using the entire peripheral circuits as the test objects in FIG. 27. In a detailed test method, first, input (test) data $W_2$ is written from the data input circuit 204, and read-out data R from the data output circuit 205 is transferred to a tester outside the semiconductor memory. Then, comparison with expected value and defect detection are performed by the tester. If a semiconductor memory is determined to be defective, it is excluded from a series of test flows. If a semiconductor memory is determined to be good, control advances to the test flow of the test circuit. In the test of the test circuit, input (test) data $W_1$ is written in all (or a plurality of) memory cells on one word line used as the object in the test of the peripheral circuits through the simultaneous write circuit 213. Thereafter, data from all the memory cells serving as objects are simultaneously compared with expected value data using the simultaneous comparison circuit 214. A comparison result F is transferred to the tester outside the semiconductor memory, and the level of the result F is detected by the tester. Then, $W_2$ as inverted data of the test data $W_1$ is written in one bit of each of all (or a plurality of) memory cells on the single word line. Thereafter, data from all the memory cells serving as objects are simultaneously compared with expected value data using the simultaneous comparison circuit 214. The comparison result F is transferred to the tester outside the semiconductor memory, and the level of the result F is detected by the tester. The memory cell position to which the inverted data $W_2$ is written is shifted on the word line, and the simultaneous comparison and detection operation are repeated. If a semiconductor memory is determined to be defective, it is excluded from a series of test flows. If a semiconductor memory is determined to be good, control advances to the test flow of the memory cell arrays. In the test of the memory cell arrays, the test is carried out using only the test circuit 118 without operating the data input circuit 204 and the data output circuit 205. First, input (test) data $W_1$ is written in all (or a plurality of) memory cells on one word line in the memory cell array 1 through the simultaneous write circuit 213. Thereafter, data from all the memory cells serving as objects are simultaneously compared with expected value data using the simultaneous comparison circuit 214. The comparison result F is transferred to the tester outside the semiconductor memory. In this case, when a defective memory cell is present on one word line, the comparison result F goes to "H" level. The tester detects the level of the comparison result F to discriminate the presence/absence of defects. All the memory cells are tested while sequentially shifting the position of the word line as the test object. In this manner, since the test of the test circuit can be performed independently of the test of the memory cell arrays, a decrease in defect detection ratio of the memory cells caused by a defective test circuit can be prevented. As the input (test) data, any test data of an N pattern, an $N^2$ pattern, and an $N^{3/2}$ pattern may be used. However, in a test in a mass production process for large-capacity semiconductor memories, the N pattern test data is mainly used in order to prevent an increase in test time. N pattern test data having different defect detection capabilities, e.g., "MSCAN" or "CHECKERBOARD" having a data length 4N and "MARCHING" having a data length 10N can be used at the same time, so that a test time can be greatly shortened while maintaining the defect detection capabilities as high as that in the conventional test method. A total test data length L according to this embodiment can be calculated as follows:

$$L = 24(N/r)^{\frac{1}{2}} + 30(N \times r)^{\frac{1}{2}} + 6 \qquad (1)$$

where N is the number of memory cells in a memory cell array, and r is (the number of word lines)/(the number of bit line pairs).

However, equation (1) is established under the following assumptions (i) and (ii).

(i) In the test of the peripheral circuits, a total of eight memory cell lines 210 to 212 shown in FIG. 27 are used. Among these lines, for one word line, "MARCHING" is used as test data in order to perform defect detection of a decoding function by using column address. For other seven arrays, "MSCAN" or "CHECKERBOARD" is used.

(ii) In the test of the memory cell arrays, since defect detection for a decoding function by using row address is also performed at the same time, test data "MARCHING" is used.

As can be seen from equation (1), the total test data length in this embodiment is proportional to $N^{\frac{1}{2}}$. On the other hand, the test data length according to the conventional test method is proportional to N/n (n: the number of memory cells which can be simultaneously tested). Therefore, both r and n are large. For example, even when large-capacity semiconductor memories having N=4 Mb (megabits) and 16 Mb are tested according to the test method of the present invention under more severe conditions than those of the conventional test method, e.g., r=8 and n=16, a test time in the test method of the present invention can be greatly reduced to 1/10 to 1/100.

In FIG. 27, the test data is externally input. However, in FIG. 29, the test data is stored in a ROM block 216 incorporated in a semiconductor memory, and is selected in accordance with external input data. The flow chart for the arrangement shown in FIG. 29 corresponds to that shown in FIG. 28. Table 4 shows types of input data, portions subjected to comparison and defect detection, and the like.

TABLE 4

| Circuit to be Tested | Input Data | Output Data | Portion to be Subjected to Comparison | Portion to be Subjected to Defect Detection | Memory Cell to be Tested |
|---|---|---|---|---|---|
| Peripheral Circuit | Test Data $W_2$ | Read-out Data R | Outside Semiconductor Memory | Outside Semiconductor Memory | Memory Cells on Several Lines or more |
| Test Circuit | Data in ROM Element | Comparison Result F | Inside Semiconductor Memory | Outside Semiconductor Memory | Memory Cells on One Word Line |
|  | Inverted Data $W_2$ of ROM Element | Comparison Result F | Inside Semiconductor Memory | Outside Semiconductor Memory |  |
| Memory Cell Array | Data in ROM Element | Comparison Result F | Inside Semiconductor Memory | Inside Semiconductor Memory | All Memory Cells |

Figure 29:
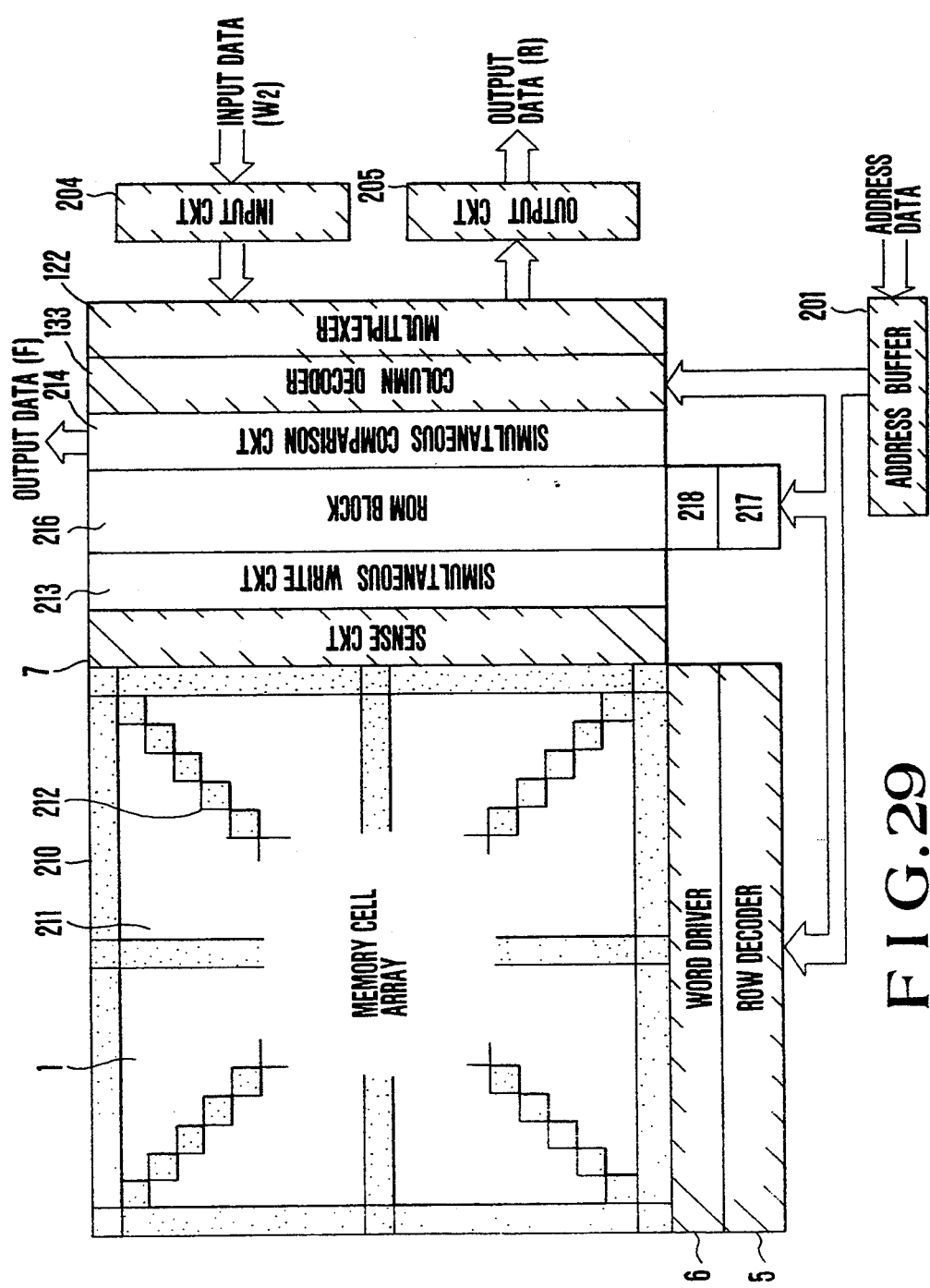

First, a test of peripheral circuits indicated by hatched portions is carried out using memory cell lines of 210 to 212 as test objects indicated by dots in FIG. 29. In this case, the selection order of the memory cell lines can be arbitrarily determined when the test is started. However, the memory cell lines 212 along the diagonal lines are preferably selected first in view of an improvement of a defect detection ratio using the entire peripheral circuits as the test objects. In a detailed test method, first, input (test) data $W_2$ is written from the data input circuit 204, and readout data R from the data output circuit 205 is transferred to a tester outside the semiconductor memory. Then, comparison with expected value and defect detection are performed by the tester. If a semiconductor memory is determined to be defective, it is excluded from a series of test flows. If a semiconductor memory is determined to be good, control advances to the test flow of the test circuit. In the test of the test circuit, two ROM element word lines connected to ROM elements in which two types of test data corresponding to all "0" or all "1" are used as selection objects. First, stack data in a plurality of ROM elements as the selection objects are written in all or a plurality of memory cells connected to one word line used as the object in the test of the peripheral circuits through the simultaneous write circuit 213. Thereafter, simultaneous comparison between the readout data from all the memory cells as the objects and the stack data of the ROM elements is performed using the simultaneous comparison circuit 214, and a comparison result F is transferred to the tester outside the semiconductor memory. Then, the tester detects the level of the comparison result F.

Thereafter, $W_2$ as inverted data of the stack data of the ROM elements is written in one bit of each of all or a plurality of memory cells on this word line from the data input circuit 204. Thereafter, simultaneous comparison with the stack data of the ROM elements as the objects is performed using the simultaneous comparison circuit 214. A comparison result F is transferred to the tester outside the semiconductor memory, and the level of the result F is detected thereby. The simultaneous comparison and the detection operation are repeated while sequentially shifting the position of the memory cell to which the inverted data $W_2$ is written. If a semiconductor memory is determined to be defective, it is excluded from a series of test flows. If a semiconductor memory is determined to be good, control advances to the test flow of the memory cell arrays. In the test of the memory cell arrays, stack data of all or a plurality of ROM elements connected to the ROM element word lines (not shown) in a ROM block 216 are written in all the memory cells on this word line in the memory cell array 1 through the simultaneous write circuit 213. Thereafter, the readout data from all (or a plurality of) memory cells on the word line are simultaneously compared with the stack data of all (or a plurality of) ROM elements connected to the ROM element word lines. Then, a comparison result F is transferred to the tester outside the semiconductor memory. If the memory cells on the word line of interest include a defective cell, the comparison result F goes to "H" level. The tester detects the level of the comparison result F to determine the presence/absence of defects. All the memory cells are tested while sequentially shifting the position of the word line as the test object. According to the test method of this embodiment, the test time can also be shortened in the same manner as in the test method of a semiconductor memory shown in FIG. 29.

The present invention is not limited to the illustrated memory cell array arrangement in the semiconductor memory. For example, the present invention can be applied to an arrangement in which a memory cell array is divided into a plurality of blocks. The present invention is not limited to the number and arrangement of ROM blocks described in the above embodiment. Furthermore, the present invention is not limited to a DRAM as a semiconductor memory, but can be similarly applied to a static RAM, a ROM, and the like.

According to the embodiments shown in FIGS. 24 to 29 as described above, the circuit as a test object is divided into a plurality of blocks, a test order is determined, and a test after a defect is detected is inhibited. Therefore, a test time will not be wasted. In addition, since simultaneous write and read operations are performed for a plurality of memory cells connected to a word line, a test time can be greatly shortened. Therefore, economy can be achieved, and hence, the method of the present invention is suitable for mass production.

Figure 30:
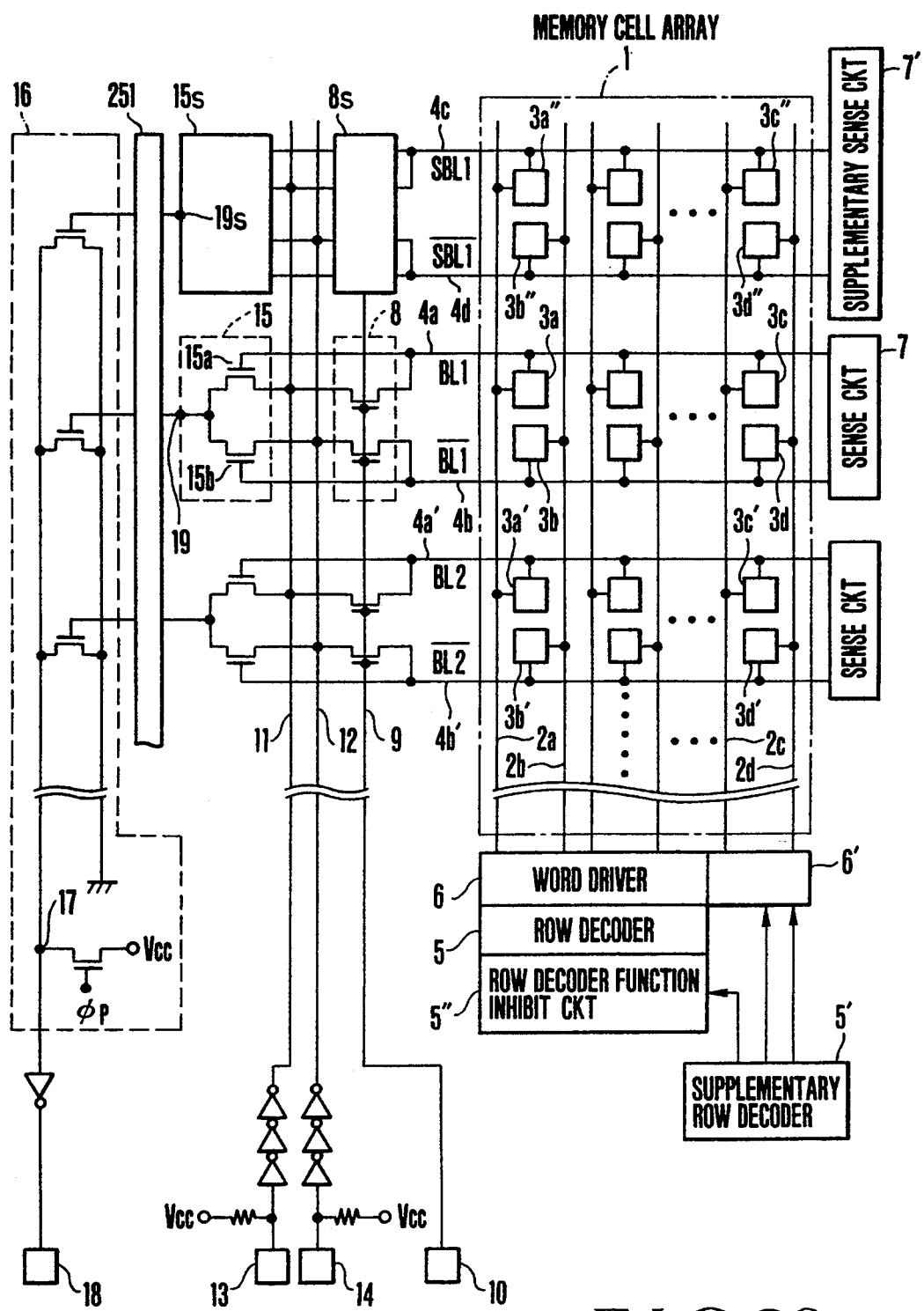
FIG. 30 is a circuit diagram showing still another embodiment of the present invention.

FIG. 30 is a circuit diagram showing still another embodiment of the present invention, and the same reference numerals in FIG. 30 denote the same parts as in FIG. 1. In this embodiment, a difference from FIG. 1 is that a redundancy circuit is arranged. As the redundancy circuit, a circuit arrangement which can perform row and column defect remedy which commonly use supplementary word and bit lines is employed. Note that since a control circuit associated with a column redundancy can be the same as that for a row redundancy, it is omitted from FIG. 30.

In FIG. 30, reference numerals 2c and 2d denote supplementary word lines; and 3a", 3b", 3c, 3d, 3c', 3d', 3c", and 3d", supplementary memory cells, which constitute a memory cell array 1 in the same manner as main memory cells and are also simply represented by two cells. Reference numerals 4a, 4b, 4a' and 4b' denote bit lines, which are also simply represented by two pairs. Reference numerals 4c and 4d denote supplementary bit lines, which constitute a bit line pair by SBL1 and $\overline{SBL1}$. Reference numeral 5' denotes a supplementary row decoder; 5" a row decoder function inhibit circuit; 6', a supplementary word driver; 7', a supplementary sense circuit; 8s, a test data write control gate corresponding to the supplementary bit line pair; 15s a comparator corresponding to the supplementary bit line pair; 251, a switching control circuit as a switching control means for electrically switching a NOR circuit 16 (to be described later) and the comparators 15 or 15s; 16, the NOR circuit for detecting a coincidence with the readout data from the memory cells connected to the word lines based on the output data from a plurality of comparators 15 or the comparator 15s; and 19s, an output node of the comparator 15s.

With the above arrangement, the test data write control gates 8 and 8s, the test data write control line 9, the test data write control terminal 10, the test data write control lines 11 and 12, the test data write terminals 13 and 14, and the like constitute a simultaneous write means. The test data write control line 9, the test data write control terminal 10, the test data write lines 11 and 12, the test data write terminals 13 and 14, the comparators 15 and 15s, the switching control circuit 251, the NOR gate 16, the output terminal 18, and the like constitute a simultaneous comparison circuit.

The test data write control terminal 10 is set at "H" level in only the test data write mode; otherwise, it is set at "L" level. The test data write terminals 13 and 14 are set at "H" or "L" level in only the test mode; otherwise, they are set in an open state. In FIG. 30, supply of a power supply voltage Vcc through a resistor is to set the test data write lines 11 and 12 at "L" level in the open state. The output terminal 18 for the simultaneous comparison output goes to "L" level during a precharge period and when the simultaneous comparison result represents that all the bits are good, and goes to "H" level when the comparison result represents defect bits. Note that $\phi_P$ in the NOR circuit 16 is a precharge clock signal. Normal data input and output terminals may be commonly used for the terminals 13, 14, and 18. The terminal 10 may be omitted if a test data write control signal is generated inside the chip.

An example of a test according to this embodiment will be described with reference to the timing charts shown in FIGS. 2(a) to 2(f). First, a simultaneous write operation of test data for the memory cells connected to word lines when the redundancy circuit is not used is performed as follows. The precharge clock signal $\phi_P$ shown in FIG. 2(a) is set at "L" level to operate the row decoder 5, thereby selecting a word line 2a. A word line drive clock signal shown in FIG. 2(b) is set at "H" level to operate the word driver 6, thus setting the selected word line 2a at "H" level. After data from all the main and supplementary memory cells connected to the word line 2a appear on the bit lines and the supplementary bit lines, a sense circuit drive clock signal shown in FIG. 2(c) is set at "H" level to operate the sense circuit 7 and the supplementary sense circuit 7'. After the voltage levels of the bit lines and the supplementary bit lines are determined upon operation of these sense circuits, an "H"- or "L"-level voltage corresponding to the test data is applied to the test data write terminals 13 and 14, as shown in FIG. 2(d). As shown in FIG. 2(e), the test data write control terminal 10 is set at "H" level, so that voltage levels corresponding to the test data are transmitted onto the bit lines and the supplementary bit lines. At this time, the word line 2a is held at "H" level, and the simultaneous write operation of the test data for the memory cells connected to word lines is performed. Then, the test data write control terminal 10 is set at "L" level, and the test data write terminals 13 and 14 are set at "H" level. Thereafter, the word line drive clock signal and the sense circuit drive clock signal are sequentially set at "L" level at the same timings as in the normal memory operation, thus ending a series of write operations. After the operation is completed, since the terminals 13 and 14 are set at "H" level, the output terminal 18 is kept at "L" level.

In this manner, "H"- and "L"-level voltages applied to the test data write terminals 13 and 14 are sequentially alternated while sequentially selecting the word lines 2a and 2b, thereby simultaneously writing test data "MSCAN". More specifically, in FIG. 30, "H"- or "L"-level data is written in the memory cells 3a, 3b, 3a', 3b', 3a'', and 3b''. In addition, "H"- and "L"-level voltages applied to the test data write terminals 13 and 14 are alternated every two other word lines while sequentially selecting the word lines 2a and 2b, thereby simultaneously writing test data "CHECKERBOARD". More specifically, in FIG. 30, "H"- or "L"-level data can be written in the memory cells 3a, 3a', and 3a'', and "L"- or "H"-level data can be written in the memory cells 3b, 3b', and 3b''. In order to further facilitate the simultaneous write operation, when an "H"-level voltage is applied to the test data write control terminal 10, the sense circuit drive clock signal may be temporarily set at "L" level to cancel latching of the sense circuit 7 and the supplementary sense circuit 7'. When the voltage levels of the bit lines and the supplementary bit lines are satisfactorily determined by a voltage applied from the test data write control terminal 10, the sense circuit 7 and the supplementary sense circuit 7' need not always be operated.

A simultaneous comparison sequence for the memory cells connected to word lines will be described below. During a precharge period, the precharge clock signal $\phi_P$ is set at "H" level and precharges the output node 17 for the simultaneous comparison result at "H" level. Thereafter, the same operation as in the above write operation is performed until timings at which the sense circuit 7 and the supplementary sense circuit 7' are operated. After the voltage levels of the bit lines and the supplementary bit lines are determined, the voltage level opposite to that of the test data in the write operation is applied to the test data write terminals 13 and 14. In this case, the test data write control terminal 10 is held at "L" level. As a result, when the voltage level of the test data applied to the test data write terminals 13 and 14 during the comparison operation coincides with the voltage level read out from the main memory cells and appearing on the bit lines, i.e., when the data read out from the main memory cells are erroneous data, the output node 19 of the comparison circuit 15 goes to "H" level and causes the output node 17 of the NOR circuit 16 to be changed from "H" level to "L" level. When the column redundancy circuit is not used, the switching control circuit 251 shown in FIG. 30 causes the comparator 15s to be electrically disconnected from the NOR circuit 16. Therefore, the supplementary memory cells 3a'' and 3b'' on the supplementary bit lines 4c and 4d do not serve as objects for the simultaneous comparison operation. Therefore, upon observation of a change from "L" level to "H" level of the output terminal 18, it can be detected that any of the main memory cells connected to the selected word line includes a defective bit. This state is shown in FIG. 2(f). In FIG. 2(f), "H" level indicated by a solid line shows a case wherein a defective bit is present, and "L" level indicated by a dotted line shows a case wherein all the bits are good or the write operation is being performed. Note that the level of the test data write control terminal 10 shown in FIG. 2(e) corresponds to "L" level during comparison as indicated by the dotted line.

An operation when the voltage level of the test data coincides with readout data from the main memory cells will be described below. A case will be described wherein "H" level test data is written in the main memory cell 3a while setting the test data write terminal 13 at "L" level in the simultaneous write operation. In this case, during the simultaneous comparison, an "H"-level voltage is applied to the test data write terminal 13, and an "L"-level voltage is applied to the test data write terminal 14, so that they are compared with data read out from the main memory cell 3a. During the simultaneous comparison, if the data read out from the main memory cell erroneously has "L" level, the bit line BL1, i.e., the gate of the transistor 15a of the comparator 15 goes to "L" level, and the transistor 15a is turned off. In this case, the bit lines $\overline{BL1}$ goes to "H" level upon operation of the dummy cell and the sense circuit 7, and the gate of the transistor 15b of the comparator 15 goes to "H" level. As a result, the transistor 15b is turned on. Then, the "H" level data input from the test data write terminal 14 to the comparator 15 appears at the output node 19 and causes the output node 17 of the NOR circuit 16 to be changed from "H" level to "L" level. In this case, the switching control circuit 251 causes the comparator 15 to be electrically connected to the NOR circuit 16 and causes the comparator 15s to be electrically disconnected from the NOR circuit 16. Note that in the above operation, the test data write terminals 13 and 14 are respectively set at "L" and "H" levels during the test operation. If the test data write terminals 13 and 14 are respectively set at "H" and "L" levels during the test, the same operation as described above is performed.

In the above-mentioned simultaneous write and comparison method, the test data "MSCAN" and "CHECKERBOARD" have been exemplified. However, a test using "MARCHING" can also be performed. This test can be realized as follows. More specifically, write access of background data with respect to all the memory cells and subsequent simultaneous comparison of readout data are performed in the same manner as in the test using "MSCAN". Thereafter, the same simultaneous write and comparison sequences as in the test using "MSCAN" are performed while inverting the voltage levels applied to the test data write terminals 13 and 14. However, in the present invention, since data of the same level is simultaneously written in all or a plurality of main memory cells and supplementary memory cells connected to a word line, defect detection of a decoding function by using column address which can be performed by a conventional method cannot be performed. Therefore, for defect detection of the decoding function by using column address, a test using "MARCHING" is independently executed for all the main memory cells and supplementary memory cells connected to one or a plurality of word lines in the memory cell array 1.

A case will be described wherein all the main memory cells in the memory cell array 1 are tested, and a word line or a bit line including a defective memory cell is substituted with a supplementary word line or a supplementary bit line. In a test of a redundancy semiconductor memory, after substitution with the supplementary lines, a re-test must be performed to check if a defective bit is selected. During the re-test, the test method in the embodiment shown in FIG. 30 can be employed.

First, when the row redundancy circuit is used, e.g., when the supplementary word line 2c is selected, test data is simultaneously written for the memory cells connected to word lines as follows. In the redundancy semiconductor memory, during defect remedy, address data for selecting a word line including a defective bit is stored in a storage element in the supplementary row decoder 5' so as to substitute it with address data of a supplementary word line. For example, if the main memory cell connected to the word line 2a includes a defective bit, the supplementary word line 2c serves as an object to be substituted. The precharge clock signal $\phi_P$ shown in FIG. 2(a) is set at "L" level to operate the supplementary row decoder 5'. When the stored address data coincides with input new row address data, the supplementary row decoder 5' causes the row decoder function inhibit circuit 5" to be operated, thereby disabling the row decoder 5 and selecting the supplementary word line 2c as an object to be substituted. Then, the word line drive clock signal shown in FIG. 2(b) is set at "H" level to operate the supplementary word driver 6', thereby setting the supplementary word line 2c at "H" level. In this case, since the row decoder 5 is not operated, the word line 2a is held at "L" level. After data from supplementary memory cells connected to the supplementary word line 2c appear on the supplementary bit lines, the sense circuit drive clock signal shown in FIG. 2(c) is set at "H" level to operate the sense circuit 7 and the supplementary sense circuit 7'. After the voltage levels of the supplementary bit lines are determined upon operation of these sense circuits, an "H"- or "L"-level voltage according to test data is applied to the test data write terminals 13 and 14, as shown in FIG. 2(d). As shown in FIG. 2(e), an "H"-level voltage is applied to the test data write control terminal 10, so that the voltage level corresponding to the test data is transmitted onto the bit lines and the supplementary bit lines. At this time, the supplementary word line 2c is held at "H" level, and the simultaneous write operation of the test data is performed for the memory cells connected to word lines. Then, the test data write control terminal 10 is set at "L" level, and the test data write terminals 13 and 14 are set at "H" level. Thereafter, the word line drive clock signal and the sense circuit drive clock signal are sequentially set at "L" level at the same timings as in the normal memory operation, thus ending a series of write operations.

A sequential comparison sequence for the memory cells connected to word lines when the row redundancy circuit is used, e.g., when the supplementary word line 2c is selected will be described below. The same operation as in the above write operation is performed until a timing at which the sense circuit 7 and the supplementary sense circuit 7' shown in FIG. 30 are operated. After the voltage levels of the bit lines and the supplementary bit lines are determined, the voltage level opposite to that of the test data during the write operation is applied to the test data write terminals 13 and 14. In this case, the test data write control terminal 10 is kept at "L" level. As a result, when the voltage level of the test data applied to the test data write terminals 13 and 14 during the comparison operation coincides with the voltage level read out from the supplementary memory cells and appearing on the bit lines and supplementary bit lines, i.e., when data read out from the supplementary memory cells are erroneous data, the output node 19 of the comparator 15 goes to "H" level and causes the output node 17 of the NOR circuit 16 to be changed from "H" level to "L" level. When only the row redundancy circuit is used, the switching control circuit 251 shown in FIG. 30 electrically disconnects the comparator 15s from the NOR circuit 16. Therefore, the supplementary memory cell 3c" connected to the supplementary word line 2c does not serve as an object of the simultaneous comparison. As a result, upon observation of a change from "L" level to "H" level of the output terminal 18 for the simultaneous comparison result, it can be detected that the supplementary memory cells connected to the supplementary word line 2c include a defective bit. This state is shown in FIG. 2(f). In FIG. 2(f), "H" level indicated by the solid line indicates a case wherein a defective bit is present, and "L" level indicated by the dotted line indicates a case wherein all the bits are good or the write operation is being performed. Note that the type of test data to be used, the circuit arrangement, and various modifications associated with the circuit operation, and the like comply with those of the embodiments using no redundancy circuit.

A simultaneous write and comparison operation of test data for the memory cells connected to word lines when the column redundancy circuit is used will now be described. The defect remedy for substituting the bit lines including a defective memory cell with the supplementary bit lines is performed in the same manner as the row defect remedy. In the test circuit shown in FIG. 30, the switching control circuit 251 has functions of electrically disconnecting the comparator 15 from the NOR circuit 16, and of electrically connecting the comparator 15s connected to the supplementary bit lines to be substituted and the NOR circuit 16. More specifically, a case will be described wherein defective bits are present on the bit lines 4a and 4b, the bit lines 4a and 4b are substituted with the supplementary line lines 4c and 4d, and the word line 2a is selected. First, the simultaneous write operation of test data for the memory cells connected to word lines are the same as in the circuit operation when no redundancy circuit is used. In the simultaneous comparison operation of test data for the memory cells connected to word lines, the same operation as in the write operation is performed until a timing at which the sense circuit 7 and the supplementary sense circuit 7' are operated. After the voltage levels of the bit lines and the supplementary bit lines are determined, the voltage level opposite to that of the test data during the write operation is applied to the test data write terminals 13 and 14. In this case, the test data write control terminal 10 is kept at "L" level. As a result, when the voltage level of the test data applied to the test data write terminals 13 and 14 during the comparison operation coincides with the voltage level read out from the supplementary memory cells and appearing on the supplementary bit lines, i.e., when the data read out from the supplementary memory cells are erroneous data, the output node 19s of the comparator 15s goes to "H" level, and causes the output node 17 of the NOR circuit 16 to be changed from "H" level during the precharge period to "L" level. Therefore, upon observation of a change from "L" level to "H" level of the output terminal 18 for the comparison result, it can be detected that the supplementary memory cells connected to the word line 2a include a defective bit. Note that the switching control circuit 251 shown in FIG. 30 electrically disconnects the comparator 15 connected to the bit lines 4a and 4b from the NOR circuit 16. Therefore, the data from the defective bits on the bit lines 4a and 4b do not serve as objects for the simultaneous comparison. Note that the type of test data to be used, the circuit arrangement, and various modifications associated with the circuit operation, and the like comply with those of the embodiments using no redundancy circuit. When both the row and column redundancy circuits are used, an operation therefor corresponds to a case wherein the tests during use of the row and column redundancy circuits alone are combined, and the test method therefor can be similarly explained.

According to the test method of the embodiment shown in FIG. 30 described above, since simultaneous write and comparison operations can be performed for the memory cells connected to word lines, a test time can be shortened to 1/n that of a conventional redundancy semiconductor memory. In this case, n is the number of memory cells connected to the word lines and supplementary word lines and subjected to simultaneous write and comparison operations, and normally takes a large value, e.g., 500 or 1000 or more.

Figure 32:
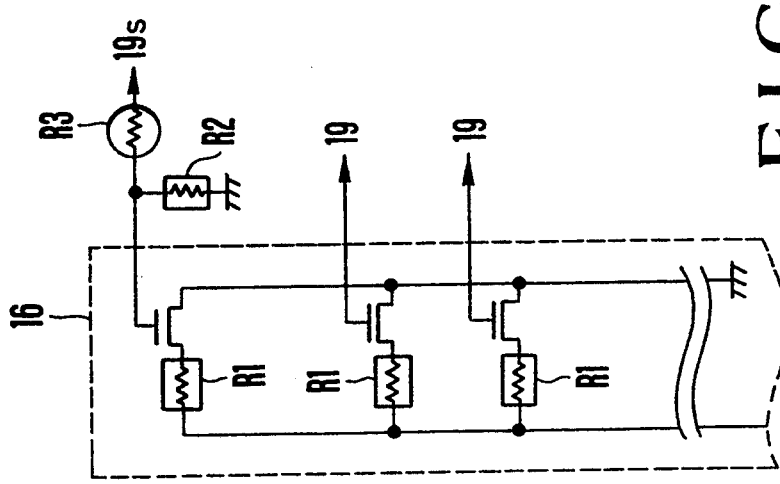
FIG. 32 is a circuit diagram showing a modification of a NOR circuit in FIG. 30.
Figure 31:
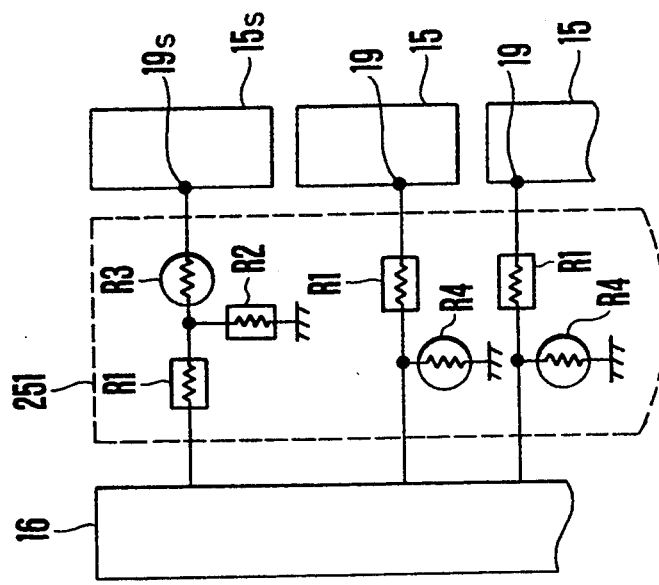
FIG. 31 is a circuit diagram showing a switching control circuit in FIG. 30.

FIG. 31 shows an arrangement of the switching control circuit 251 shown in FIG. 30. In FIG. 31, elements R1 to R4 surrounded by squares and circles and expressed as resistors serve as storage elements. The elements R1 and R2 normally have a low resistance, and the elements R3 and R4 have an almost infinite high resistance. With these elements, the electrical disconnection and connection between the comparators and the NOR circuit are performed. These elements are formed of, e.g., polysilicon, and are changed to have opposing electrical characteristics (e.g., high and low resistances) by a means such as laser radiation. In other words, the high-resistance element is changed to have a low resistance, and the low-resistance element is changed to have a high resistance. When the column redundancy circuit is used, the elements R1 and R4 connected to the output node 19 of the comparator 15 associated with a defective bit are respectively set to have an almost infinite high resistance and a low resistance. The elements R1 and R3 connected to the output node 19s of the comparator 15s associated with the supplementary bit line pair to be substituted are set to have a low resistance, and the element R2 is set to have an almost infinite high resistance. A plurality of elements R1 and R4 connected to the output node 19 of another comparator 15 which is not associated with defective bits respectively have a low resistance and an almost infinite high resistance. As a result of the re-test, if a defective bit is also detected from the substituted supplementary bit line pair, the resistance of the element R1 is changed from the low resistance to an almost infinite high resistance. Upon resetting of the element R1, the output node 19s connected to the NOR circuit 16 is fixed at "L" level. When the row redundancy circuit is used alone or no redundancy circuit is used, the elements R1 and R2 are set to have a low resistance, and the elements R3 and R4 are set to have an almost infinite high resistance. As a result, the comparison circuit 15s can be set at "L" level through the elements R1 and R2 in a path connected to the NOR circuit 16, and the NOR circuit 16 can be prevented from being operated in response to the comparison output from the comparator 15s. Note that the electrical characteristics and the setting method of the resistances are not limited to those described above. An arrangement in which the element R1 associated with the comparator 15s in FIG. 30 is omitted also belongs to the scope of the present invention. Alternatively, as shown in FIG. 32, the element R1 may be incorporated in the NOR circuit 16 instead of the switching control circuit 251. In this case, the element R4 can be omitted.

Figure 33:
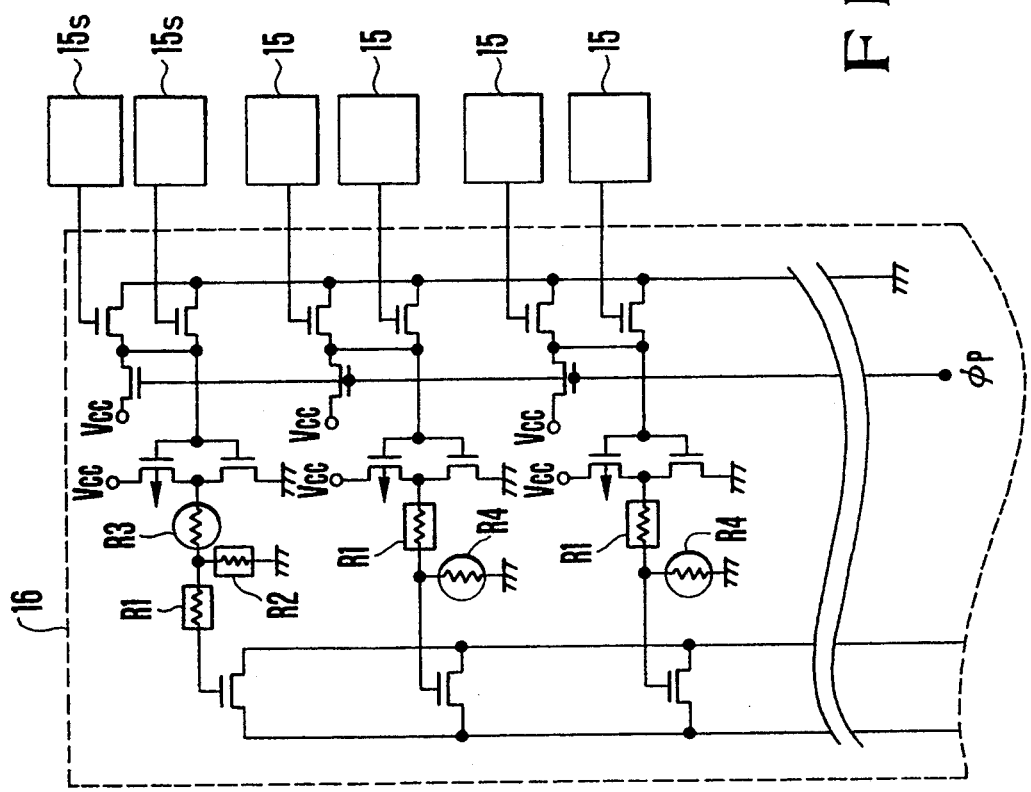
FIG. 33 is a circuit diagram showing another modification of the NOR circuit shown in FIG. 30.

FIG. 33 shows another modification in which the elements shown in FIG. 31 are incorporated in the NOR circuit 16. When a bit line pitch is decreased upon an increase in capacity of a redundancy semiconductor memory, it is difficult to arrangement elements in the switching control circuits in a small bit line pitch. In the arrangement in FIG. 33, the pitch of elements such as R1 is increased twice that in the arrangements of FIGS. 31 and 32. As the characteristic feature of this arrangement, the NOR circuit 16 has a multi-state structure, and elements are arranged between NOR circuits. In order to coincide input-state levels of the respective NOR circuits, CMOS inverters are inserted between the NOR circuits. In the arrangement shown in FIG. 33, when the column redundancy circuit is used, two comparators serve as a unit of substitution. When the number of inputs to the NOR gates in FIG. 33 is increased, the element pitch can be further increased. Note that an arrangement in which the element R1 in FIG. 33 is arranged as shown in FIG. 32 also belongs to the scope of the present invention.

The connecting relationship between the comparator 15 and the bit lines 4a and 4b or between the comparator 15s and the supplementary bit lines 4c and 4d can be replaced with the arrangement shown in FIG. 7. When the arrangement in FIG. 7 is employed, an identical voltage level (not inverted data) to that of the test data during the test operation can be applied to the test data write terminals 13 and 14 during the simultaneous comparison for the memory cells connected to word lines. Therefore, desired test data can be applied regardless of the simultaneous write and comparison operations during a test. The test data write control gates 8 and 8s, the test data write control line 9, the test data write control terminal 10, the test data write lines 11 and 12, and the test data write terminals 13 and 14 shown in FIG. 30 are not limited to the illustrated arrangement. For example, in FIG. 30, two test data write control lines 9 and two test data write control terminals 10 may be employed so that two transistors in the test data write control gates 8 and 8s are separately controlled by the two control lines 9.

Figure 34:
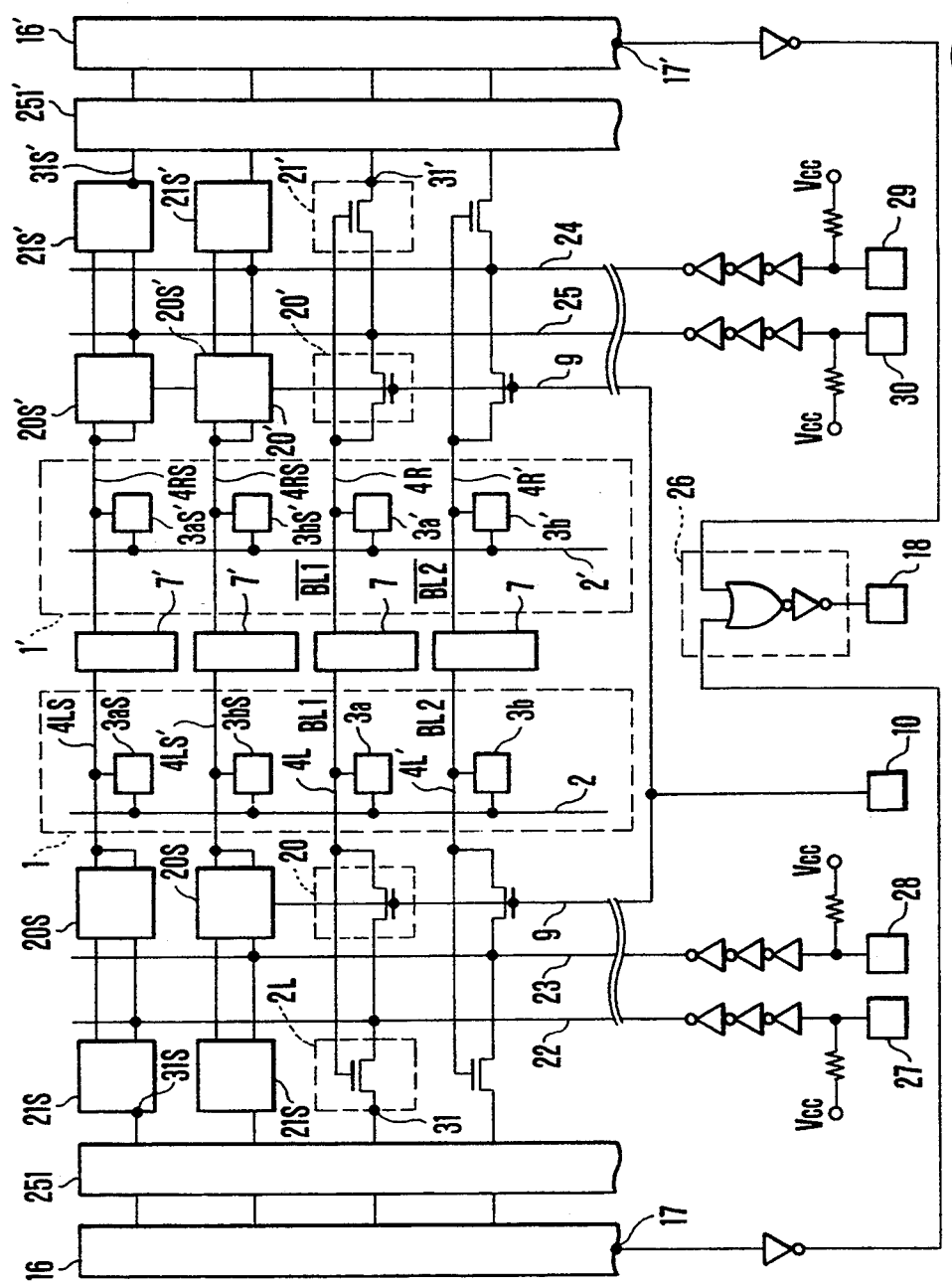
FIG. 34 is a circuit diagram showing still another embodiment of the present invention.

FIG. 34 is a circuit diagram showing still another embodiment of the present invention. The same reference numerals in FIG. 34 denote the same parts as in FIG. 3. In this case, the simultaneous write and comparison operations are performed in units of word lines for an open bit line arrangement in which bit lines and supplementary bit lines in different memory cell arrays sandwiching the sense circuits 7 and the supplementary sense circuits 7' therebetween form bit line pairs. In FIG. 34, reference numerals 3as, 3as', 3bs and 3bs' denote supplementary memory cells; and 4Ls, 4Ls', 4Rs, and 4Rs', supplementary bit lines. The bit lines 4Ls and 4Rs and the bit lines 4Ls' and 4Rs' respectively form bit line pairs. Reference numeral 251' denotes a switching control circuit associated with a memory cell array 1'; 17', an output node of a NOR circuit 16'; 20s and 20s', test data write control gates corresponding to the supplementary bit lines; 21s and 21s', comparators corresponding to the supplementary bit lines; and 31s and 31s', output nodes of the comparators 21s and 21s'. Test data write terminals 27, 28, 29, and 30 are set at "H" or "L" level only during a test; otherwise, are set in an open state. Note that the supplementary word lines 2c and 2d, the supplementary memory cells 3c to 3d", the row decoder 5, the supplementary row decoder 5', the row decoder function inhibit circuit 5" the word driver 6, and the supplementary word driver 6' are also necessary in this embodiment, but are omitted from FIG. 34.

The test in the embodiment shown in FIG. 34 is substantially the same as in the embodiment shown in FIG. 30 except that a control method for simultaneous write and comparison operations of test data is different therefrom. Therefore, a detailed description of a test sequence will be omitted. The simultaneous write operation of test data in the embodiment shown in FIG. 34 is performed as follows. The simultaneous write operation of data "CHECKERBOARD" can be achieved as follows. An "H"- or "L"-level voltage is applied to the test data write terminals 27 and 29, and an "L"- or "H"-level voltage is applied to the test data write terminals 28 and 30. Then, these "H"- and "L"-level voltages are sequentially alternated while sequentially selecting the word lines. The simultaneous write operation of data "MSCAN" can be achieved as follows. That is, an "H"- or "L"-level voltage is applied to the test data write terminals 27 and 28, and an "L"- or "H"-level voltage is applied to the test data write terminals 29 and 30. Then, the word lines are sequentially selected while fixing the voltage levels applied to these terminals. A test using "MARCHING" can be achieved as follows. The simultaneous write operation of background data with respect to all the memory cells is performed in the same manner as in the test using "MSCAN", and the simultaneous write operation of inverted data to the adjacent memory cells on a word line is performed in the same manner as in the test using "CHECKERBOARD".

The simultaneous comparison of these test data is performed such that the voltage levels opposite to the above levels are applied to the respective terminals, and are compared with the voltage levels appearing on the bit lines and the supplementary bit lines by the normal readout operation. In addition, a difference from the embodiment shown in FIG. 30 is that defective bit detection is performed an OR result of output data from the NOR circuits 16 and 16'. The output terminal 18 for the simultaneous comparison result is set at "L" level during a precharge period and when the simultaneous comparison result represents that all the bits are good. The output terminal is set at "H" level when the comparison result represents that a defective bit is obtained. Canceling of latching of the sense circuit 7 and the supplementary sense circuit 7' described in the embodiment in FIG. 30 can also be applied to this embodiment. The switching control circuits 251 and 251' and the NOR circuits 16 and 16' may employ the arrangements shown in FIGS. 31 to 33. When the column redundancy circuit is used in the embodiment shown in FIG. 34, the bit lines 4L and 4R are substituted with the supplementary bit lines 4Ls and 4Rs, and the bit lines 4L' and 4R' are substituted with the supplementary bit lines 4Ls' and 4Rs'. According to the test method of the embodiment shown in FIG. 34, a test time can be shortened in the same manner as in the embodiment shown in FIG. 30.

Figure 35:
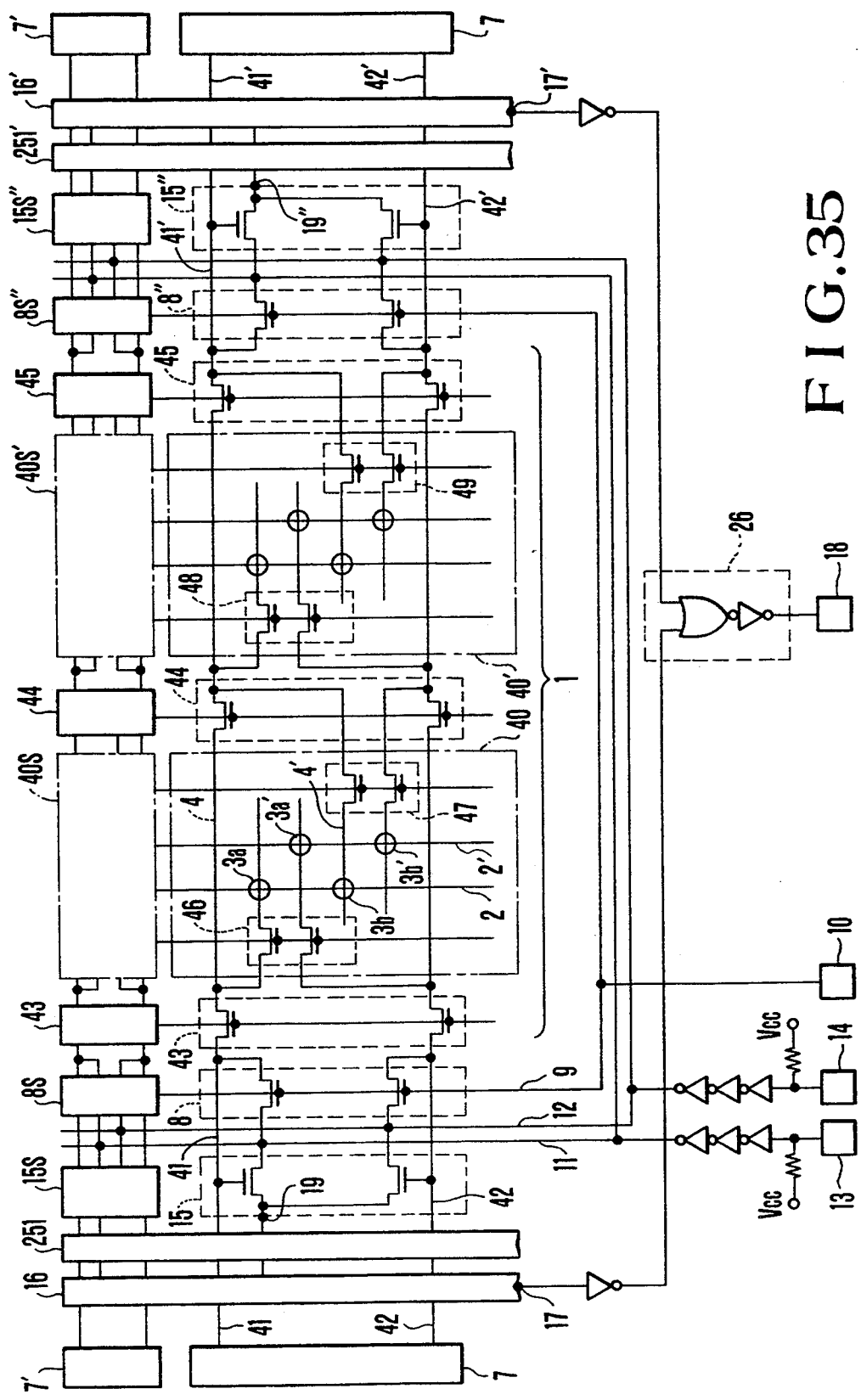
FIG. 35 is a circuit diagram showing still another embodiment of the present invention.

FIG. 35 is a circuit diagram showing still another embodiment of the present invention, and corresponds to the arrangement shown in FIG. 5.

The characteristic feature of this memory cell array is substantially the same as that shown in FIG. 5, excluding the following points.

That is, main bit lines and supplementary main bit lines which are not connected to memory cells and formed by wiring layers different from those of bit lines and supplementary bit lines are provided, and these bit lines and main bit lines are electrically connected to each other.

FIG. 35 shows a folded bit lines arrangement corresponding to a main bit line pair, in which the memory cell array 1 is divided into two subarrays 40 and 40' and two supplementary subarrays 40s and 40s'. The sense circuit 7 and the supplementary sense circuit 7' are arranged on both sides of the memory cell array 1, so that a sense circuit pitch can be increased to four times a memory cell pitch. In FIG. 35, reference numeral 8" denotes a test data write control gate corresponding to the bit line pair; 8s and 8s" test data write control gates corresponding to the supplementary bit line pair; 15", a comparator corresponding to the bit line pair; 15s and 15s", comparators corresponding to the supplementary bit line pair; 19", an output node of the comparator 15"; 41, 41', 42 and 42', main bit lines; 43, 44, and 45, switches associated with the main bit lines and supplementary main bit lines; and 46, 47, 48, and 49, switches for connecting the bit lines and the main bit lines. The same reference numerals in FIG. 35 denote the same parts as in FIGS. 30 and 34. The supplementary word lines 2c and 2d, the supplementary memory cells 3c to 3d", the row decoder 5, the supplementary row decoder 5', the row decoder function inhibit circuit 5", the word driver 6, and the supplementary word driver 6' are necessary in this embodiment, but are omitted from FIG. 35.

As a normal memory operation of the arrangement shown in FIG. 35, a read operation upon selection of a word line 2 will be explained. Only the switches 43 and 45 to 47 are turned on at the same timing as the selection timing of the word line 2. As a result, data from a memory cell 3a is supplied to the left sense circuit 7 via the switches 46 and 43 and is amplified thereby. Data from a memory cell 3b is supplied to the right sense circuit 7 through the switches 47 and 45, and is amplified thereby. Thereafter, a multiplexer and a data output circuit (neither are shown) are operated, and only memory cell data of an object to be read out are read out.

An example of a test of the embodiment shown in FIG. 35 will be described with reference to a case wherein no redundancy circuit is used. As for a test when the redundancy circuit is used, the method described in the embodiment shown in FIG. 30 can be employed, and a description thereof will be omitted. A simultaneous write operation of test data for the memory cells connected to word lines will be described with reference to a case wherein the word line 2 shown in FIG. 35 is selected. Upon selection of the word line 2, the switches 43 and 45 to 47 are turned on. Data from the memory cells 3a and 3b appear on the main bit lines 41 and 41' respectively through the switches 46 and 43 and the switches 47 and 45. Thereafter, the right and left sense circuits 7 are operated. Since the switch 44 is kept off, the main bit lines 41 and 41' on which the data from the memory cells 3a and 3b appear are electrically disconnected. After the voltage levels of the main bit lines are determined upon operation of the sense circuits 7, an "H"- or "L"-level voltage corresponding to test data is applied to test data write terminals 13 and 14. Then, an "H"-level voltage is applied to a test data write control terminal 10, so that the voltage levels corresponding to the test data are transmitted onto bit lines 4 and 4' via a path consisting of a test data write control gate 8, the switches 43 and 46, and a path consisting of the test data write control gate 8" and the switches 45 and 47, respectively. At this time, since the word line 2 is held at "H" level, a simultaneous write operation of test data can be performed for the memory cells connected to word lines. Next, the test data write control terminal 10 is set at "L" level, and the test data write terminals 13 and 14 are set at "H" level. Thereafter, the word line is set in a nonselection state at the same timing as in the normal memory operation, thus ending a series of write operations. In this manner, the "H"- and "L"-level voltages applied to the test data write terminals 13 and 14 are sequentially alternated while sequentially selecting the word lines 2 and 2', thereby simultaneously writing the test data "MSCAN". More specifically, in FIG. 35, the "H"- or "L"-level data is written in all the main memory cells 3a, 3b, 3a', and 3b'. When the "H"- and "L"-level voltages applied to the test data write terminals 13 and 14 are alternated every two other word lines while sequentially selecting the word lines 2 and 2', test data "CHECKERBOARD" can be simultaneously written. More specifically, in FIG. 35, "H"- or "L"-level data can be written in the main memory cells 3a and 3b and "L"- or "H"-level data can be written in the main memory cells 3a' and 3b'. The simultaneous write operation of "MARCHING" in this embodiment is the same as that described in the embodiment shown in FIG. 30. A modification associated with the circuit operation such as canceling of latching of the sense circuit, connecting portions between the test data write control gates and the comparators, and other arrangements associated with the switching control circuit are the same as those in the embodiment in FIG. 30.

A simultaneous comparison sequence for the memory cells connected to word lines will be described below. During a precharge period, the output nodes 17 and 17' for simultaneous comparison results are precharged to be "H" level. Thereafter, the same operation as in the write operation described above is performed until a timing at which the sense circuits and the supplementary sense circuits are operated. After the voltage levels of the main bit lines and the supplementary bit lines are determined, the voltage levels opposite to those of test data during the write operation is applied to the test data write terminals 13 and 14. As a result, the voltage levels of the test data applied to the test data write terminals 13 and 14 during the comparison operation coincide with the voltage levels read out from the memory cells and supplementary memory cells and appearing on the main bit lines and supplementary main bit lines (when error is detected), the output nodes 19 and 19" of the comparators 15 and 15" go to "H" level, and respectively cause the output nodes 17 and 17' of the NOR circuits 16 and 16' to be changed from "H" level to "L" level. Therefore, upon observation of a change from "L" level to "H" level of the output terminal 18 for the simultaneous comparison result, it can be detected that all the main memory cells connected to the selected word line include a defective bit. If the redundancy circuit is not used, the switching control circuits 251 and 251' electrically disconnect the comparators 15s and 15s" from the NOR circuits 16 and 16". According to the test method of this embodiment, the test time can be shortened in the same manner as in the embodiments shown in FIGS. 30 and 34.

Note that the test data write control gate 8, the comparator 15, the NOR circuit 16, and the like are arranged not in correspondence with the sense circuits but are provided on the side of either sense circuit, and the output node 17' is directly connected to the output terminal 18 for the simultaneous comparison result without going through the OR circuit 26. This arrangement can also belongs to the scope of the present invention. In this case, since half the memory cells connected to the word line or the supplementary word line serves as an object for the simultaneous write and comparison operations, a test time can be reduced to 2/n that of the conventional redundancy semiconductor memory. In this case, n indicates the number of memory cells connected to the word line or the supplementary word line and subjected to the simultaneous write and comparison operation. The present invention is not limited to the arrangement of the sense circuit 7 and the supplementary sense circuit 7' shown in FIG. 35. Furthermore, the present invention is not limited to the connecting relationship between the main bit lines and the bit lines. Therefore, for example, in the cell array arrangement wherein the test data write control gate 8 and the like are provided on the side of one sense circuit, the switches 43, 44, and 45 associated with the main bit lines shown in FIG. 35 can be omitted. The present invention is effective for such a cell array arrangement. The present invention is not limited to the high-density memory cell array arrangement on the basis of the folded bit line arrangement shown in FIG. 35. For example, FIG. 36 shows a modification of FIG. 35, wherein the present invention is applied to a high-density memory cell array arrangement on the basis of, e.g., an open bit line arrangement.

Figure 36:
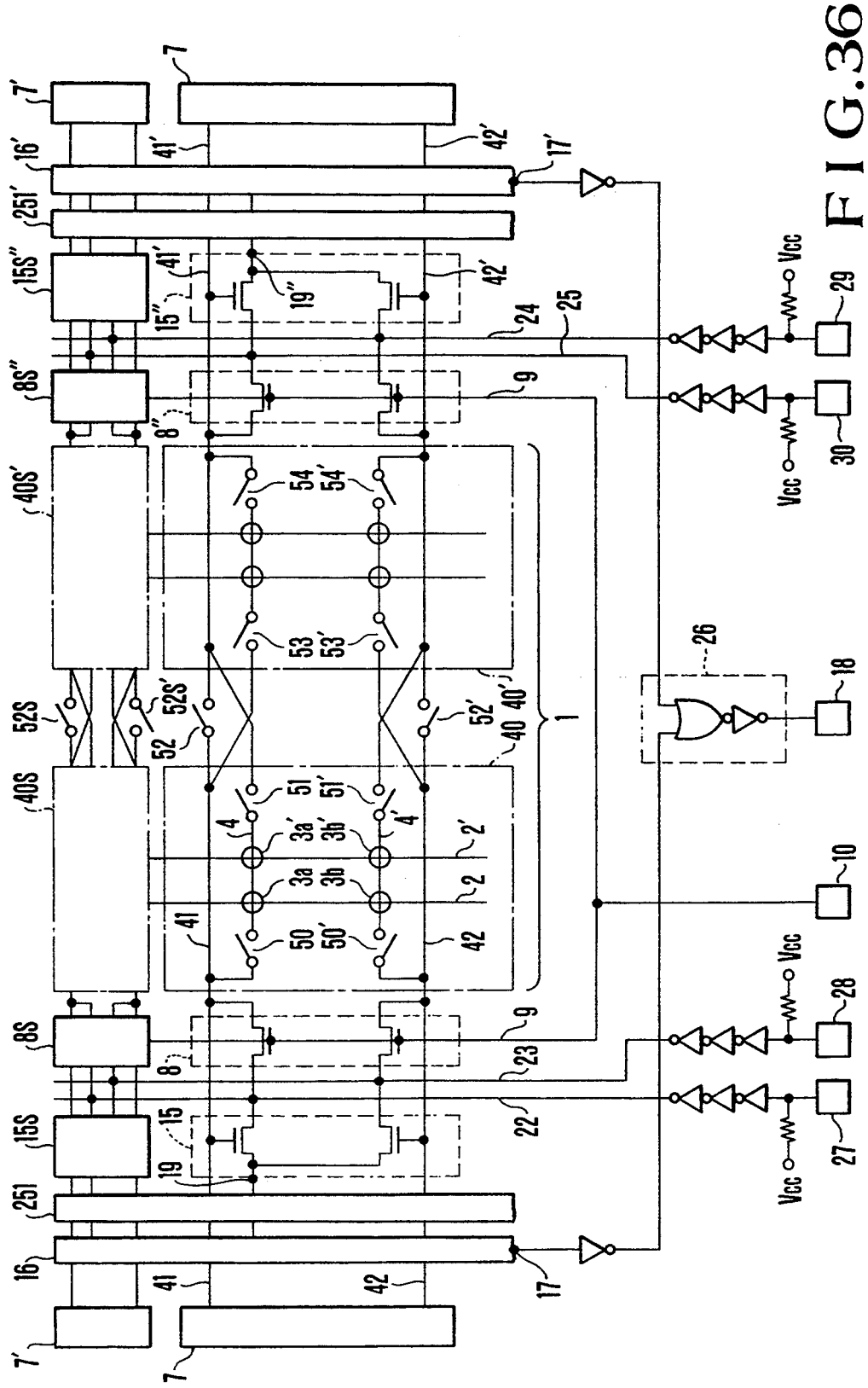
FIG. 36 is a circuit diagram showing a modification of FIG. 35.

FIG. 36 illustrates an arrangement corresponding to a main bit line pair, wherein the memory cell array 1 is divided into the two subarrays 40 and 40' and the two supplementary subarrays 40s and 40s'. For the sake of illustrative simplicity, various switches are represented by bar switches instead of transistors. Reference numerals 50, 50', 51, 51', 53, 53', 54, and 54' denote switches for connecting the bit lines and main bit lines; and 52, 52', 52s, and 52s' switches for connecting the one main bit line and the other one and connecting the one supplementary main bit line and the other one. The same reference numerals in FIG. 36 denote the same parts as in FIGS. 30, 34, and 35. The supplementary word lines 2c and 2d, the supplementary memory cells 3c to 3d''', the row decoder 5, the supplementary row decoder 5', the row decoder function inhibit circuit 5" the word driver 6, and the supplementary word driver 6' shown in FIG. 30 are also necessary in this embodiment but are omitted from FIG. 36.

A test method with the arrangement of FIG. 36 will now be described with reference to a case wherein no redundancy circuit is used for the memory cells connected to the embodiment shown in FIG. 35. First, a simultaneous write operation of test data for the memory cells connected to word lines will be described with reference to a case wherein the word line 2 shown in FIG. 36 serves as an object. Upon selection of the word line 2, the switches 50 and 51' are turned on. After data from the memory cells 3a and 3b appear on the main bit lines 41 and 42' through the switches 50 and 51' respectively, the right and left sense circuits 7 are operated. In this case, since the switches 52 and 52' are kept off, the main bit lines 41 and 41', and 42 and 42' are electrically disconnected. After the voltage levels of the main bit lines are determined upon operation of the sense circuits 7, an "H"- or "L"-level voltage corresponding to test data is applied to the test data write terminals 27, 28, 29, and 30. Then, an "H"-level voltage is applied to the test data write control terminal 10, so that the voltage levels corresponding the test data are transmitted onto the bit lines 4 and 4' respectively through a path consisting of the test data write control gate 8 and the switch 50 and a path consisting of the test data write control gate 8" and the switch 51'. At this time, since the word line 2 is kept at "H" level, the test data can be simultaneously written for the memory cells connected to word lines.

Then, the test data write control terminal 10 is set at "L" level, and all the test data write terminals are set at "H" level. Thereafter, the word line is set in a nonselection state at the same timing as in the normal memory operation, thus ending a series of write operations. In this manner, the "H"- or "L"-level voltage is applied to the test data write terminals 27 and 30, and the "L"- or "H"-level voltage is applied to the write terminals 28 and 29, and the "H"- and "L"-level voltages are sequentially alternated upon sequential selection of the word lines, thereby simultaneously writing test data "CHECKERBOARD". The "H"- or "L"-level voltage is applied to the test data write terminals 27 and 29, and the "L"- or "H"-level voltage is applied to the write terminals 28 and 30, and the word lines are sequentially selected while fixing the voltage levels applied to these terminals, thereby simultaneously writing test data "MSCAN". For "MARCHING", the operation corresponds to that in the embodiment shown in FIG. 34. A modification associated with the circuit operation such as canceling of latching of the sense circuit, and a modification associated with the switching control circuit are the same as those in the above embodiment.

A simultaneous comparison sequence for the memory cells connected to word lines will be described below. The same operation as in the above write operation is performed until a timing at which the sense circuit and the supplementary sense circuit are operated. After the voltage levels of the main bit lines and the supplementary main bit lines are determined, the voltage level opposite to that of the test data in the write operation is applied to the test data write terminals 27, 28, 29, and 30. As a result, when the applied opposite voltage levels coincide with the voltage levels appearing on the main bit lines and the supplementary bit lines by the normal readout operation, the output nodes 19 and 19" of the comparators 15 and 15" go to "H" level, and cause the output nodes 17 and 17' of the NOR circuits 16 and 16' to be changed from "H" level to "L" level. Therefore, upon observation of a change from "L" level to "H" level of the output terminal 18 for the simultaneous comparison result, it can be detected that the main memory cells connected to the selected word line include a defective bit. When no redundancy circuit is used, the switching control circuits 251 and 251' electrically disconnect the comparators 15s and 15s" and the NOR circuits 16 and 16'. According to the embodiment shown in FIG. 36, a test time can be shortened in the same manner as in the above embodiments.

The test data write control gate 8, the comparator 15, the NOR circuit 16, the test data write lines 22 and 23, the test data write terminals 27 and 28 shown in FIG. 36 may be arranged on the side of either one sense circuit, and the output node 17 may be directly connected to the output terminal 18 for the simultaneous comparison result without going through the OR circuit 26. This arrangement also belongs to the scope of the present invention. In this case, since half the memory cells connected to the word line or the supplementary word line serves as objects for the simultaneous write and comparison operations, a test time can be reduced to 2/n that of the conventional redundancy semiconductor memory. In this case, n indicates the number of memory cells connected to the word line or the supplementary word line and subjected to the simultaneous write and comparison operations.

The present invention is not limited to the connecting relationship between the main bit lines and the bit lines in FIG. 36. Therefore, the present invention is effective for a cell array arrangement in which the main bit lines are electrically connected to the bit lines using any one pair of switches arranged at both ends of each of the bit lines.

The above embodiments of the present invention exemplify a simultaneous write and comparison method for the memory cells connected to word lines. However, if a plurality of word lines and supplementary word lines are multiple-selected, test data can be written in all the memory cells in the memory cell array by several times of write operations. Therefore, in the present invention, a unit of simultaneous write and comparison operations is not limited to a word line or a supplementary word line but can be one or a plurality of word lines or a plurality supplementary word lines, or a part of word or supplementary word line. The present invention is not limited to a DRAM as a redundancy semiconductor memory but can be similarly applied to a static RAM, ROM, and the like.

According to the embodiments shown in FIGS. 30 to 36 as described above, external "0" or "1" test data is simultaneously written in a plurality of main memory cells and supplementary memory cells connected to the selected main and supplementary word lines, and the test data written in the plurality of main memory cells and supplementary memory cells connected to the selected main and supplementary word lines is simultaneously compared with "0" or "1" expected value data applied from an external terminal to the selected main and supplementary word lines, thereby greatly shortening a write and comparison time. Therefore, a redundancy semiconductor memory which can greatly reduce a test time can be realized.

If a plurality of main and supplementary word lines are multiple-selected, test data can be written in all the memory cells by once or several times of write operations. Therefore, the same effect as described above can also be obtained.

FIG. 37 shows an arrangement according to still another embodiment of the present invention. FIG. 37 corresponds to FIG. 8, and the same reference numerals in FIG. 37 denote the same parts as in FIGS. 8 and 30. In FIG. 37, a redundancy circuit employs a circuit configuration which can perform row and column defect remedy using both supplementary word lines and supplementary bit lines. In FIG. 37, reference numerals 2c and 2d denote supplementary word lines; and 3a'', 3b'', 3c, 3d, 3c', 3d', 3c'', and 3d'', supplementary memory cells which are simply illustrated as well as main memory cells 3a, 3b, 3a' and 3b'. Reference numeral 5' denote supplementary row decoders; 5'', a row decoder function inhibit circuit; 6' , a supplementary word driver; 7', a supplementary sense circuit; 8s, a test data write control gate corresponding to a supplementary bit line pair; and 113, a latch circuit for latching test data and supplying test data having opposite, i.e., complementary voltage levels to test data write lines 11 and 12. Reference numeral 114 denotes a latch input line; 15s, a comparator corresponding to the supplementary bit line pair; 251, a switching control circuit for electrically connecting comparators 15 or the comparator 15s with a NOR circuit 16 (to be described later); 16, the NOR circuit for detecting a coincidence for the memory cells connected to word lines based on output data from the plurality of comparators 15 or the comparator 15s; 17, an output node of the NOR circuit 16; 19s, an output node of the comparator 15s; and 122', a supplementary multiplexer.

With this arrangement, the test data write control gates 8 and 8s, the test data write control line 9, the test data write control circuit 110, the test data write lines 11 and 12, the latch circuit 113, and the like constitute a simultaneous write circuit. The test data write control line 9, the test data write control circuit 110, the test data write lines 11 and 12, the latch circuit 113, the comparators 15 and 15s, the switching control circuit 251, the NOR circuit 16, and the like constitute a simultaneous comparison circuit. A test mode setting signal generator 128 is a circuit for detecting transition timings of $\overline{RAS}$, $\overline{CAS}$, and $\overline{WE}$ determined by, e.g., the JEDEC, and can be realized by a known arrangement. As shown in FIG. 37, in the circuit configuration in which data input and output systems are separated, test data need not always be latched. Therefore, an arrangement from which the latch circuit 113 is omitted also belongs to the scope of the present invention. Furthermore, the test data write control gates 8 and 8s, the test data write control line 9, and the test data write lines 11 and 12 shown in FIG. 37 are not limited to the illustrated arrangements. Therefore, for example, in FIG. 37, a single write line is used in place of the test data write lines 11 and 12, two test data write control lines 9 are employed, so that two transistors in each of the test data write control gates 8 and 8s can be separately controlled by the two test data write control lines 9.

FIG. 38 is a flow chart of one test mode according to the embodiment shown in FIG. 37. In FIG. 38, "peripheral circuit" means a circuit excluding a test circuit constituted by the simultaneous write circuit and the simultaneous comparison circuit, and a memory cell array. This flow chart has the following two features. The first feature is the order of tests. This flow chart aims at detecting a defective chip fast, and forming a distribution map of defects, i.e., a fail bit map. In the test of the memory cell array, a simultaneous test is performed for the memory cells connected to word lines using the test circuit shown in FIG. 37. Then, a test is conducted, in units of bits, for a word line from which a defective bit is detected in accordance with the test result, thereby obtaining data representing a defective bit distribution. However, if the entire main memory cell on the bit line is determined to be defective due to defective peripheral circuits, a test must be conducted for all the word lines in the memory cell array in units of bits, and a test time cannot be sufficiently shortened. Therefore, the test flow of the peripheral circuits is first performed to detect defective bit lines, and the defective bit lines are substituted with supplementary bit lines in the identical flow. Thereafter, the test flow of the test circuit is performed to check if the functions of the test circuit are normal. Subsequently, the test flow of the memory cell array is performed. The second feature of the flow chart shown in FIG. 38 is as follows. When a chip is determined to be impossible of defect remedy in the test of the peripheral circuits or the test circuit, the next test of the test circuit and the memory cell array of this test are not performed, i.e., all the remaining tests are inhibited.

Figure 39:
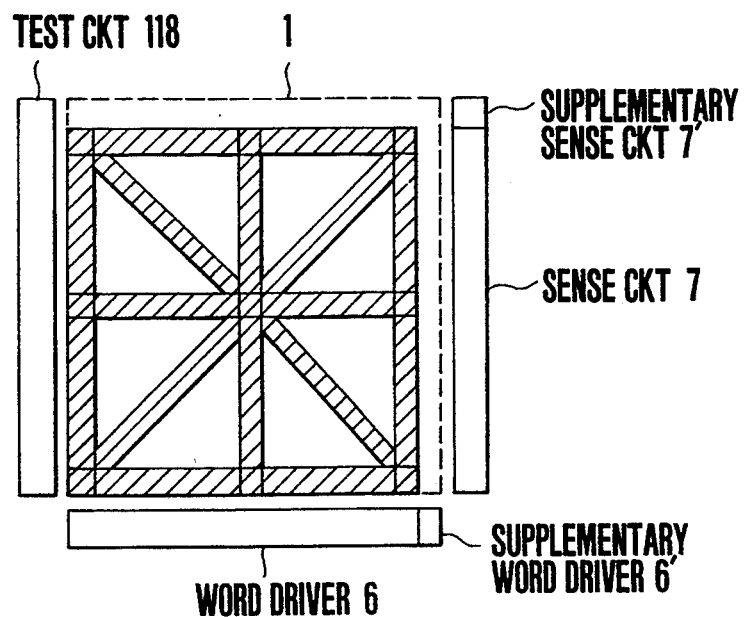
FIG. 39 is a view showing a memory cell array which serves as an object in the test of a peripheral circuit according to the embodiment shown in FIG. 37.

FIG. 39 shows an arrangement of a plurality of memory cell lines as objects to be tested in the test of the peripheral circuits according to the embodiment shown in FIG. 37. Since the memory cell lines indicated by hatched portions are used as objects to be tested, a test time for the peripheral circuits can be shortened.

Figure 41:
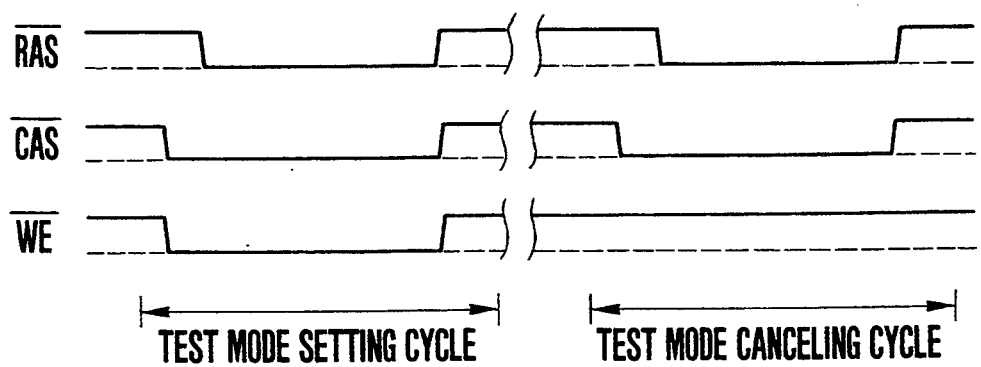
FIG. 41 is a timing chart showing changes in clocks associated with setting and canceling of a test mode.

FIGS. 40(a) to 40(h) are timing charts showing the relationship of level determinations among the test mode setting signals TE0 to TE3, the write control clock signal $\overline{WE}$, the latch input line 114, the test result output line 120, and the data line 123 when the test is executed in accordance with the flow chart shown in FIG. 38. In FIGS. 40(f) and 40(h), hatched portions indicate arbitrary level periods of the lines. On the other hand, portions other than the hatched portions indicate periods during which the level of the lines must be determined. Note that in an arrangement shown in FIG. 40, the write control clock signal $\overline{WE}$ is changed every cycle, and the read and write access operations of test data are alternately performed. However, the present invention is not limited to this order. Therefore, after the write operation of test data is performed for all the word lines, the readout operation can be performed. In FIG. 40, the test start timing for the peripheral circuits is defined by the test mode setting signal TE0. However, the signal TE0 need not always be provided. As will be described later, in the test of the peripheral circuits, the write and readout operations of test data can be performed through the data line 123 and the multiplexer 122 in the same manner as in the normal write and readout operations. The transition timings of the $\overline{RAS}$, $\overline{CAS}$, and $\overline{WE}$ associated with setting and canceling of the test mode are described in "Both 4M and 1M memories are arranged in a same package, and a test mode is also introduced" in Nikkei Micro Device, extra issue No. 1 (May 1987, pp. 73–80), as shown in FIG. 41. Note that the test mode setting signal generators 128 to 131 shown in FIG. 37 detect the test mode at the transition timings of the clocks $\overline{RAS}$, $\overline{CAS}$, and $\overline{WE}$ shown in FIG. 41, and thereafter, latch the test mode setting signals TE0 to TE3 at "H" level. Therefore, after the test mode is detected, even if the clock timing is arbitrarily set, the test mode setting signals TE0 to TE3 are held at "H" level.

A test mode according to the embodiment shown in FIG. 37 will be described with reference to FIGS. 37 to 40. First, a test of peripheral circuits is performed using the main memory cell lines shown in FIG. 39 as an object. More specifically, test data is applied to the data input terminal 126 shown in FIG. 37. The test data is written in a main memory cell selected by the row decoder 5 and the column decoder 132 through the data input circuit 124, the switch 121, the data line 123, and the multiplexer 122. On the other hand, the written test data is read out to the data output terminal 127 through the multiplexer 122, the data line 123, the switch 121, and the data output circuit 125. The readout data is transferred to an external tester, and is compared with expected value data by the tester. The above operation is repeated while shifting the positions of the main memory cells in the main memory cell line. In the test of the peripheral circuits, the test data is not transmitted through the latch input line 114 and the test result output line 120. When the tester detects a defective bit which has different row and column addresses, the values of which are larger than the number of supplementary lines, this redundancy semiconductor memory is determined to be defective, and is excluded from the series of test flows. When a word line for which defect remedy can be performed upon substitution with supplementary lines which do not include a defective bit after the re-test is obtained, the transition timings of the clocks $\overline{\text{RAS}}$, $\overline{\text{CAS}}$, and $\overline{\text{WE}}$ are set to be the test mode to generate a test mode setting signal TE1. Thereafter, the test flow of the test circuit is executed. The switch 121 is switched by the signal TE1 so that the data input circuit 124 and the data output circuit 125 are connected to the data input line 114 and the test result output line 120. Test data is simultaneously written in all the main memory cells and supplementary memory cells on a single word line serving as an object in the test of the peripheral circuits, through the latch input line 114, the latch circuit 113, the test data write lines 11 and 12, and the test data write control gates 8 and 8s. On the other hand, the written test data is simultaneously compared with expected value data input to the comparators 15 and 15s through the latch input line 114, the latch circuit 113, and the test data write lines 11 and 12. When substitution to the supplementary bit line is performed during the test of the peripheral circuits, the switching control circuit 251 electrically disconnects the NOR circuit 16 from the comparator 15 which is connected to the defective bit line. The NOR circuit 16 receives all the comparison results, and simultaneously performs defect detection. The test result is read out to the data output terminal 127 through the test result output line 120, the switch 121, and the data output circuit 125. The test result is transferred to the tester, and its voltage level is detected by the tester. When it is determined that the test circuit is defective, the corresponding redundancy semiconductor memory is excluded from the series of test flows. If no defect is detected, the transition timings of the clocks $\overline{\text{RAS}}$, $\overline{\text{CAS}}$, and $\overline{\text{WE}}$ are set to be the test mode to generate the test mode setting signal TE2. Then, a test flow for the test circuit is performed. The switch 121 is switched in response to the signal TE2 so that the data input circuit 124 and the data output circuit 125 are connected to the data line 123 and the test result output line 120. Inverted data of the test data which is simultaneously written in the test flow is written in one bit of each main or supplementary memory cell on the single word line selected by a column decoder 132 or a supplementary column decoder 132'. The test result of defect detection by the NOR circuit 16 is transferred to the tester in the same manner as in the above-mentioned test flow, and its voltage level is detected by the tester. The above operation is repeated while shifting the positions of the main or supplementary memory cells to which the inverted data is written on the word line. When the detection result of a defective bit is not output due to a functional error of the test circuit, the corresponding redundancy semiconductor memory is excluded from the series of test flow. On the contrary, when the detection result of a defective bit is output, the transition timings of the clocks $\overline{\text{RAS}}$, $\overline{\text{CAS}}$, and $\overline{\text{WE}}$ are set to be the test mode to generate the test mode setting signal TE3. then, the test flow of the memory cell array is executed. The switch 121 is switched in response to the signal TE3 so that the data input circuit 124 and the data output circuit 125 are connected to the latch input line 114 and the test result output line 120. The test data is simultaneously written in all the main and supplementary memory cells on the word line selected by the row decoder 5 through the latch input line 114, the latch circuit 113, the test data write lines 11 and 12, and the test data write control gates 8 and 8s. On the other hand, the written test data is simultaneously compared with expected value data input to the comparators 15 and 15s through the latch input line 114, the latch circuit 113, and the test data write lines 11 and 12. When substitution to the supplementary bit line is performed during the test of the peripheral circuits, the switching control circuit 251 electrically disconnects the NOR circuit 16 from the comparator 15 which is connected to the defective bit line. The NOR circuit 16 receives all the comparison result and simultaneously performs defect detection. The test data is read out to the data output terminal 127 through the test result output line 120, the switch 121, and the data output circuit 125. The test data is transferred to the tester, and its voltage level is detected by the tester. When the tester determine that defect remedy using nonused supplementary lines cannot be performed, the corresponding redundancy semiconductor memory is determined to be defective. When it is determined that defect remedy can be performed using supplementary lines and no defective bit is detected by the re-test, the corresponding redundancy semiconductor memory is determined to be good. The series of tests is canceled at the transition timings of the clocks $\overline{\text{RAS}}$, $\overline{\text{CAS}}$, and $\overline{\text{WE}}$ shown in FIG. 41.

FIGS. 42(a) to 42(k) are detailed timing charts associated with a test of the memory cell array according to the embodiment shown in FIG. 37. The same reference numerals and the like in FIGS. 42(a) to 42(k) denote the same parts in FIG. 37.

The test of the memory cell array according to the embodiment shown in FIG. 37 will be described with reference to FIGS. 37 and 42(a) to 42(k). A simultaneous write operation of test data in units of word lines when no redundancy circuit is used is performed as follows. The clocks $\overline{\text{RAS}}$ and $\overline{\text{WE}}$ shown in FIGS. 42(a) and 42(b) go to "L" level, and the redundancy semiconductor memory is set in a write mode. The precharge clock signal $\phi_P$ shown in FIG. 42(d) goes to "L" level, and thereafter, the row decoder 5 is operated to select, e.g., a single word line 2a. The word driver 6 is driven by the word line drive clock signal shown in FIG. 42(e) to set the selected word line 2a at "H" level. After data from the main and supplementary memory cells connected to the word line 2a appear on the bit lines and supplementary bit lines, the sense circuit drive clock signal shown in FIG. 42(f) is set at "H" level to operate the sense circuit 7, the supplementary sense circuit 7'. After the voltage levels of the bit lines and supplementary bit lines are determined, test data is transmitted to the test data write lines 11 and 12, as shown in FIG. 42(g). Note that the test data is input from the data input terminal 126 during an "L"-level period of $\overline{WE}$. As shown in FIG. 42(h), the test data write control line 9 is set at "H" level, and the voltage level corresponding to the test data is applied to the bit lines and supplementary bit lines. At this time, the word line 2a is held at "H" level, and test data is simultaneously written in units of word lines. Note that during the simultaneous write operation, the voltage level of the data output terminal 127 shown in FIG. 42(k) corresponds to a high impedance.

In this manner, the word lines 2a and 2b are sequentially selected, and the "H"- and "L"-level voltages applied to the test data write lines 11 and 12 are sequentially alternated, thereby simultaneously writing test data "MSCAN". More specifically, in FIG. 37, "H"- or "L"-level test data is written in the memory cells 3a 3b, 3a', 3b', 3a", and 3b". The "H"- and "L"-level test data are sequentially alternated every two word lines while sequentially selecting the positions of the word lines, thereby simultaneously writing test data "CHECKERBOARD". More specifically, in FIG. 37, "H"- or "L"-level data is written in the memory cells 3a, 3a', and 3a", and "L"- or "H"-level data is written in the memory cells 3b, 3b', and 3b". In order to further facilitate the simultaneous write operation, when the test data write control line 9 is set at "H" level, the sense circuit drive clock signal may be temporarily set at "L" level to cancel latching of the sense circuit 7 and the supplementary sense circuit 7'. When the voltage levels of the bit lines are satisfactorily determined by a voltage applied from the test data write control line 9, these sense circuits need not always be operated.

A simultaneous comparison sequence in units of word lines will now be described. At a timing when the clock $\overline{RAS}$ shown in FIG. 42(a) goes to "L" level, expected value data (FIG. 42(j)) is latched from the data input terminal 126 by the latch circuit 113. The expected value data is inverted data of test data applied during the write operation. Thereafter, the same operation as in the write operation is performed until a timing at which the sense circuit 7 and the sense circuit 7' are operated. After the voltage levels of the bit lines and supplementary bit lines are determined, the expected value data latched by the latch circuit 113 is applied to the test data write lines 11 and 12. At this time, the test data write control line 9 is held at "L" level. When the column redundancy circuit is not used in particular, the switching control circuit 251 electrically disconnects the comparator 15s from the NOR circuit 16. Therefore, the supplementary memory cells 3a" and 3b" on the supplementary bit lines 4c and 4d do not serve as objects for simultaneous comparison. As a result, when the readout data from the main memory cell coincides with the expected value data, when the readout data from the main memory cell is erroneous, the output node 19 of the comparator 15 goes to "H" level and causes the output node 17 of the NOR circuit 16 to be changed from "L" level to "H" level. Therefore, upon observation of a change in voltage level appearing at the data output terminal 127, it can be detected that any of all the main memory cells connected to the selected word line include a defective bit. This state is shown in FIG. 42(k). In FIG. 42(k), "H" level represents a case wherein a defective bit is detected, and "L" level represents that all the bits are good or the write operation is being performed.

An operation when the test data coincides with readout data from the memory cell will be described in detail. A case will be described wherein "H"-level test data is written in the memory cell 3a through the test data write line 11 in the simultaneous write operation. In this case, in the simultaneous comparison operation, "L"- and "H"-level data are respectively applied to the test data write lines 11 and 12, respectively, and are compared with the readout data from the memory cell 3a. When the readout data from the memory cell 3a erroneously has "L" level, the bit line BL1, i.e., the gate of the transistor 15a of the comparator 15 goes to "L" level, and the transistor 15a is turned off. In this case, the bit line $\overline{BL1}$ is set at "H" level upon operation of the dummy cell and the sense circuit 7. Thus, the transistor 15b is turned on, and "H"-level data input to the comparator 15 through the test data write line 12 appears at the output node 19, and causes the output node 17 of the NOR circuit 16 to be changed from "L" level to "H" level. In this case, the switching control circuit 251 electrically connects the comparator 15 and the NOR circuit 16, and electrically disconnects the comparator 15s from the NOR circuit 16. Note that the above operation has been exemplified when the test data write lines 11 and 12 are respectively set at "H" and "L" levels during the write operation. However the same operation is performed when the test data write lines 11 and 12 are respectively set at "L" and "H" levels during the write operation.

The above-mentioned simultaneous write and comparison method employs test data "MSCAN" and "CHECKERBOARD". However, a test using "MARCHING" may be performed. This test can be realized as follows. That is, a write operation of background data for all the main and supplementary memory cells and a subsequent simultaneous comparison operation of readout data are performed in the same manner as those in the test using "MSCAN", and the same simultaneous write and comparison sequences as in the test using the "MSCAN" are then carried out while inverting the voltage levels applied to the test data write lines 11 and 12. However, in the present invention, since data of identical level is simultaneously written in these memory cells connected to a word line, check of a decoding function by using column address which can be performed by the conventional test method cannot be performed. Therefore, for check of a decoding function by using column address, a test using "MARCHING" is independently performed for memory cells connected to at least one word line in the memory cell array 1. Furthermore, this invention is not limited to N pattern test data such as "MSCAN", "MARCHING", and the like, but may employ any test data of an $N^2$ pattern or an $N^{3/2}$ pattern. For example, a plurality of types of test data having different defect detection capacities can be simultaneously used as the N pattern test data.

A case will be described wherein the simultaneous test according to the embodiment shown in FIG. 37 is performed, and a line including a defective memory cell is substituted with a supplementary line. In the test of the redundancy semiconductor memory, after the substitution to the supplementary lines, a re-test must be performed to check if no defective bit is selected. In the re-test, the embodiment shown in FIG. 37 can be employed. First, a simultaneous write operation of test data when the row redundancy circuit is used will be described. Assume that address data for selecting the word line 2a on which a defective bit is present is stored in the supplementary row decoder 5'. First, the precharge clock signal φp shown in FIG. 42(d) is set at "L" level to operate the supplementary row decoder 5'. When the stored address data coincides with input new address data, the supplementary row decoder 5' drives the row decoder function inhibit circuit 5" to disable the row decoder 5 and to select a supplementary word line 2c to be substituted. A supplementary word driver 6' is operated in response to the word line drive clock signal shown in FIG. 42(e), thus setting the supplementary word line 2c at "H" level. Since the row decoder 5 is not operated, the word line 2a is held at "L" level. After data from the supplementary memory cells connected to the supplementary word line 2c appear on the supplementary bit lines, the sense circuit 7 and the supplementary sense circuit 7' are operated in response to the sense circuit drive clock signal shown in FIG. 42(f). After the voltage levels of the bit lines and the supplementary bit lines are determined, "H"- or "L"-level data corresponding to test data is applied to the test data write lines 11 and 12, as shown in FIG. 42(g). Note that the test data is input from the data input terminal 126 during an "L" level period of $\overline{WE}$. Next, as shown in FIG. 42(h), the test data write control line 9 is set at "H" level, and the voltage level corresponding to the test data is applied to the bit lines and supplementary bit lines. At this time, the word line 2c is kept at "H" level, and the simultaneous write operation of test data can be performed in units of word lines.

A simultaneous comparison operation in units of word lines when the row redundancy circuit is used will be described below. At a timing when the clock $\overline{RAS}$ shown in FIG. 42(a) goes to "L" level, expected value data (FIG. 42(j)) from the data input terminal 126 is latched by the latch circuit 113. The expected value data corresponds to inverted data of the test data which is applied during the write operation. Thereafter, the same operation as in the above write operation is performed until a timing at which the sense circuit 7 and the supplementary sense circuit 7 are operated. After the voltage levels of the bit lines and supplementary bit lines are determined, the expected value data latched by the latch circuit 113 is applied to the test data write lines 11 and 12. At this time, the test data write control line 9 is held at "L" level. When only the row redundancy circuit is used, the switching control circuit 251 electrically disconnects the comparator 15s from the NOR circuit 16. Therefore, the supplementary memory cell 3c" on the supplementary bit line 4c does not serve as an object of the simultaneous comparison. As a result, when the readout data from the supplementary memory cell coincides with the expected value data, i.e., when the readout data from the supplementary memory cell is erroneous data, the output node 19 of the comparator 15 goes to "H" level and causes the output node 17 of the NOR circuit 16 to be changed from "L" level to "H" level. Therefore, upon observation of a change in voltage level appearing at the data output terminal 127, it can be detected that any of the supplementary memory cells connected to the supplementary word line 2c includes a defective bit. This state is shown in FIG. 42(k). In FIG. 42(k), "H" level represents that a defective bit is present, and "L" level indicates that all the bits are good or a write operation is being performed. Note that various modifications associated with types of test data to be used, a circuit arrangement, and a circuit operation comply with those in the embodiment shown in FIG. 37 when no redundancy circuit is used.

The simultaneous write and comparison operations of test data for the memory cells connected to word lines when the column redundancy circuit is used will be described. In this case, the same method for substituting a bit line including a defective bit with a supplementary bit line as in row defect remedy is employed. The switching control circuit 251 electrically disconnects the NOR circuit 16 from the comparator 15 associated with the defective bit, and electrically connects the NOR circuit 16 and the comparator 15s connected to the supplementary bit line to be substituted. More specifically, a circuit operation when the supplementary bit lines 4c and 4d in FIG. 37 are subjected to substitution and the word line 2a is selected will be described. Since the simultaneous write operation of test data for the memory cells connected to word lines is performed as in the case wherein no redundancy circuit is used, a description thereof will be omitted. In the simultaneous comparison operation of test data for the memory cells connected to word lines, the same operation as in the write operation is performed until the expected value data is latched and the voltage levels of the bit lines and the supplementary bit lines are determined. When the readout data from the supplementary memory cell coincides with the expected value data, i.e., when the readout data from the supplementary memory cell is erroneous data, the output node 19s of the comparator 15s goes to "H" level and causes the output node 17 of the NOR circuit 16 to be changed from "L" level to "H" level. Therefore, upon observation of a change in voltage level appearing at the data output terminal 127, it can be detected that the supplementary memory cell 3a" connected to the word line 2a is defective. Note that various modifications associated with types of test data to be used, a circuit arrangement, and a circuit operation comply with those in the embodiment shown in FIG. 37 when no redundancy circuit is used. When both the row and column redundancy circuits are to be used, a test method therefor can be explained in the same manner as in the above embodiment when the each redundancy circuit is solely used.

According to the test method of the embodiment shown in FIG. 37 as described above, since the simultaneous write and comparison operations can be performed for the memory cells connected to word lines, the test time can be reduced to 1/n that of a conventional redundancy semiconductor memory. In this case, n indicates the number of memory cells connected to the word lines and supplementary word lines and subjected to simultaneous write and comparison operations, and normally takes a large value, e.g., 500 or 1000 or larger.

The arrangement of the switching control circuit 251 shown in FIG. 37 is the same as that shown in FIG. 31.

In addition, the NOR circuit 16 in FIG. 37 may adopt the arrangement shown in FIG. 32 or 33, as a matter of course.

The connecting relationships between the comparator 15 and the bit lines 4a and 4b and between the comparator 15s and the supplementary bit lines 4c and 4d may be modified, as shown in FIG. 7. More specifically, the bit lines 4a and 4b or the supplementary bit lines 4c and 4d are cross-connected to the gates of the transistors in the comparators 15 and 15s. With this arrangement, an identical voltage level to that of the test data in the write operation (not inverted data) can be applied to the test data write lines 11 and 12. Therefore, desired test data can be applied regardless of the simultaneous write and comparison operations during a test.

The test data write control circuit 110 shown in FIG. 37 has an arrangement as shown in FIG. 14.

The latch circuit 113 shown in FIG. 37 has an arrangement as shown in FIG. 15.

The switch 121 shown in FIG. 37 has an arrangement shown in FIG. 16.

The data input circuit 124 shown in FIG. 37 has an arrangement as shown in FIG. 17.

In the embodiment shown in FIG. 37, an I/O COMMON structure shown in FIG. 18 may be employed. With this arrangement, a defective bit in the main or the supplementary memory cells connected to the selected word line can be detected.

In the above embodiment of the present invention, the simultaneous write and comparison method of test data in units of word lines has been exemplified. Instead, for example, a plurality of word lines and supplementary word lines are multiple-selected, so that test data can be written in all the main and supplementary memory cells in the memory cell array by several write operations. Therefore, in the present invention, a unit of simultaneous write and comparison operations is not limited to a single word line, but can correspond to a plurality of word lines or a plurality of supplementary word lines or to a part of a word line or a supplementary word line.

In the above embodiment, write, read, and comparison operations of test data are repeatedly performed for each word line. Alternatively, after the write operation is performed for all the word lines, the read and comparison operations can be performed for each word line. In the above embodiment, a test is divisionally carried out for three parts, i.e., the peripheral circuits, the test circuit, and the memory cell array. The scope of the present invention includes a method for performing a test for two parts, i.e., peripheral circuits and other circuits. The memory cell array arrangement adopts the folded bit line arrangement. However, the present invention is not limited to this memory cell array arrangement. For example, the present invention can be applied to an open bit line arrangement in which a bit line pair and a supplementary bit line pair are formed by bit lines and supplementary bit lines in different memory cell arrays sandwiching a sense circuit and a supplementary sense circuit therebetween.

Figure 43:
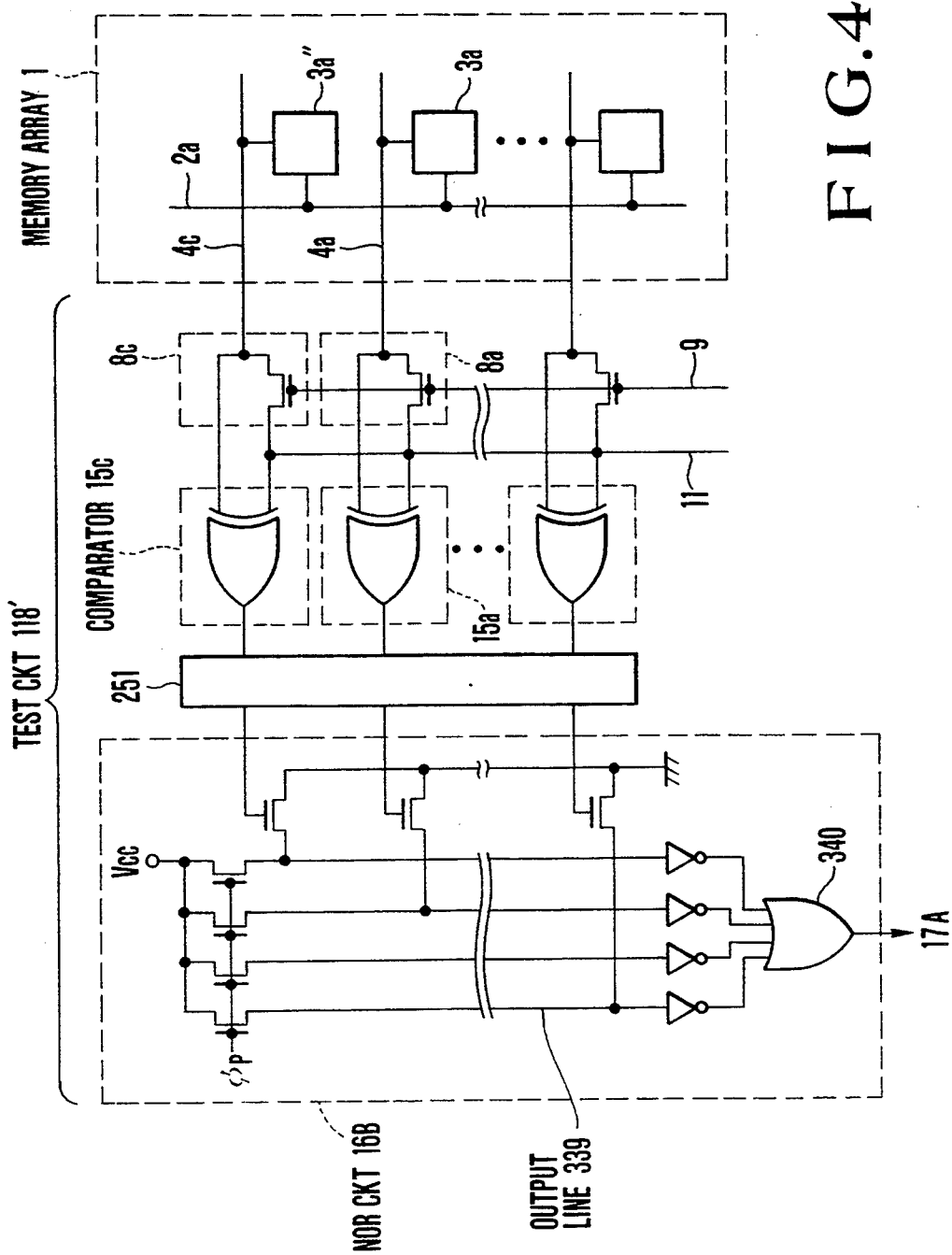
FIG. 43 is a circuit diagram showing an arrangement wherein a test circuit of the present invention is applied to a redundancy semiconductor memory having an open bit line arrangement.

FIG. 43 is a circuit diagram of a test circuit in a redundancy semiconductor memory adopting an open bit line arrangement, and only shows a main part associated with one of memory cell arrays sandwiching sense circuits therebetween. In FIG. 43, reference numerals 8a and 8c denote test data write control gates corresponding to bit lines and supplementary bit lines; and 15a and 15c, logically expressed comparators associated with the bit lines and supplementary bit lines, each of which uses the transistor 15a in the comparator 15 shown in FIG. 37. Reference numeral 16B denotes a NOR circuit having a modified circuit arrangement. In order to determine a voltage level of an output result fast, a plurality of output lines 339 are connected to an OR circuit 340. Reference numeral 17A denotes an output node of the NOR circuit 16B. Other reference numerals correspond to those in FIG. 37. The word driver, the sense circuits, and the like in FIG. 37 are omitted from FIG. 42. The simultaneous write and comparison operations by the test circuit 118' of this arrangement are the same as those in the embodiment shown in FIG. 37. However, the test data is limited to "MSCAN".

Figure 44:
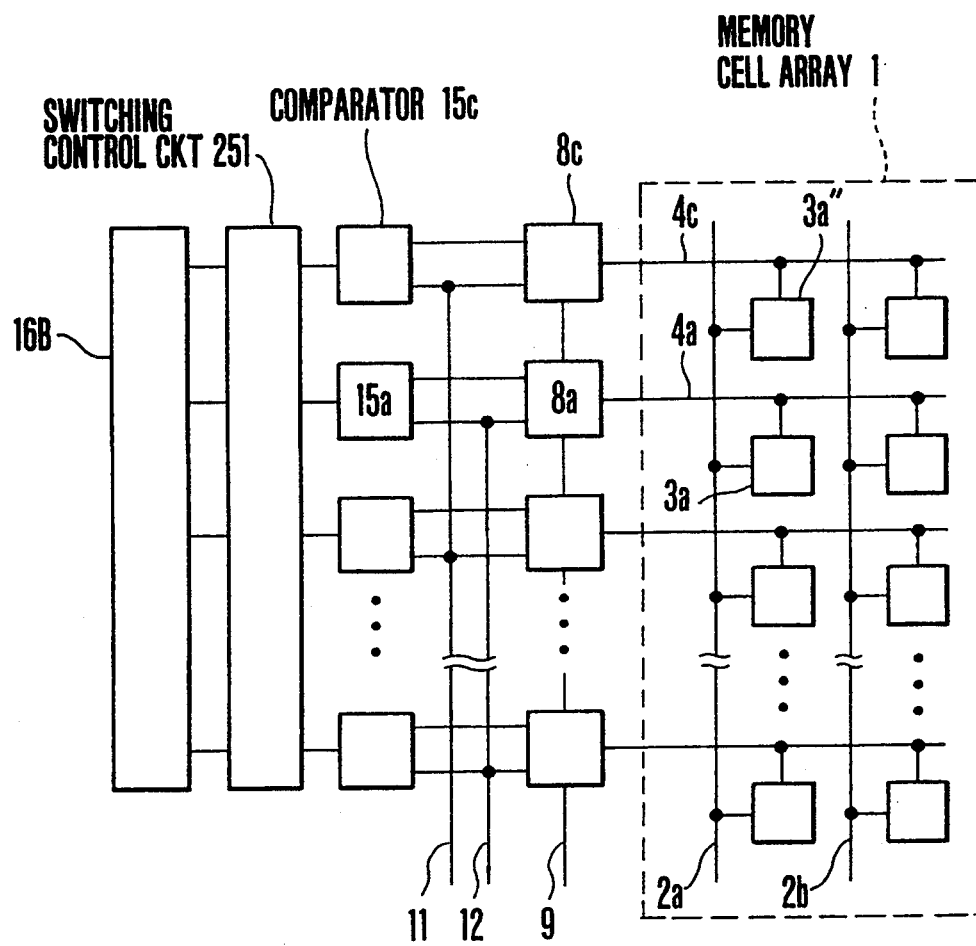
FIG. 44 is a diagram of a modification of the test circuit shown in FIG. 43.

FIG. 44 is a circuit diagram of a modified test circuit in which two test data write lines are arranged. With this arrangement, test data "CHECKERBOARD" and "MARCHING" can be used as in the embodiment shown in FIG. 37. The simultaneous write operation of "MSCAN" can be realized by fixing an identical voltage level applied to the test data write lines 11 and 12 regardless of sequential selection of the main and supplementary word lines. The simultaneous write operation of "CHECKERBOARD" can be realized by alternating different voltage levels applied to the test data write lines 11 and 12 in synchronism with sequential selection of the main and supplementary word lines. As for "MARCHING", a simultaneous write operation of background data with respect to all the memory cells is executed in the same manner as in the test using "MSCAN". In FIG. 44, readout data from the main and supplementary memory cells on a word line 2a in, e.g., FIG. 44 are simultaneously compared with expected value data. Thereafter, different voltage levels are applied to the test data write lines 11 and 12 to simultaneously write data in the main and supplementary memory cells on the word line 2a. Thereafter, the simultaneous comparison operation is executed in the same manner as described above. Next, a voltage level opposite to that of background data is simultaneously applied to the test data write lines 11 and 12 to simultaneously write data in the main and supplementary memory cells on the word line 2a. Thereafter, the simultaneous comparison operation is executed in the same manner as described above.

The above operations are sequentially performed for the word line 2b and thereafter, thereby realizing a test using "MARCHING" in units of word lines. When the open bit line arrangement is employed, voltage levels applied to the test data write lines 11 and 12 are either same or different. For this reason, the latch circuit 113 shown in FIG. 15 must be modified so that not only different voltage levels but also an identical voltage level can be output.

The present invention can be applied to a high-density memory cell array arrangement for a very large-capacity redundancy semiconductor memory in which bit lines or supplementary bit lines employ a hierarchical structure or a sense circuit and a supplementary sense circuit are arranged at both sides of a memory cell array.

The present invention is not limited to a DRAM as a redundancy semiconductor memory, but can be similarly applied to a static RAM, ROM, and the like.

The above circuit diagrams exemplify circuit arrangements for executing the corresponding functions. However, as a matter of course, modified circuits for executing the identical functions may be proposed.

According to the embodiments shown in FIGS. 37 to 44 as described above, "0" or "1" test data is simultaneously written from an external terminal for inputting/outputting normal data in the main and supplementary memory cells connected to a selected word line and a selected supplementary word line, and the test data written in the main and supplementary memory cells connected to the word lines and the supplementary word lines are simultaneously compared with "0" or "1" expected value data applied from the external terminal for inputting/outputting normal data. Thus, a write and comparison time can be greatly shortened.

Therefore, a redundancy semiconductor memory can be provided wherein a test time can be greatly shortened without arranging a new external terminal for setting a test mode.

If a plurality of word lines or supplementary word lines are multiple-selected, test data can be written in all the memory cells by one or several write operations, thus providing the same effect as described above.

Figure 46:
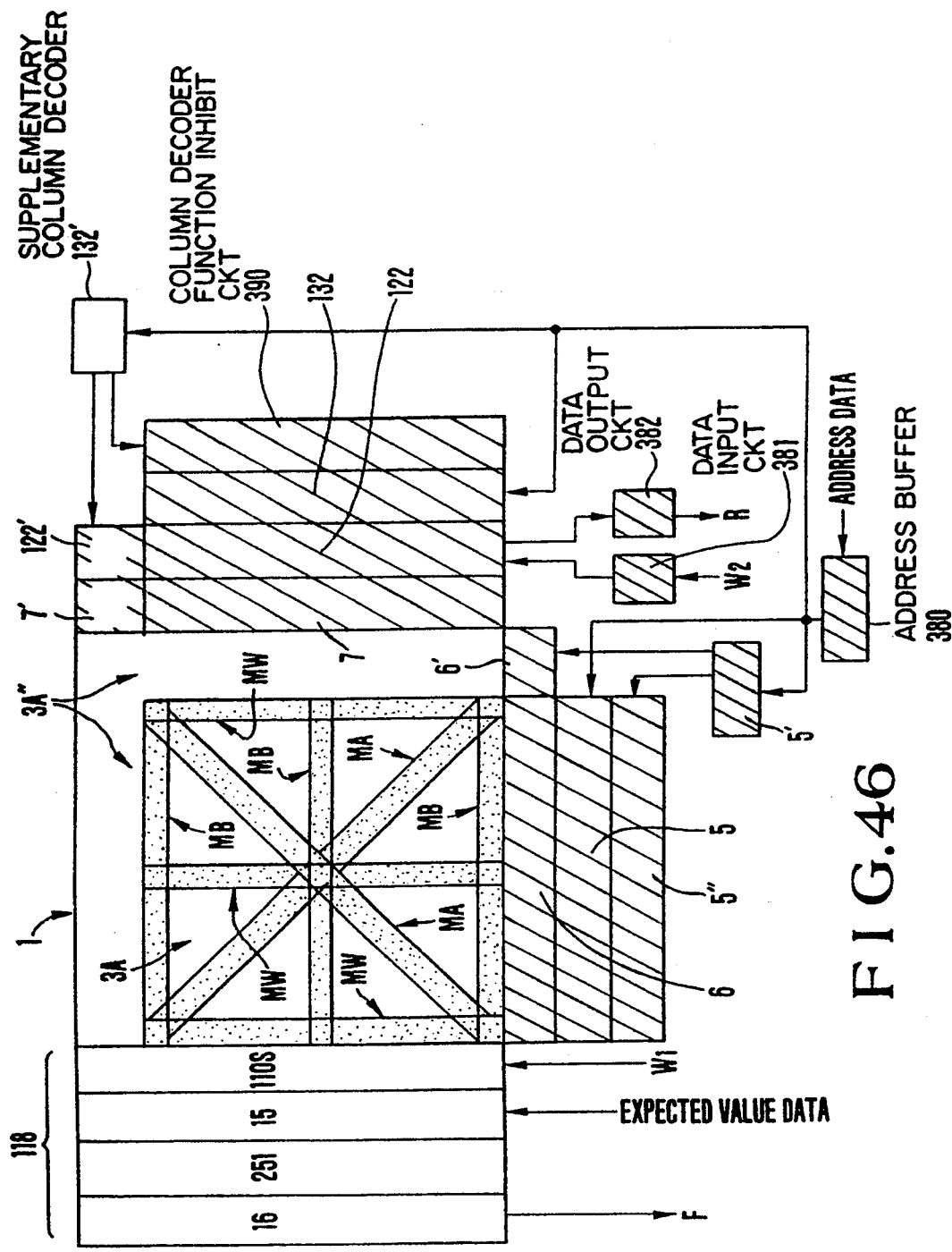
FIG. 46 is a circuit diagram of a redundancy semiconductor memory to which the present invention can be applied.

FIG. 46 shows another redundancy semiconductor memory according to still another embodiment of the present invention. FIG. 46 corresponds to FIG. 37, and the same reference numerals in FIG. 46 denote the same parts as in FIG. 37. In FIG. 46, reference numeral 380 denotes an address buffer; 381, a data input circuit; 382, a data output circuit; 132, a column decoder; 390, a column decoder function inhibit circuit; and 132', a supplementary column decoder. The circuits constituted by the above components are indicated by hatched portions and correspond to peripheral circuit. The redundancy semiconductor memory is constituted by the peripheral circuits, a memory cell array 1 (to be described later), and a test circuit 118.

The memory cell array 1 comprises memory cell 3A (portions indicated by dots and portions surrounded thereby) and supplementary memory cell array 3A". Memory cell lines MA indicated by dots consist of a plurality of memory cells serving as objects in a test of peripheral circuits and connected along diagonal lines, memory cell lines MW consist of a plurality of memory cells connected along word lines, and memory cell lines MB consist of memory cells connected along bit lines.

The numbers of memory cell lines MA, MW, and MB can be appropriately determined to be more than 1 each. For example, one or two memory cell lines MA, and memory cell lines MW and MB respectively corresponding to the numbers of supplementary word and bit lines may be arranged. In particular, the number of memory cell lines MW may be set to be large, e.g., several % of a total number of word lines in the memory cell array 1. In the latter case, a probability for detecting a word line including no defective bit can be improved.

A test circuit 118 comprises a simultaneous write circuit 110S, a simultaneous comparison circuit 15, a switching control circuit 251, and a detector 16. The simultaneous write circuit 110S is adopted to simultaneously write "0" or "1" test data in a plurality of main and supplementary memory cells connected to a selected word line or a plurality of supplementary memory cells connected to a supplementary word line from an external terminal. The simultaneous comparison circuit 15 is adopted to simultaneously compare the test data written in a plurality of main and supplementary memory cells connected to a selected word line or a plurality of supplementary memory cells connected to a selected supplementary word line with "0" or "1" expected value data applied from the external terminal to the plurality of main and supplementary memory cells connected to the selected word line or the plurality of supplementary memory cells connected to the selected supplementary word line. The switching control circuit 251 is adopted to separate the simultaneous comparison circuit 15 associated with a defective memory cell from other simultaneous comparison means associated with other main and supplementary memory cells.

Reference symbol $W_1$ denotes input data as test data; $W_2$, input data as the similar test data to $W_1$ or inverted data thereof; R, output data as readout data; and F, output data as a detection result from the detector 16. Terminals for the data $W_1$, $W_2$, R, F, and expected value data shown in FIG. 46 are connected to a memory tester outside a chip through corresponding external connecting terminals (not shown) arranged in the redundancy semiconductor memory. The terminals $W_1$, $W_2$, R, F, and expected value data may be independently arranged. However, data input terminals may be used therefor.

Figure 47:
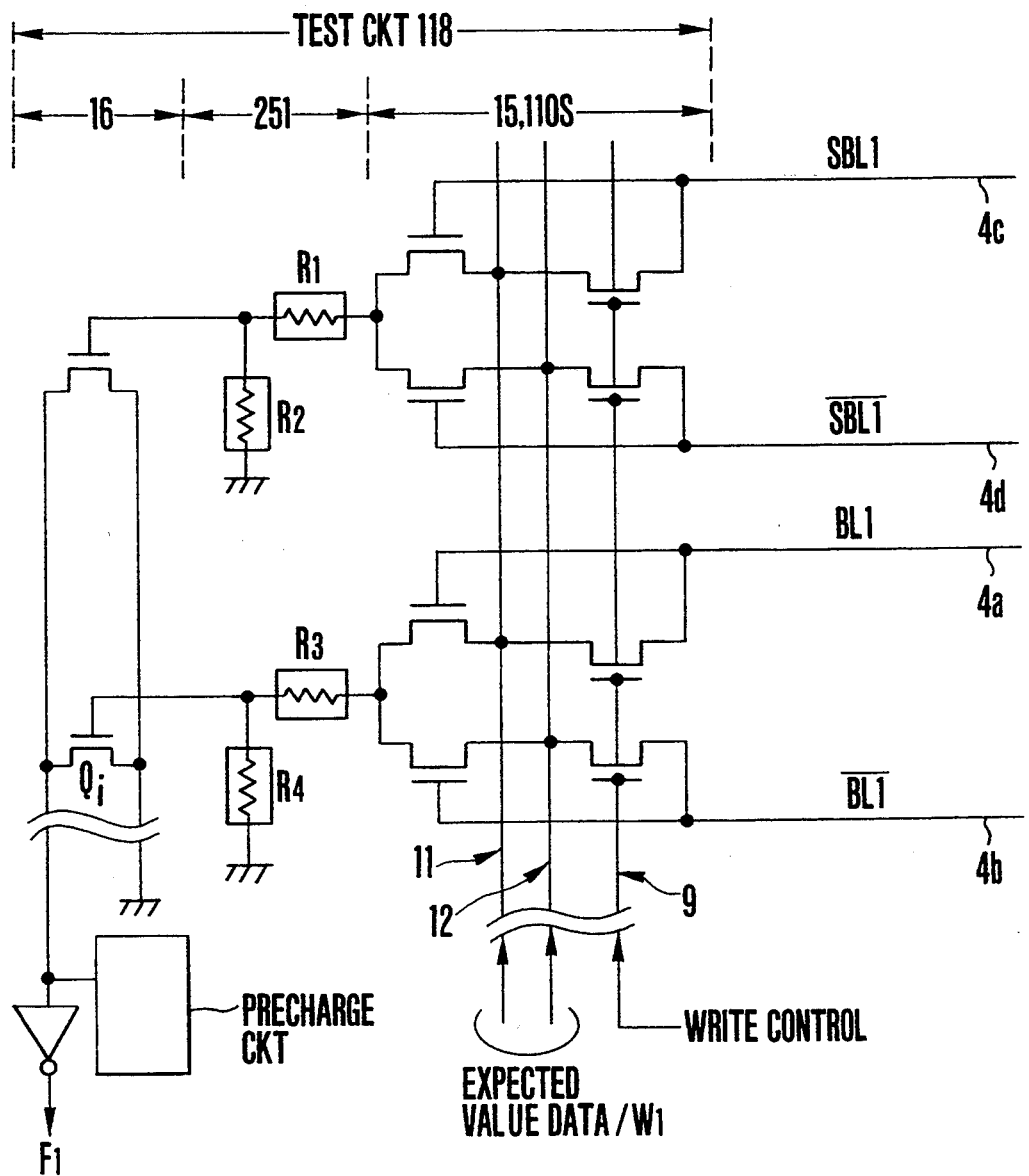
FIG. 47 is a detailed diagram of a test circuit shown in FIG. 46.

FIG. 47 shows an arrangement of the test circuit 118 shown in FIG. 46. In FIG. 47, reference numerals 4a and 4b denote bit lines in a memory cell array 3A; 4c and 4d, supplementary bit lines in a supplementary memory cell array 3A"; 9, a test data write control line; and 11 and 12, test data write lines. R1 to R4 in the switching control circuit 251 indicate resistors for separating a part of the comparison circuit 15 associated with a defective bit from the detector 16. For example, before the test is started, the resistors R1 and R4 are set to have a high resistance, and the resistors R2 and R3 are set to have a low resistance. When the bit lines 4a and 4b are substituted with the supplementary bit lines 4c and 4d after the test is executed, the resistances of these resistors are inverted.

Note that since the simultaneous write circuit 110S and the simultaneous comparison circuit 15 have a common part, they are not distinguished by corresponding circuit blocks. Modifications of the circuits 110S and 15 and a modification of the detector 16 correspond to those described in the above embodiments. As for the switching control circuit 251, the resistor R4 may be inserted in series with the drain or source of a transistor Qi in the detector 16. In this case, the resistor R3 can be omitted. A NOR circuit in the detector 16 is arranged to have a multi-stage structure, and switching control circuits 251 may be inserted between the NOR stages.

The principle of the operation of the test circuit 118 is as follows. First, the simultaneous write operation of test data is performed such that the test data $W_1$ is applied to the test data write lines 11 and 12, and the test data write control line 9 is then set at "H" level. In the simultaneous comparison operation of the test data, inverted data of the data $W_1$ is applied to the test data write lines 11 and 12 as expected value data while maintaining the test data write control line 9 at "L" level. When the main and the supplementary memory cells connected to the selected word line include a defective bit, the output from the switching control circuit 251 goes to "H" level, and the output data F from the detector 16 is changed from "L" level to "H" level.

A test method according to the embodiment of the present invention using the redundancy semiconductor memory with the above arrangement will be described with reference to the flow chart shown in FIG. 45. Note that Table 5 summarizes types of input/output data, portions subjected to comparison and defect detection, and memory cells to be tested when the test is conducted in accordance with the flow chart shown in FIG. 45.

TABLE 5

| Circuit to be Tested | Peripheral Circuit | Test Circuit | | Memory Cell Array |
|---|---|---|---|---|
| Input Data | Test Data $W_2$ | Test Data $W_1$ | Inverted Data $W_2$ of $W_1$ | Test Data $W_1$ |
| Output Data | Readout Data R | Comparison | Comparison | Comparison |

TABLE 5-continued

| Circuit to be Tested | Peripheral Circuit | Test Circuit | | Memory Cell Array |
|---|---|---|---|---|
| | | Result F | Result F | Result F |
| Portion to be Subjected to Comparison | Outside Chip | Inside Chip | Inside Chip | Inside Chip |
| Portion to be Subjected to Defect Detection | Outside Chip | Outside Chip | Outside Chip | Inside Chip |
| Memory Cells to be Tested | Memory Cells on Several Lines or more | Memory Cells on One Word Line | | All Memory Cells |

The flow chart shown in FIG. 45 will be briefly described below. First, a test of peripheral circuits (step 351) is executed. If a defect is detected (step 352) and if defect remedy is possible (step 353), a defective portion is substituted with a supplementary line (step 354), and the test of the peripheral circuits is again performed (step 351). The above steps are repeated, and if no defect is detected from the peripheral circuits, a test of the test circuit is performed (step 355). If defect remedy is impossible, the corresponding chip is determined to be defective, and the test is ended (step 362).

In the test of the test circuit, if a defect is detected (step 356), the corresponding chip is immediately determined to be defective (step 362). If no defect is detected, a test of the memory cell array is successively performed (step 357).

In the test of the memory cell array, the presence/absence of defects and possibility of defect remedy are discriminated (steps 358 and 359) in the same manner as in the test of the peripheral circuits. The test is repeated while performing substitution to a supplementary line as needed (step 360). When a result representing no defect is obtained, the corresponding chip is determined to be good (step 361).

As the first feature of this embodiment, tests are separately performed for the peripheral circuits, the test circuit, and the memory cell array. First, the test of the peripheral circuits is performed to detect a defective bit line. As the second feature of this embodiment, the detected defective bit line is substituted to a supplementary bit line before execution of the test of the memory cell array. As the third feature of this embodiment, after or during the tests of the peripheral circuits and the test circuits, if a defect which cannot be subjected to defect remedy is detected, the subsequent test is inhibited, and the corresponding chip is determined to be defective.

Figure 48:
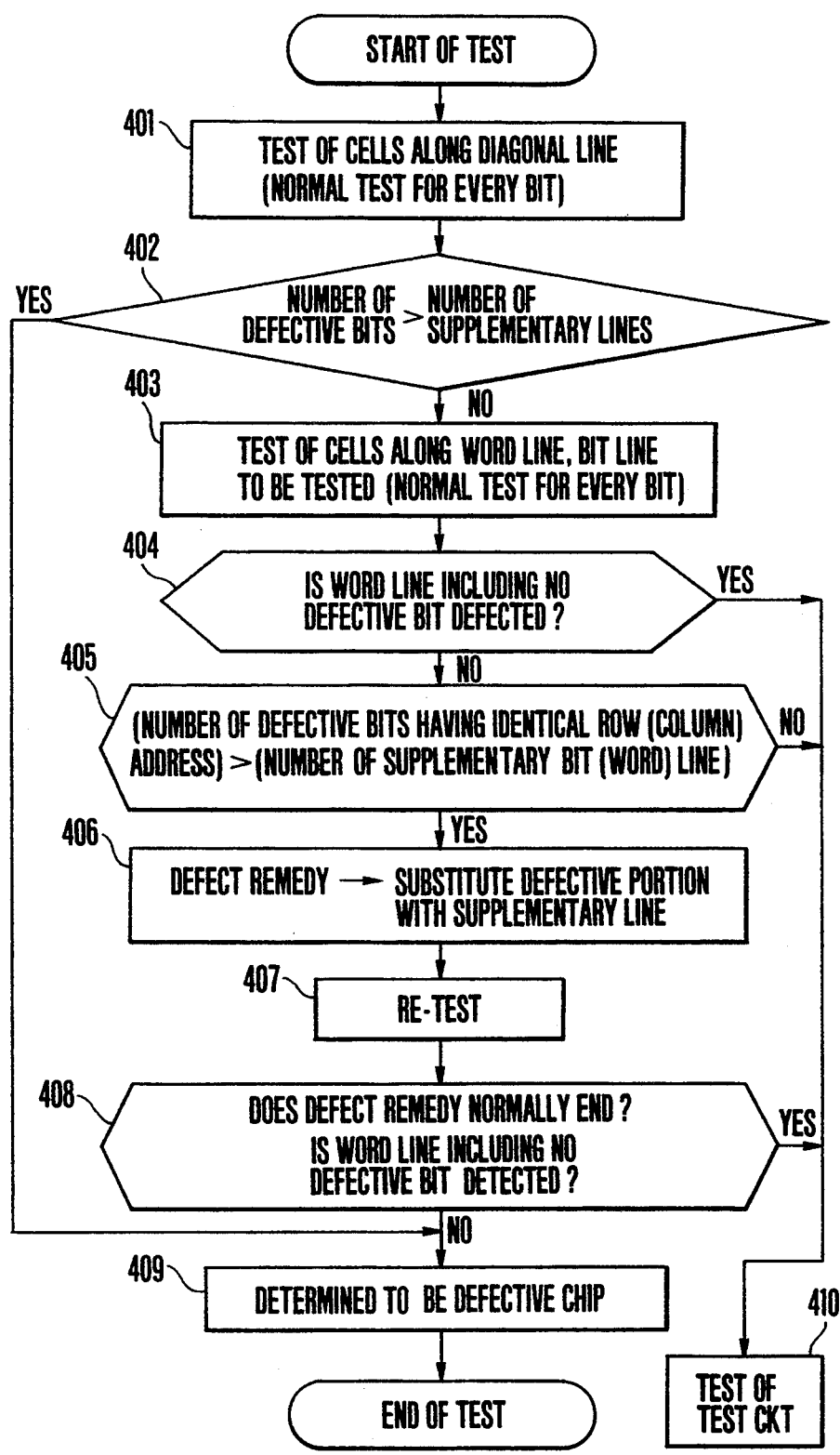
FIG. 48 is a detailed flow chart showing a test flow of a peripheral circuit in FIG. 45.

FIG. 48 is a detailed flow chart of a test flow portion of the peripheral circuits shown in FIG. 45. The test method of the peripheral circuits in the embodiment of FIG. 45 will be described with reference to FIGS. 45 to 48. As has been described above, hatched portions in FIG. 46 correspond to peripheral circuits. The memory cell lines MA, MW, and MB indicated by dots serve as objects to be tested. For a row decoder function inhibit circuit 5'', a supplementary word driver 6', a supplementary row decoder 5', a supplementary sense circuit 7', a supplementary multiplexer 122', a column decoder function inhibit circuit 390, and a supplementary column decoder 132' corresponding to a redundancy circuit, a defect detection is performed during a re-test after substitution to a supplementary line.

A memory cell line selection order at the start of test can be arbitrarily determined. However, it is effective for shortening a test time that the memory cell line MA along the diagonal line in FIG. 46 is first selected, and thereafter, the memory cell line MW along the word line is selected.

In the detailed test method, the test data $W_2$ is applied from the data input circuit 381, so that write access is performed in units of bits in the memory cells along the diagonal line. Thereafter, the readout data R from the data output circuit 382 is transferred to a memory tester outside the chip, and the tester performs comparison with expected value data and defect detection (step 401). If defective bits more than the number of supplementary lines are detected (step 402), defect remedy is impossible, and the corresponding chip is determined to be defective (step 409). Then, the entire test flow is ended. If defective bits having an identical row or column address and more than the number of supplementary bit or word lines are present in all the lines to be tested (step 405), defect remedy by substitution to supplementary lines must be performed. In this case, substitution to supplementary lines is executed (step 406), and a re-test is subsequently performed to check if the defect remedy is normally ended, in particular, if word lines including no defective bits are present (step 408). Even if a defective bit which does not serve as an object in defect remedy is present, if word lines including no defective bits are present and supplementary lines to be substituted are still available (step 404), the test flow of the test circuit is performed (step 410). If defect remedy cannot be normally performed, the corresponding chip is determined to be defective, and the entire flow is ended (step 409).

The row decoder 5 and the word driver 6 as the row peripheral circuits can be subjected to defect detection in a test of the memory cell array (to be described later). Therefore, in the test of the peripheral circuits, the memory cell line MB along the bit line in FIG. 46 can be omitted from lines to be tested.

Figure 49:
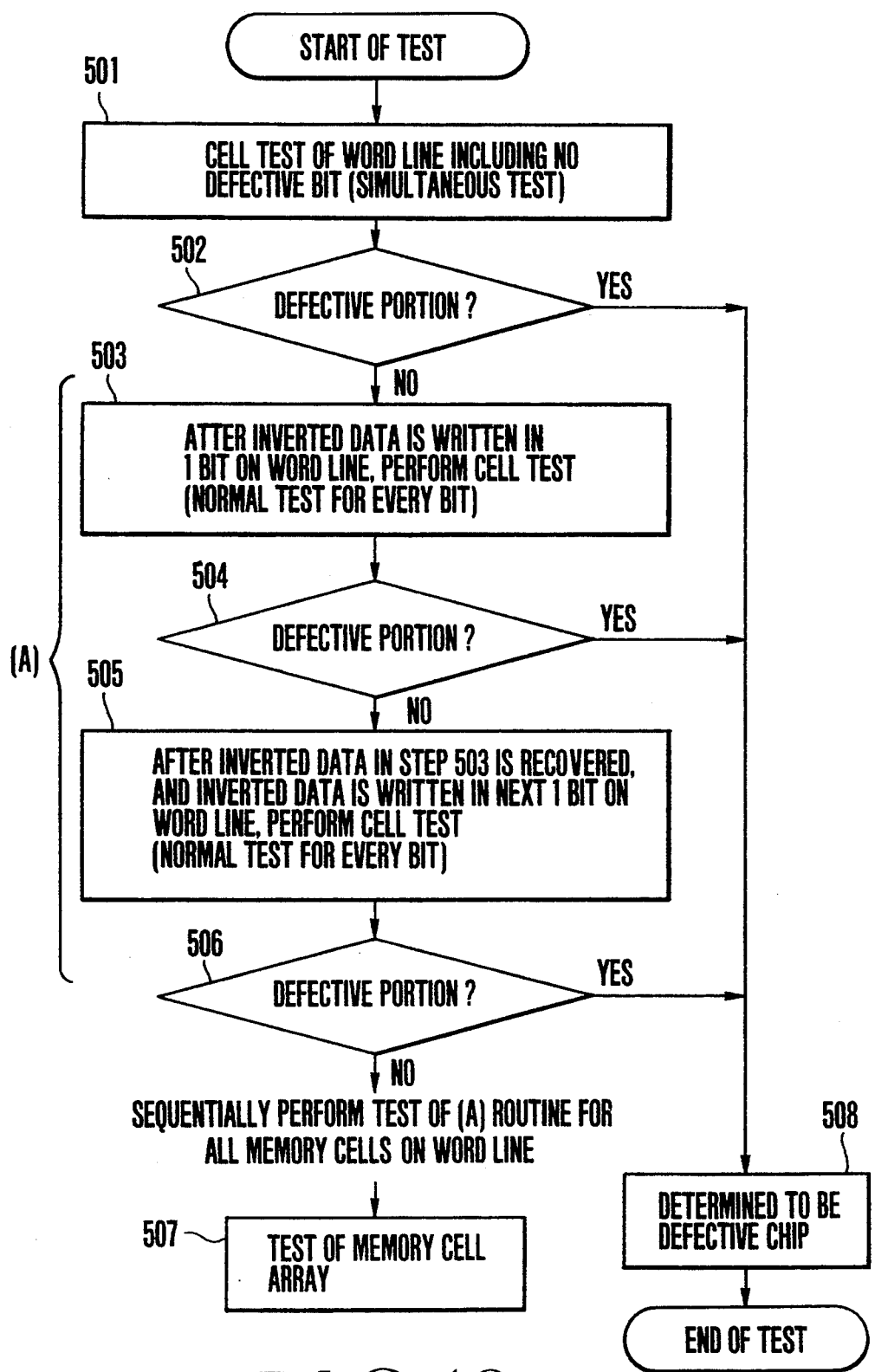
FIG. 49 is a detailed flow chart showing a test flow of the test circuit in FIG. 45.

FIG. 49 shows the test flow of the test circuit in FIG. 45 in detail. The test of the test circuit in the embodiment of FIG. 45 will now be described with reference to FIGS. 45 to 47 and FIG. 49.

First, the test data $W_1$ is written in the memory cells which are confirmed that they do not include defective bits by the test of the peripheral circuits or the supplementary memory cells subjected to substitution through the simultaneous write circuit 110S. Thereafter, the readout data from these memory cells and the expected value data are simultaneously compared by the simultaneous comparison circuit 15. The comparison result F is transferred to the memory tester, and the level of the comparison result F is detected by the tester (step 501). Then, the inverted data $W_2$ of the test data $W_1$ is written from the data input circuit 381 in one bit of the memory cell on the word line. Thereafter, the simultaneous comparison operation between the readout data and the expected value data using the simultaneous comparison circuit 15 is similarly performed, and the level of the comparison result F is detected by the memory tester (step 503).

In this manner, the above simultaneous comparison and detection operations are repeated while sequentially shifting the positions of the memory cells to which the inverted data $W_2$ is written (step 505). If a defect is detected (steps 504 and 506), the corresponding chip is determined to be defective, and the entire test flow is ended (step 508). When a Mb-class redundancy semiconductor memory is to be tested, the test circuit shown in FIG. 47 occupies an area of only 1% or less of the chip area, and a probability of detecting a defect in the test circuit is negligible as compared to that of the memory cell array.

For example, if the chip occupation ratio of the test circuit is 10% or more, and a defect in the test circuit cannot be ignored as compared to other circuits, a method for disconnecting the detector 16 from a portion of the switching control circuit 251 which connects the simultaneous comparison circuit 15 and is associated with a defect in FIG. 47 may be employed. In this case, a re-test is performed to check if a defective portion of the test circuit is removed. If no defective portion is detected, the test flow of the memory cell array is performed (step 507). However, if a defect is again detected and it is determined that the defective portion cannot be disconnected, the corresponding chip is determined to be defective, and the entire test flow is ended.

Figure 50:
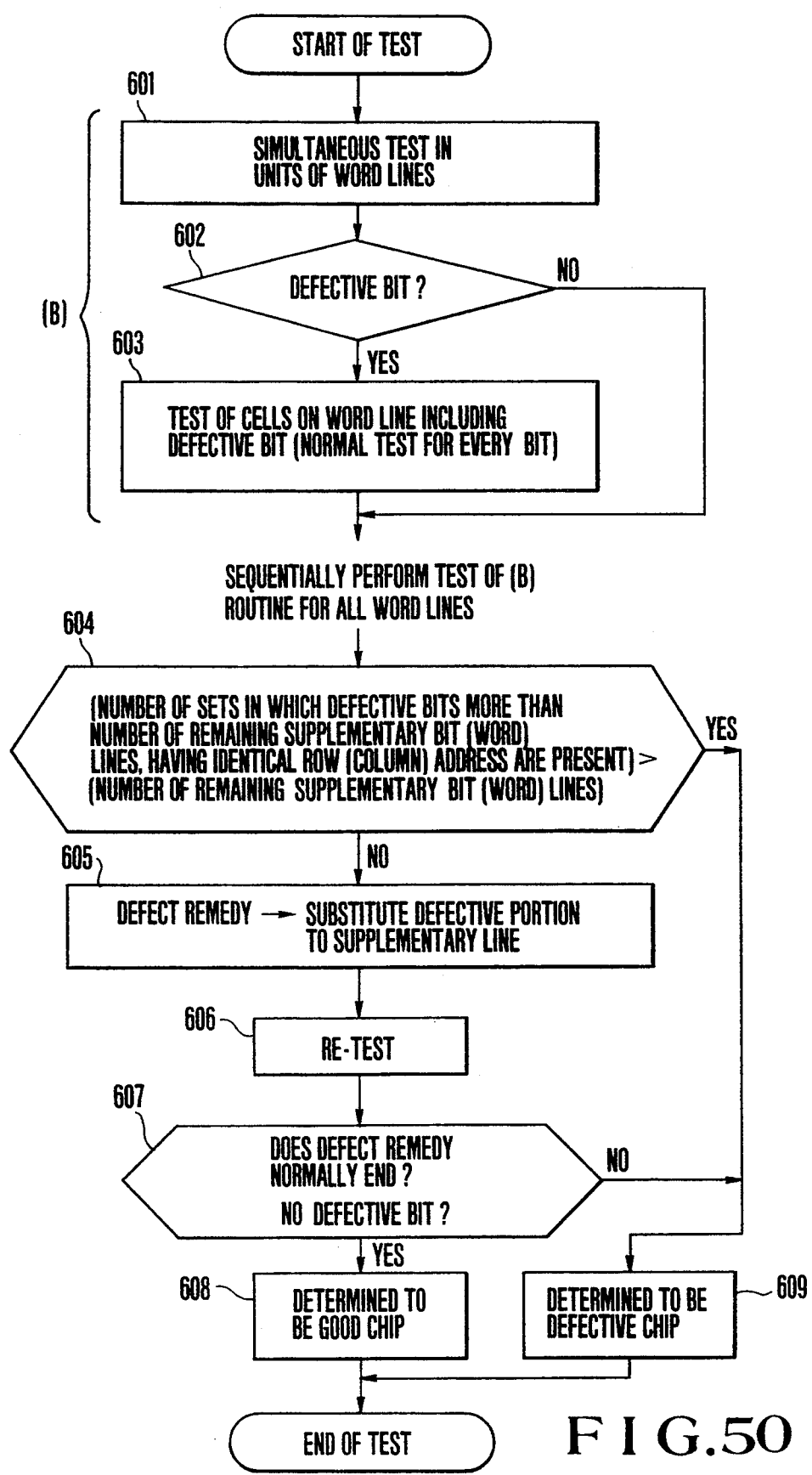
FIG. 50 is a detailed flow chart of a test flow of a memory cell array in FIG. 45.

FIG. 50 shows the test flow of the memory cell array in FIG. 45 in detail. The test of the memory cell array in the embodiment of FIG. 45 will be described with reference to FIGS. 45 to 47 and FIG. 50.

First, the test data $W_1$ is written in all the memory cells on a single word line in the memory cell array 1 through the simultaneous write circuit 110S. Thereafter, the simultaneous comparison with the expected value data of all the memory cells serving as objects is performed using the simultaneous comparison circuit 15. Then, the comparison result F is transferred to the memory tester (step 601). In this case, if the memory cells on the single word line include a defect, the comparison result F goes to "H" level. If the tester detects the level of the comparison result F, and a defect is detected (step 602), a normal test for every bit is again executed for all the memory cells connected to the word line to be tested (step 603).

In this manner, all the memory cells are tested while shifting the positions of word lines to be tested (routine (B)). As a result, if sets in which defective bits having an identical row or column address and more than the remaining number of supplementary bit or word lines are more than the remaining number of the supplementary lines, defect remedy is impossible (step 604). At this time, the corresponding chip is determined to be defective, and the entire test flow is ended (step 609).

On the other hand, if defect remedy is possible, substitution to corresponding supplementary lines is executed (step 605), and a re-test is successively performed (step 606) to check if the defect remedy is normally ended (step 607). If no defective bit is present, the defect remedy of the corresponding chip is successful, and the good chip is obtained. If a defective bit is again detected, the corresponding chip is determined to be defective. Note that in the test of the test circuit, when a portion of the switching control circuit 251 associated with a defect is disconnected, the memory cells on the bit line connected to the disconnected portion do not serve as objects for the simultaneous test. Therefore, in this case, in the test of the memory cell array, the test for every bit while fixing an associated column address is performed as well as the simultaneous test.

According to the embodiment of the present invention shown in FIG. 46 described above, the test of the peripheral circuits is first performed to remedy defective bit lines. Thereafter, a simultaneous test in units of word lines is performed, and a normal test for every bit can be performed for a word line including a defective bit. As test data in these test methods, any of an N pattern, an $N^2$ pattern, an $N^{3/2}$ pattern may be used. However, in a mass production process of a large-capacity redundancy arrangement semiconductor memory, N pattern test data is mainly used in order to prevent an increase in test time regardless of a conventional test method and a test method of the present invention.

In the embodiment shown in FIG. 46, N pattern test data having different defect detection capabilities, i.e., "MSCAN" or "CHECKERBOARD" having a data length 4N and "MARCHING" having a data length 10N, are used. Therefore, a test time can be greatly shortened while maintaining the same defect detection capabilities as that of the conventional test method.

The total test data length of this embodiment is substantially proportional to $N^{\frac{1}{2}}$. In the test of the memory cell array, the number of word lines for re-executing a normal test for every bit is small, i.e., about 1/100 that of the total number of word lines in the array. As a result, a portion of the test data length proportional to N is about 1/10 a portion proportional to $N^{\frac{1}{2}}$. A time required for substitution corresponding to several supplementary lines is short, i.e., 1 to 2 sec. On the other hand, the test data length according to the conventional test method is proportional to N/n (n: the number of memory cells which can be simultaneously tested). Therefore, when a redundancy semiconductor memory having an integration scale of 16 Mb or larger is to be tested, a test time in this embodiment for a chip, which is already subjected to substitution to supplementary lines in the test of the peripheral circuits and is determined such that its defect remedy is impossible, can be shortened to one several fractions of the time required for the conventional test method. For a chip for which defect remedy is possible, a test time of this embodiment can be greatly reduced to 1/10 to 1/100 that of the conventional method. In the above description, the write, read, and comparison operations are successively performed in units of Word line. However, in accordance with the types of test data, after the write operation is performed for all the word lines, the read and comparison operations may be sequentially performed for each word line.

In the above embodiment of the present invention, the chip is divided into three parts, i.e., the peripheral circuits, the test circuit, and the memory cell array, and tests are carried out in correspondence thereto. However, the scope of the present invention also includes a method wherein a chip is divided into two parts, i.e., peripheral circuits and other circuits, and tests are carried out in correspondence thereto.

Figure 51:
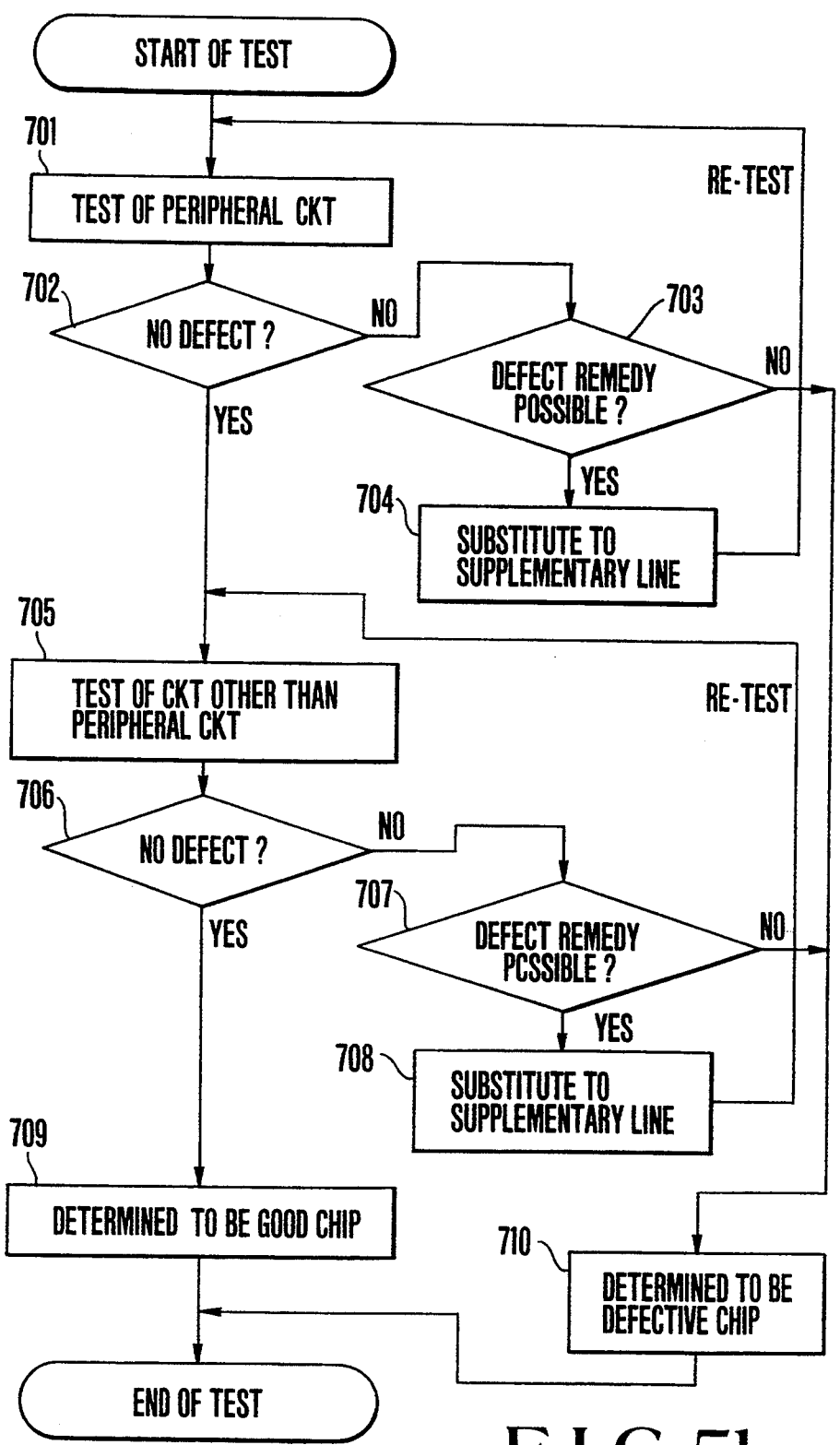
FIG. 51 is a flow chart showing a test method according to still another embodiment of the present invention.

FIG. 51 is a flow chart showing still another embodiment of the present invention. This embodiment is associated with a method wherein a redundancy semiconductor memory is divided into two parts, i.e., peripheral circuits and other circuits, and tests are carried out in correspondence therewith. Table 6 summarizes the types of input/output data, portions subjected to comparison and defect detection, and memory cells to be tested when the tests are carried out in accordance with the flow chart of this embodiment.

TABLE 6

| Circuit to be tested | Peripheral Circuit | Other than Peripheral Circuit |
|---|---|---|
| Input Data | Test Data $W_2$ | Test Data $W_1$ |
| Output Data | Readout Data R | Comparison Result F |
| Portion to be Subjected to Comparison | Outside Chip | Inside Chip |
| Portion to be Subjected to Defect Detection | Outside Chip | Inside Chip |
| Memory Cells to be Tested | Memory Cells on Several Lines or more | All Memory Cells |

A detailed test method of this embodiment corresponds to that in the embodiment shown in FIG. 46 excluding that a test of the test circuit is not independently performed but is included in the test of the memory cell array. Therefore, a description thereof will be omitted. In this embodiment, the effect of shortening a test time and modifications of a circuit configuration are the same as those in the embodiment shown in FIG. 46.

In the above embodiments, a simultaneous test in units of word lines has been exemplified. However, the present invention does not limit the unit of the simultaneous test. Therefore, a plurality of memory cells connected to a word line can be employed as a unit of the simultaneous test. If a plurality of word lines or supplementary word lines are multiple-selected, test data can be simultaneously written in all the memory cells in the memory cell arrays by several write operations. This method is also included in the present invention.

The present invention is not limited to the memory cell array arrangement in the redundancy semiconductor memory. For example, the present invention can be applied to an arrangement, in which a memory cell array is divided into a plurality of blocks. The present invention can also be applied to a semiconductor memory having only a row or column redundancy circuit. Furthermore, the present invention is not limited to a DRAM as a semiconductor memory having a redundancy arrangement but can be similarly applied to a static RAM, a ROM, and the like.

According to the test method of the redundancy semiconductor memory according to the embodiments shown in FIGS. 45 to 51, since the memory is divided into the peripheral circuits and other circuits (test circuit and memory cell array) and tests are carried out in correspondence therewith. Therefore, the peripheral circuits are tested beforehand to remedy a defective bit line, and thereafter, a word line including a defective bit is tested for every bit, thereby greatly reducing a test time. Since the peripheral circuits are tested in advance, a chip whose defect remedy is impossible can be detected fast, and a test time can also be shortened in this point of view.

Figure 53:
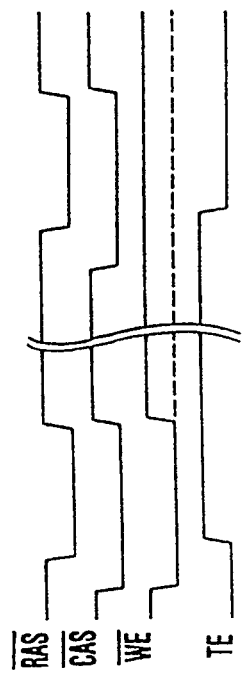
FIG. 53 is a timing chart showing changes in conventional clocks in association with setting and canceling of a test mode.
Figure 52B:
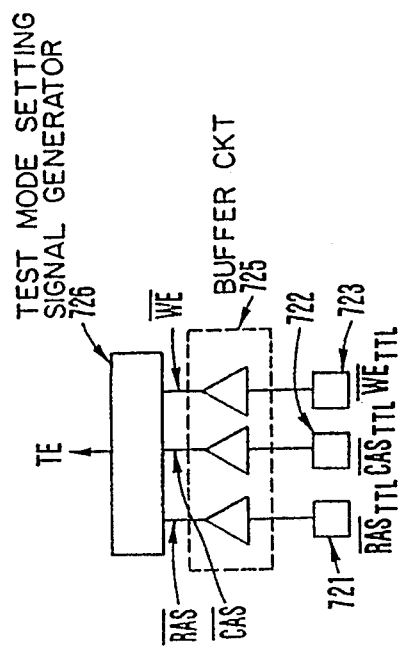
FIG. 52 is a diagram showing an arrangement according to still another embodiment of the present invention.
Figure 52A:
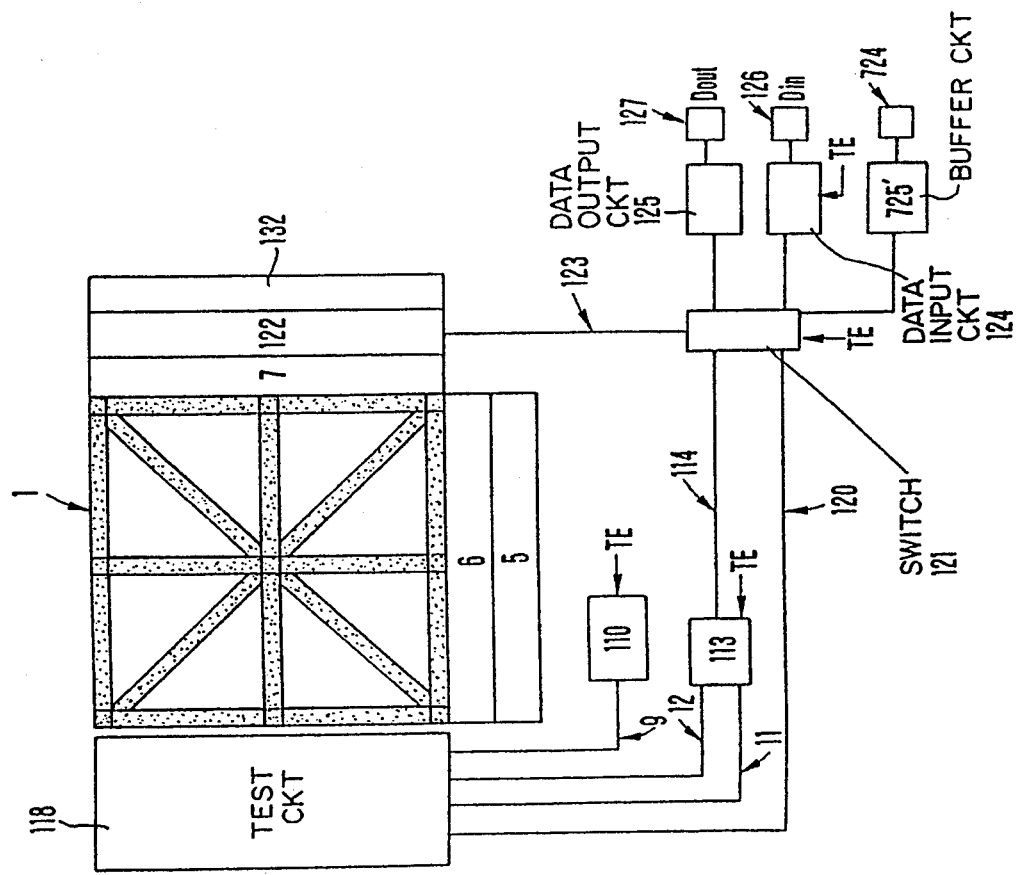

FIG. 52 shows still another embodiment of the present invention. The same reference numerals in this embodiment denote the same parts as in the above embodiments. In FIG. 52, reference numerals 721 to 723 denote input terminals for fundamental clocks $\overline{RAS}_{TTL}$, $\overline{CAS}_{TTL}$, and $\overline{WE}_{TTL}$ of a semiconductor memory; 724, an input terminal for a write identification signal of test data. The input terminal 724 is a terminal which can be commonly used in the semiconductor memory, e.g., an address input terminal. Reference numerals 725 and 725' denote buffer circuits; and 726, a test mode setting signal generator. Note that in FIG. 52, $\overline{RAS}_{TTL}$ and $\overline{CAS}_{TTL}$ are externally applied row and column fundamental clocks of the semiconductor memory, $\overline{WE}_{TTL}$ is an externally applied write control clock. TE represents a test mode setting signal, which is generated when the fall timings of the clocks $\overline{CAS}$ and $\overline{WE}$ are faster than that of the clock $\overline{RAS}$, and is canceled when the clock $\overline{WE}$ is kept at "H" level and the fall timing of the clock $\overline{CAS}$ is faster than that of $\overline{RAS}$, as shown in FIG. 53. The signal TE is normally maintained at "H" level until the canceling cycle of the test mode is executed. Instead, the signal TE may be kept generated so as to distinguish the setting of the write mode from that of the read mode. The signal TE serves as a control signal for a switch 121 and the like, and performs setting of a signal transmission path during a test. The transition timings of the clocks $\overline{RAS}$, $\overline{CAS}$, and $\overline{WE}$ shown in FIG. 53 are known to those who are skilled in the art, and are described in Nikkei Micro Device extra issue No. 1 "Whole Aspect of 4M DRAM" (May, 1987, pp. 73–80). Lines painted in black in the memory cell array 1 indicate memory cell arrays serving as objects in a test of peripheral circuits (to be described later).

In FIG. 52, the detailed arrangement of the test circuit 118 is the same as that in the above-mentioned embodiments, and a detailed description thereof will be omitted. The test mode setting signal generator 726 is a circuit for detecting the transition timings of the clocks $\overline{RAS}$, $\overline{CAS}$, and $\overline{WE}$ determined by the JEDEC, and can be realized by a known arrangement. In the circuit arrangement in which data input and output circuits are separated, as shown in FIG. 52, latching of test data need not always be performed. Therefore, an arrangement from which the latch circuit 113 is omitted also belongs to the scope of the present invention.

The test flow according to the embodiment shown in FIG. 52 is the same as that of FIG. 9. Note that the peripheral circuits correspond to a circuit portion excluding the test circuit and the memory cell array. In this test flow, if a defect is detected as test results of the peripheral circuits and the test circuit, the tests of the test circuit and thereafter or the test of the memory cell array are not performed, and all the remaining tests are inhibited.

FIGS. 54(a) to 54(c) are timing charts of the embodiment shown in FIG. 52 when the all the tests are carried out in accordance with the flow chart shown in FIG. 9. FIG. 54 shows the relationships of level determination between the fundamental clocks $\overline{RAS}$, $\overline{CAS}$, and $\overline{WE}$, the write identification signal, a latch input signal 114, a test result output line 120, a data line 123 in the write and read modes. FIG. 54(a) corresponds to a test of the peripheral circuits, FIG. 54(b) corresponds to a test of the test circuit, and FIG. 54(c) corresponds to a test of the memory cell array. In FIG. 54, hatched portions indicate arbitrary level periods of the respective lines. On the other hand, portions excluding the hatched portions indicate periods during which levels of the respective lines must be determined. Wa and Ra respectively indicate write and read mode cycles in which signals propagate only through the data line 123 in FIG. 52. This signal transmission path will be referred to as an A path hereinafter. The operation modes during the cycles Wa and Ra are the same as those in the normal write and read modes of the memory, and a setting cycle for the A path is not particularly required. Wb and Rb respectively indicate write and read mode cycles during which signals propagate through the latch input line 114 and the test result output line 120 in FIG. 52. This signal propagation path will be referred to as a B path hereinafter. A switching operation from the A path to the B path requires a cycle of setting a path. In FIG. 54(b), when the fall timings of the clocks $\overline{CAS}$ and $\overline{WE}$ are faster than that of the $\overline{RAS}$, and the write identification signal is set at "H" level, the B path is set. After a series of cycles consisting of the cycles Wb and Rb is completed, routing is canceled. In the canceling cycle, the clocks $\overline{RAS}$, $\overline{CAS}$, and $\overline{WE}$ are set in the same manner as in FIG. 53. A C path in FIG. 54(b) is a signal propagation path when the write mode cycle corresponds to Wa and the read mode cycle corresponds to Rb. The C path is set when the fall timings of the clocks $\overline{CAS}$ and $\overline{WE}$ are faster than that of the clock $\overline{RAS}$, and the write identification signal is set at "L" level. Upon completion of a series of cycles consisting of Wa and Rb, routing is canceled. Note that the voltage levels of the write identification signal in the B and C routing modes may be reversed. In the test flow described above, the write and read modes can be alternately executed. Instead, after a series of write mode operations is completed, the read mode may be executed. In this embodiment, the canceling cycles of the B and C paths may be omitted.

An embodiment of a test method according to the embodiment shown in FIG. 52 will be described below. A test of the peripheral circuits is performed for memory cell lines which are painted in black in the memory cell array 1 in FIG. 52. The timing chart in this case corresponds to FIG. 54(a). More specifically, the transition timings of the clocks $\overline{RAS}$, $\overline{CAS}$, and $\overline{WE}$ are set in a normal operation mode, and test data is applied to the data input terminal 126 shown in FIG. 52. The test data is written in one bit of the memory cell selected by a row decoder 5 and a column decoder 132 through a data input circuit 124, a switch 121, the data line 123, and a multiplexer 122. On the other hand, the written test data is read out to a data output terminal 127 through the multiplexer 122, the data line 123, the switch 121 and a data output circuit 125. The readout data is transferred to a tester outside the semiconductor memory, and is compared with expected value data thereby. The above operations are repeated while sequentially shifting the positions of memory cells in the memory cell line serving as an object to be tested. The semiconductor memory which is determined to be defective by the tester is excluded from a series of test flows. If the semiconductor memory is determined to be good, the first-half test flow of the test circuit is performed through the setting cycle of the B path. The timing chart in this case corresponds to FIG. 54(b). Test data is simultaneously written in all the memory cells on a single word line serving as the object in the test of the peripheral circuits. The written test data is simultaneously compared with expected value data input to the test circuit 118 through the latch input line 114, the latch circuit 113, and test data write lines 11 and 12. The test result is read out to the data output terminal 127 through the test result output line 120, the switch 121, and the data output circuit 125. The test result is transferred to the tester, and its voltage level is detected by the tester. If a test result indicating the test circuit is not defective is output, the second-half test flow for the test circuit is performed via the setting cycle of the C path. Inverted data of the test data which is simultaneously written in the first-half test flow of the test circuit is written in one bit of the memory cell on the single word line. The test result, i.e., a comparison result with the expected value data is transferred to the tester, and its voltage level is detected by the tester. The above operations are repeated while sequentially shifting the positions of the memory cells, to which the inverted data is written on the word line. When the test circuit does not output a defect detection result, the corresponding semiconductor memory is excluded from the series of test flows. On the contrary, when the test circuit outputs a defect detection result, control enters the test flow of the memory cell array via the setting cycle of the B path. The timing chart in this case corresponds to FIG. 54(c). First, test data is simultaneously written in all the memory cells on a word line selected by the row decoder 5 through the latch input line 114, the latch circuit 113, the test data write lines 11 and 12, and the test circuit 118. On the other hand, the written test data is simultaneously compared with expected value data input to the test circuit 118 through the latch input line 114, the latch circuit 113, and the test data write lines 11 and 12. The test result is read out to the test data output terminal 127 through the test result output line 120, the switch 121, and the data output circuit 125. Furthermore, the test result is transferred to the tester, and its voltage level is detected by the tester. The above operations are repeated while shifting the positions of the word lines. When the detection result indicating that a defective bit is detected is output, the corresponding semiconductor memory is excluded from the series of test flows. On the contrary, when the detection result indicating that no defective bit is detected is output, the corresponding semiconductor memory is determined to be good. The test mode is canceled by the cycle shown in FIG. 54(c).

As described above, according to the embodiment of FIG. 52, since simultaneous write and comparison operations of test data can be performed in units of word lines, a test time can be shortened to 1/n that of the test for every bit of a memory cell. In this case, n indicates the number of memory cells connected to a word line and subjected to the simultaneous write and comparison operations, and normally takes a large value, e.g., 500 or 1000 or more. Since the test mode can be set and canceled in accordance with the transition timings of the clocks $\overline{RAS}$, $\overline{CAS}$, and $\overline{WE}$, and the voltage level of the write identification signal, the test order in the test flow shown in FIG. 9 can be easily modified, and test efficiency can be improved.

FIGS. 55(a) to 55(k) are detailed timing charts of a test of the memory cell array according to the embodiment of FIG. 52. Reference numerals in FIGS. 55(a) to 55(k) correspond to those in FIG. 52.

The test of the memory cell array will be described with reference to FIG. 52 and FIGS. 55(a) to 55(k). A simultaneous write operation of test data in units of word lines is performed as follows. The clocks $\overline{RAS}$ and $\overline{WE}$ shown in FIGS. 55(a) and 55(c) go to "L" level, and the semiconductor memory is thus set in the write mode. Then, a precharge clock signal $\phi_P$ shown in FIG. 55(d) goes to "L" level, and thereafter, the row decoder 5 is operated to select a single word line. A word line drive clock signal shown in FIG. 55(e) is then set at "H" level to operate a word driver 6, thereby setting the selected word line at "H" level. After data from all the memory cells connected to the selected word line appear on the bit lines, a sense circuit drive clock signal shown in FIG. 55(f) is set at "H" level to operate the sense circuit 7. After the voltage levels of the bit lines are determined upon operation of the sense circuit 7, "H"- or "L"-level data corresponding to the test data is applied to the test data write lines 11 and 12, as shown in FIG. 55 (g). In this case, the test data is input from the data input terminal 126 during an "L"-level period of the clock $\overline{WE}$. As shown in FIG. 55(h), a test data write control line 9 is set at "H" level, and the voltage level corresponding to the test data is applied to the bit lines. In this case, the selected word line is kept at "H" level, and therefore, the simultaneous write operation of test data in units of word lines can be performed. During the simultaneous write operation, the data voltage level of the data output terminal 127 shown in FIG. 55(k) corresponds to a high impedance.

A simultaneous comparison sequence in units of word lines will be described below. At a timing when the clock $\overline{RAS}$ shown in FIG. 55(a) goes to "L" level, the expected value data from the data input terminal 126 shown in FIG. 55(j) is latched by the latch circuit 113. Thereafter, the same operation as in the write operation is performed until a timing at which the sense circuit 7 is operated. After the voltage levels of the bit lines are determined, the expected value data latched by the latch circuit 113 is supplied to the test data write lines 11 and 12. At this time, the test data write control line 9 is held at "L" level. As a result, if the readout data from the memory cell is erroneous data, the test result output line 120 shown in FIG. 55(i) goes from "L" level to "H" level. Therefore, upon observation of a change in voltage level appearing at the data output terminal 127, it can be selected that the memory cells connected to the selected word line include a defective bit. This state is shown in FIG. 55(k). In FIG. 55(k), "H" level indicates that a defective bit is detected, and "L" level indicates that all the bits are good or the write operation is being performed.

Figure 56:
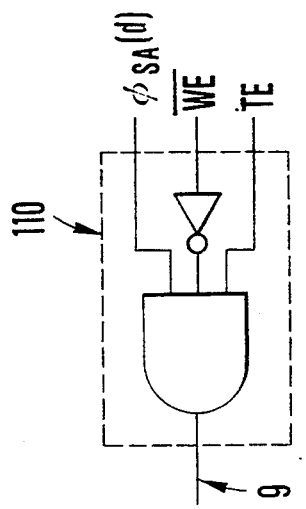
FIG. 56 is a circuit diagram showing a test data write control circuit in FIG. 52.

FIG. 56 shows an arrangement of a test data write control circuit 110 shown in FIG. 52. In FIG. 52, $\phi_{SA}(d)$ indicates a delay signal of the sense circuit drive clock signal, and sets a timing at which the test data write control line 9 goes to "H" level. The test mode setting signal TE is applied so as not to erroneously perform simultaneous write operation of test data in the test of the peripheral circuits and the second-half test of the test circuit. Note that in the test of the memory cell array, in order to set timings for starting and ending the write and read operations of the test data for all the word lines inside the semiconductor memory, output data to be used as a control signal from an address counter is input to the test data write control circuit 110.

Figure 57:
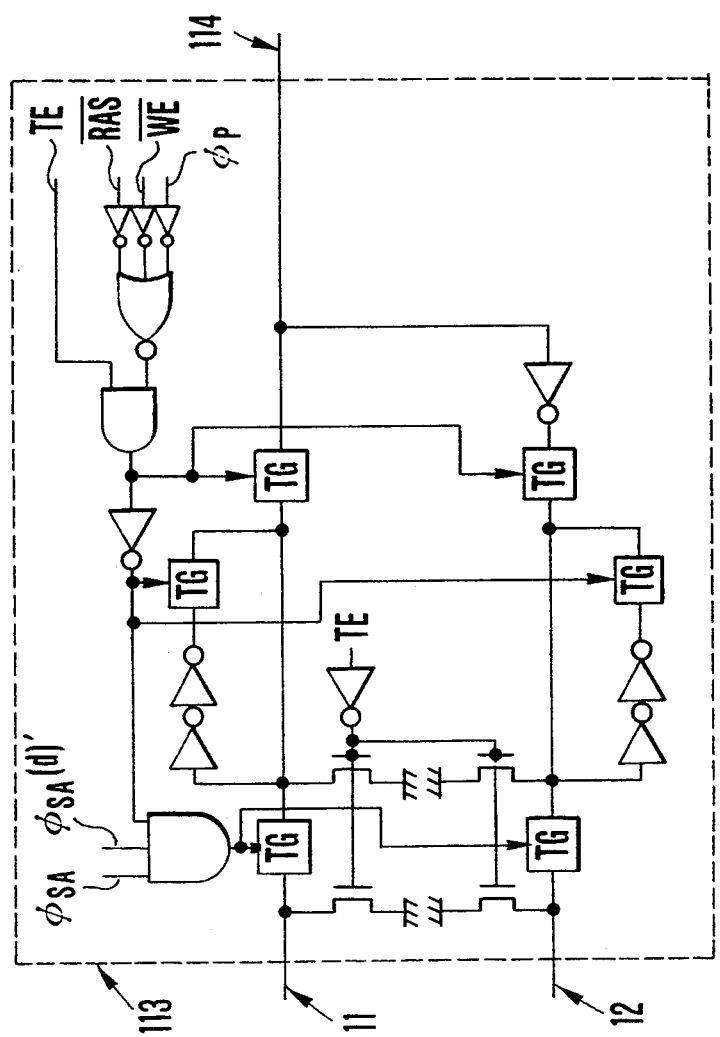
FIG. 57 a circuit diagram showing an arrangement of a latch circuit shown in FIG. 52.

FIG. 57 shows an arrangement of the latch circuit 113. In FIG. 57, TG indicates a transfer gate. Data is latched by the transfer gate TG and two inverters. When an input signal indicated an arrow is at "H" level, the transfer gate TG is turned on. Data is latched at a timing at which the clock $\overline{RAS}$ is changed from "H" level to "L" level during the read operation. The latched data is sent to the test data write lines 11 and 12 at a timing at which a signal $\phi_{SA}(d)'$ goes from "L" level to "H" level. In this case, the signal $\phi_{SA}(d)'$ is a delay signal of the sense circuit drive signal, and its delay amount is smaller than that of the signal $\phi_{SA}(d)$ applied to the test data write control circuit 110.

Figure 58:
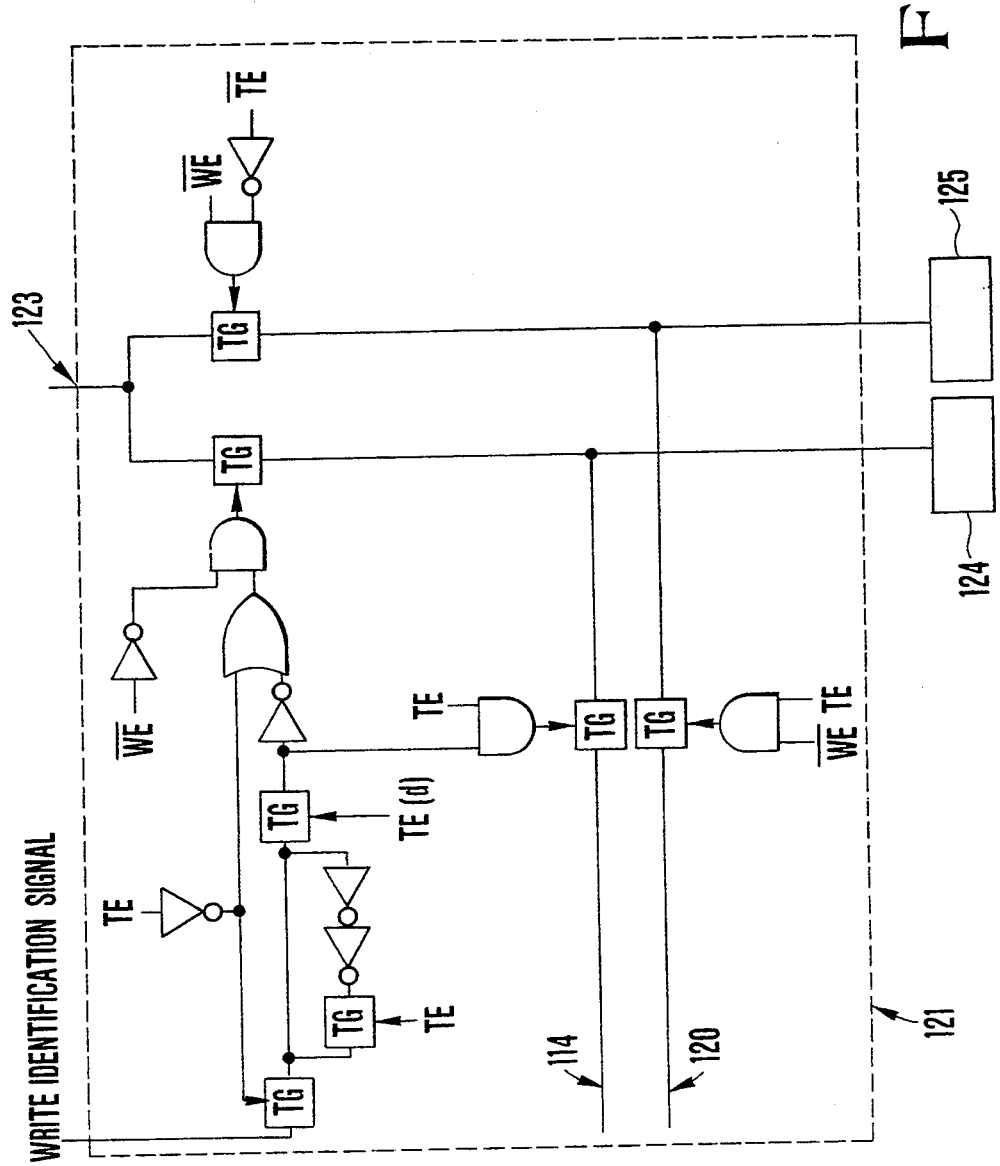
FIG. 58 a circuit diagram of an arrangement of a switch shown in FIG. 52.

FIG. 58 shows an arrangement of the switch 121 shown in FIG. 52. The signal propagation paths are set using the test mode setting signal TE, the write control signal $\overline{WE}$. The B and C paths are set using an output from a circuit for latching the write control signal under the control of the test mode setting signal TE and its delay signal TE(d). In FIG. 58, reference symbols TG denote transfer gates, which are turned on when input signals indicated by arrows are at "H" level, respectively.

The data input circuit 124 shown in FIG. 52 can be arranged as shown in FIG. 17. More specifically, the data input circuit 124 adopts an arrangement capable of fetching expected value data from the data input terminal 126 in the read operation in the test of the memory cell arrays.

The embodiment shown in FIG. 52 can adopt an I/O COMMON structure shown in FIG. 18. In this case, the timing chart therefor is the same as that in FIG. 19. An arrangement of the switch 133 when the structure in FIG. 18 is employed is shown in FIG. 20.

Figure 59:
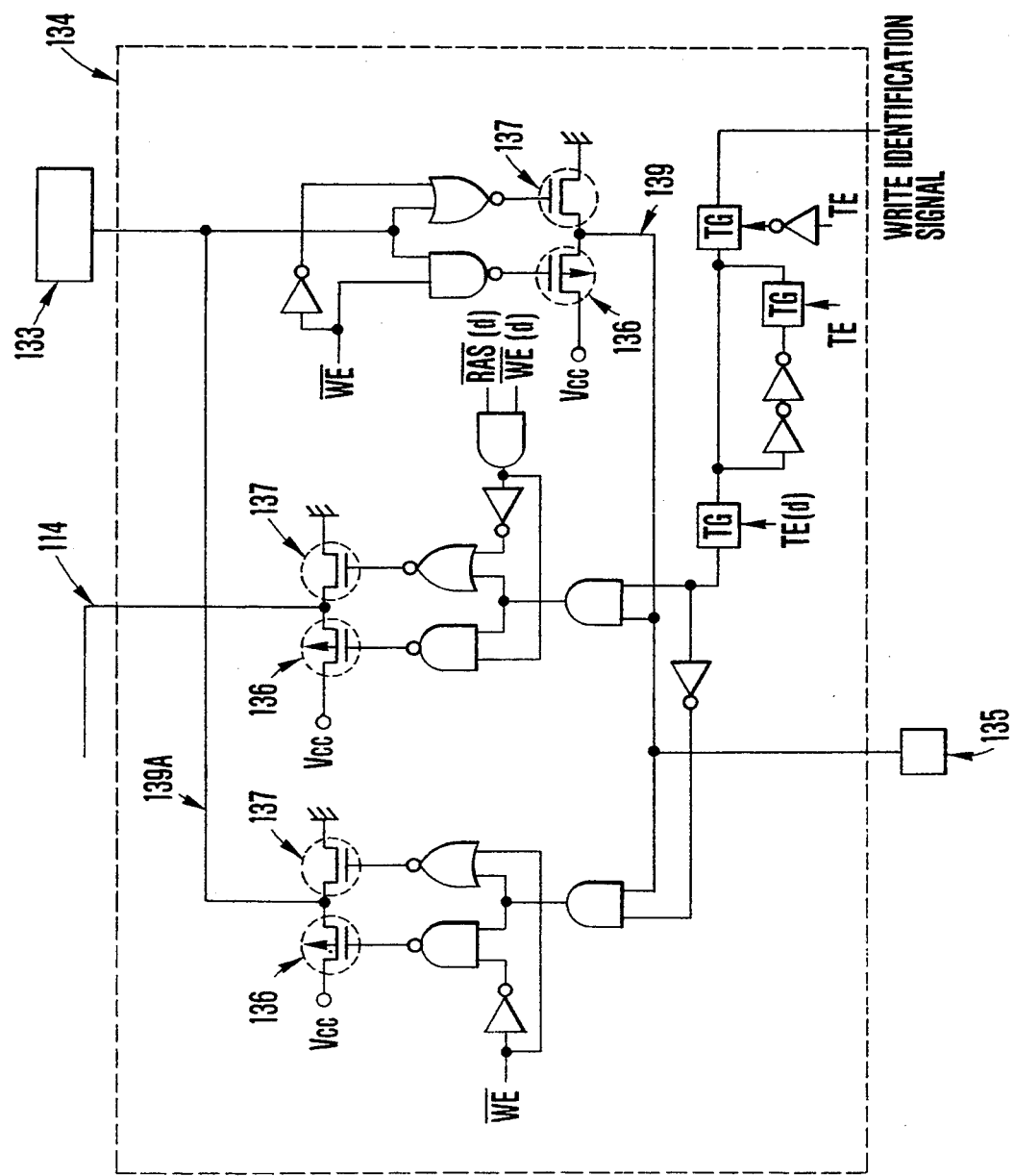
FIG. 59 is a circuit diagram showing another arrangement of a data input/output circuit.

FIG. 59 shows an arrangement of a data input/output circuit 134 shown in FIG. 18. This arrangement is shown in correspondence with FIG. 21, in which $\overline{RAS}(d)$ and $\overline{WE}(d)$ are delayed signals of the clocks $\overline{RAS}$ and $\overline{WE}$, and serve to set the latch input line 114 in a floating state after the expected value data is latched by the latch circuit 113. Reference numerals 136 denote PMOS transistors; and 137, NMOS transistors. These transistors serve to realize floating of the latch input line 114, floating of a signal line 139A during a test data readout operation, and floating of a signal line 139 in a test data write operation in accordance with outputs from corresponding NAND circuits and corresponding NOR circuits which receive $\overline{WE}$, $\overline{WE}(d)$, $\overline{RAS}(d)$, and the like.

FIG. 60 shows an arrangement according to still another embodiment of the present invention, and the same reference numerals herein denote the same parts as in the above embodiments. In this embodiment, the present invention is applied to a semiconductor memory having a redundancy structure for defect remedy. In FIG. 60, reference numeral 1' denotes a main memory cell array; 1'', a supplementary memory cell array; 6', a supplementary word driver; 7', a supplementary sense circuit; 122', a supplementary multiplexer; and 118, a test circuit, which has a circuit arrangement capable of performing simultaneous write and detection operations of test data in units of word lines, and switching part of the test circuit connected to a defective bit line pair to part of a supplementary test circuit 118A connected to a supplementary bit line pair. The supplementary test circuit 118A has a circuit arrangement so that when only the test circuit 118 is operated, the circuit 118A does not execute a defect detection operation, and when remedy of the defective bit lines is performed, the circuit 118A is operated together with the test circuit 118. Reference numerals 5'' and 5' denote a decoder function inhibit circuit and a supplementary decoder, respectively, which disable defective lines during defect remedy, and discriminate defective line selection. Arrays painted in black in the main memory cell array 1' are memory cell lines serving as objects in the test of the peripheral circuits. Arrays indicated hatched portions extending in the memory cell array 1'' are memory cell lines serving as objects for simultaneous write and read operations of test data at the same time with the above-mentioned memory cells during a test. Unless remedy of defective bit lines is performed, readout data from the memory cell lines indicated by hatched portions do not serve as objects for defect detection operation in the supplementary test circuit 118A. Note that other reference numerals correspond to those in FIG. 53. The decoder function inhibit circuit 5″ and the supplementary decoder 5′ can be realized by known arrangements. The present invention also includes use of other means associated with defect remedy.

A flow chart of a test according to the embodiment shown in FIG. 60 is shown in FIG. 45. This flow chart has the following two features. The first feature is a test order aiming at fast detection of a chip for which defect remedy cannot be performed, and fast forming of a fail bit map. More specifically, in the test of the memory cell array, a simultaneous test is performed in units of word lines using the test circuit shown in FIG. 60, and a normal test for every bit is performed for a bit line which is determined to include a defective bit in accordance with the test result. When the entire memory cell on the bit line is detected to be defective due to defective peripheral circuits, a test for every bit must be performed for all the word lines, and a test time cannot be shortened. Therefore, the test of the peripheral circuits is first performed to detect a defective bit line, and substitution to a supplementary bit line is performed before execution of a test of the test circuit. The second feature of this flow chart is as follows. When it is determined in the test of the peripheral circuits or the test circuit that defect remedy is impossible, the subsequent tests, e.g., the test of the test circuit or memory cell array, are not executed, and all the remaining tests are inhibited.

The relationship of level determination between the fundamental clocks $\overline{RAS}$, $\overline{CAS}$, and $\overline{WE}$, the write identification signal, a latch input line 114, a test data output line 120, and a data line 123 can be expressed in the same manner as in FIG. 54. In addition, the test mode setting signal TE can be generated and canceled in accordance with the timing chart shown in FIG. 53.

A test according to the embodiment shown in FIG. 60 will be described with reference to FIGS. 54(a) to 54(c), 60, and 45. First, test data is applied from a data input terminal 126 for memory cell lines which are painted in black in FIG. 60 in accordance with a timing shown in FIG. 54(a), thus performing the test of the peripheral circuits. The test data is written in one bit of the memory cell selected by a row decoder 5 and a column decoder 132 through a data input circuit 124, a switch 121, the data line 123, and a multiplexer 122. On the other hand, the written test data is read out to a data output terminal 127 through the multiplexer 122, the data line 123, the switch 121, and a data output circuit 125. The readout data is transferred to a tester outside the semiconductor memory, and is compared with expected value data by the tester. The above operations are repeated while sequentially shifting the positions of memory cells in the memory cell line serving as an object to be tested. When the tester detects defective bits at different row and column addresses the numbers of which are larger than the number of supplementary lines, the corresponding semiconductor memory is determined to be defective, and is excluded from the series of test flows. On the other hand, when defect remedy is possible by substitution to supplementary lines and word lines including no defective bits are obtained by the re-test, control advances to the first-half test flow of the test circuit via the setting cycle of the B path. In this case, the test data is simultaneously written in all the memory cells including the supplementary memory cells on one word line serving as the object in the test of the peripheral circuits. The written test data is simultaneously compared with expected value data input to the test circuit 118 and the supplementary test circuit 118A through the latch input line 114, the latch circuit 113, and the test data write lines 11 and 12. When substitution to supplementary bit lines is performed by the test of the peripheral circuits, part of the test circuit 118 connected to the defective bit line pair is disconnected from other parts thereof. Therefore, a defect detection operation is executed excluding a defective portion subjected to defect remedy. The test result is read out to the data output terminal 127 through the test result output line 120, the switch 121, and the data output circuit 125. The test result is transferred to the tester, and its voltage level is detected by the tester. If the test result indicating that a defective test circuit is detected is output, the corresponding semiconductor memory is excluded from the series of test flows. On the contrary, if the test result indicating no defect is output, control enters the second-half test flow for the test circuit via the setting cycle of the C path. In this flow, inverted data of the test data simultaneously written in the first-half test flow of the test circuit is written in one bit of the main and supplementary memory cells on the one word line selected by the column decoder 132 through the data line 123 and the multiplexer 122. The test result, as a comparison result with the expected value data, is transferred to the tester, and its voltage level is detected by the tester. The above operations are repeated while shifting the position of the memory cell., to which the inverted data is written, on the word line. When a detection result of a defective bit is not output due to a functional error of the test circuit, the corresponding semiconductor memory is excluded from the series of test flows. On the contrary, if a defect detection result is output, the setting cycle of the B path is again executed, and control enters the test flow of the memory cell array, as shown in FIG. 54(c). The test data is simultaneously written in all the memory cells including the supplementary memory cells on the word line selected by the row decoder 5 through the latch input line 114, the latch circuit 113, test data write lines 11 and 12, the test circuit 118, and the supplementary test circuit 118A. On the other hand, the written test data is simultaneously compared with expected value data input to the test circuit 118 and the supplementary test circuit 118A through the latch input line 114, a latch circuit 113, and the test data write lines 11 and 12. When substitution to the supplementary bit line is performed in the test of the peripheral circuits, part of the test circuit 118 connected to the defective bit line pair is disconnected from other parts thereof. The test result is read out to the data output terminal 127 through the test result output line 120, the switch 121, and the data output circuit 125. Furthermore, the test result is transferred to the tester, and its voltage level is detected by the tester. The above operations are repeated while sequentially shifting the positions of the word lines. When the tester determines that defect remedy using a nonused supplementary line is impossible, the corresponding semiconductor memory is determined to be defective. However, when it is determined that defect remedy can be performed by substitution to supplementary lines, and no defective bits are detected as a result of re-test, the corresponding semiconductor memory is determined to be good. The above-mentioned test mode is canceled by the cycle shown in FIG. 54(b).

The detailed arrangements of the test circuit 118 and the supplementary test circuit 118A in FIG. 60 are the same as those described in the above embodiments. The test data write control circuit 110 can employ the arrangement shown in FIG. 56, the latch circuit 113 can employ the arrangement shown in FIG. 57, the switch 121 can employ the arrangement shown in FIG. 58, and the data input circuit 124 can employ the arrangement shown in FIG. 17. Furthermore, when an I/O COMMON structure is applied to this embodiment, the arrangement shown in FIG. 18.

As described above, according to the embodiment shown in FIG. 30, since the simultaneous write and comparison operations of test data can be performed in units of word lines, a test time can be shortened to 1/n that in a test for every bit of a memory cell. In this case n indicates the number of memory cells connected to a word line and subjected to the simultaneous write and comparison operations, and normally takes a large value, e.g., 500 or 1000 or more. Since the test mode can be set and canceled in accordance with the transition timings of the clocks $\overline{RAS}$, $\overline{CAS}$, and $\overline{WE}$ and the voltage level of the write identification signal, the test order of the test flow shown in FIG. 45 can be easily modified, and test efficiency can be improved.

In the embodiments of the present invention, the input terminal of the write identification terminal is illustrated as a terminal which can be commonly used in the semiconductor memory, e.g., an address input terminal. However, the input terminal may be a data input terminal or a data input/output terminal. Alternatively, a test terminal may be additionally provided. In the embodiments of the present invention, a simultaneous write and comparison method of test data in units of word lines has been exemplified. For example, a plurality of word lines can be multiple-selected, so that test data is written in all the memory cells by several times of write operations. The test may be performed in units of multi-divided word lines divided in the memory cell array. Therefore, in the present invention, a processing unit of the simultaneous write and comparison operation is not limited to one word line but can be one or a plurality of word lines or a part of a word line.

The present invention can be similarly applied to a high-density memory array arrangement for a very large capacity semiconductor memory in which the bit lines have a hierarchical structure, and sense circuits are arranged at two sides of a memory cell array.

According to the embodiments shown in FIGS. 52 to 60 as described above, "0" or "1" test data is simultaneously written from an external terminal for inputting/outputting normal data in a plurality of main and supplementary memory cells connected to the selected word line and the supplementary word line, and the test data written in the memory cells and the supplementary memory cells connected to the selected word line and the supplementary word line is simultaneously compared with "0" or "1" expected value data applied to the external terminal for inputting/outputting normal data, thereby greatly reducing a time required for write and comparison operations. Therefore, a semiconductor memory in which a test time can be greatly shortened can be realized. Since the order of tests of the peripheral circuits, memory cell arrays, and the like which are separately executed can be easily modified, test efficiency can be improved.

If a plurality of main and supplementary word lines are multiple-selected, test data can be written in all the memory cells by one or several write operations. Therefore, the same effect as above can be provided.

What is claimed is:

1. A semiconductor memory comprising:
   a plurality of memory cells which are arranged in a matrix;
   a plurality of bit lines and a plurality of word lines connected to said plurality of memory cells for performing read/write access of data to said memory cells;
   a row decoder;
   a word driver;
   a sense circuit;
   a column decoder;
   a multiplexer for controlling read/write access of data; and
   a test circuit, said test circuit comprising external terminal means for sending test data and expected value data,
   simultaneous write means for simultaneously writing the test data from said external terminal means to said plurality of memory cells, and
   simultaneous comparison means for simultaneously comparing the expected value data supplied from said external terminal means to the test data written in said plurality of memory cells, said simultaneous write means in said test circuit writing the test data to said plurality of memory cells connected to a selected word line, said simultaneous write means being constituted by a plurality of test data write control gates, each gate formed at a respective pair of bit lines to write the test data into said plurality of memory cells connected to said selected word line, the total of said test data write control gates corresponding to all pairs of bit lines in said matrix, and a pair of bit lines being directly connected to said data write control gate, said simultaneous comparison means comparing the expected value data with the test data written in said plurality of memory cells connected to said selected word line, said simultaneous comparison means being constituted by logic circuits receiving a plurality of outputs from a plurality of comparators, each comparator being formed at a respective pair of bit lines, the total of said plurality of comparators corresponding to all pairs of bit lines, and each of said pairs of bit lines being directly connected to a respective one of said comparators.

2. A memory according to claim 1, wherein main bit lines are provided which are not connected to the memory cells but to the bit lines via controlled switches.

3. A memory according to claim 1 wherein the expected value data has the same value as the test data or inverted data of the test data.

4. A memory according to claim 1, wherein said bit lines have a folded bit line connection arrangement with respect to said memory cells.

5. A memory according to claim 1, wherein said bit lines have an open bit line connection arrangement with respect to said memory cells.

6. A memory according to claim 1, wherein sense circuits connected to said bit lines are arranged at two sides of the matrix.

7. A memory according to claim 1, wherein said external terminal means includes independent input and output circuits.

8. A memory according to claim 1, wherein said external means includes an input/output common circuit.

9. A memory according to claim 1, wherein said external terminal means also has a function of a data input/output terminal, and wherein the memory further comprises:
test mode setting signal generators for detecting level transition timings of fundamental clocks and sending test mode setting signals; and
switch means, said switch means connecting said external terminal means not to said multiplexer but to said test circuit, and transmitting the test data and the expected value data to said test circuit upon reception of the test mode setting signals.

10. A memory according to claim 9, wherein said switch means switches said external terminal means from a data transmission system for said memory cells to said simultaneous write means and said simultaneous comparison means upon reception of the test mode setting signal and a write control signal of the test data.

11. A memory according to claim 9, wherein the fundamental clocks comprise a row control clock, a column control clock, and a write control clock for said memory cell matrix.

12. A memory according to claim 9, further comprising latch means between said switch means and said test circuit.

13. A memory according to claim 1, wherein said memory cells arranged in the matrix comprise a plurality of main memory cells and a plurality of supplementary memory cells for defect remedy, a plurality of bit lines, a plurality of supplementary bit lines, a plurality of word lines and a plurality of supplementary word lines connected to said plurality of main memory cells and supplementary memory cells for performing read/write access of data to said memory cells, and having a supplementary row decoder and supplementary column decoder, a supplementary sense circuit, supplementary multiplexer and supplementary word driver, and further comprises:
said simultaneous write means writes the test data in said plurality of main memory cells and supplementary memory cells connected to a selected word line, said plurality of supplementary memory cells connected to a selected supplementary word line, said simultaneous write means being constituted by a plurality of test data write control gates formed at a pair of bit lines and a pair of supplementary bit lines, the total of said test data write control gates corresponding to all pairs of bit lines and all pairs of supplementary bit lines in said matrix, and a pair of bit lines and a pair of supplementary bit lines being directly connected to said test data write control gate,
said simultaneous comparison means compares the expected value data with the test data written in said plurality of main memory cells and supplementary memory cells connected to a selected word line and the test-data written in said plurality of supplementary memory cells connected to a selected supplementary word line, said simultaneous comparison means being constituted by logic circuits receiving a plurality of outputs from a plurality of comparators respectively formed at a pair of bit lines and at a pair of supplementary bit lines, the total of said plurality of said comparators corresponding to all pairs of bit lines and all pairs of supplementary bit lines, and each of said pairs of bit lines and each of said pairs of supplementary bit lines being directly connected to a respective one of said comparators.

14. A memory according to claim 13, wherein said test circuit comprises switching control means for disconnecting a defective memory cell from said simultaneous comparison means and connecting the supplementary memory cell to the corresponding portion.

15. A memory according to claim 14, wherein said switching control means comprises a storage element, said storage element being arranged to change its storage value when a defect occurs.

16. A memory according to claim 15, wherein the storage value corresponds to an address of the defective memory cell.

17. A memory according to claim 13, wherein said external terminal means also has a function of a data input/output terminal, and wherein the memory further comprises:
test mode setting signal generators for detecting level transition timings of fundamental clocks and sending test mode setting signals, and
switch means, said switch means connecting said external terminals means not to said multiplexer but to said test circuit, and transmitting the test data and the expected value data to said test circuit upon reception of the test mode setting signals.

18. A memory according to claim 17, further comprising latch means between said switch means and said test circuit.

19. A memory according to claim 17, wherein said external terminal means includes independent input and output circuits.

20. A memory according to claim 17, wherein said external terminal means includes a common input/output circuit.

21. A method of testing a semiconductor memory comprising:
using a semiconductor memory comprising:
a plurality of memory cells which are arranged in a matrix, peripheral circuits and data I/O lines for selectively writing in or reading out data from selected ones of said memory cells, and a test circuit comprising:
external terminal means for sending test data and expected value data, simultaneous write means for simultaneously writing the test data from said external terminal means to said plurality of memory cells, and simultaneous comparison means for simultaneously comparing the expected value data supplied from said external terminal means to the test data written in said plurality of memory cells, said simultaneous write means writing the test data into said plurality of memory cells connected to a selected word line, said simultaneous write means being constituted by a plurality of test data write control gates, each gate formed at a respective pair of bit lines, the total of said test data write control gates corresponding to all pairs of bit lines in said matrix, and said pair of bit lines being directly connected to said test data write control gate, said simultaneous comparison means comparing the expected value data with the test data written in said plurality of memory cells connected to a selected word line, said simultaneous comparison means being constituted by logic circuits receiving a plurality of outputs from a plurality of comparators, each comparator being formed at a respective pair of bit lines, the total of said plurality of comparators corresponding to all pairs of bit lines, and each of said pairs of bit lines being directly connected to a respective one of said comparators, said method comprising:

sequentially testing predetermined portions of said test circuit in a predetermined order and stopping subsequent tests when a defect is detected, and simultaneously writing test data in predetermined memory cells connected to bit lines intersecting one word line or one supplementary word line when said memory cells serve as objects to be tested, and thereafter comparing readout data with expected value data to check the memory cell connected to said word line.

22. A method according to claim 21, wherein in the test, said peripheral circuit has a highest priority order, and circuits other than said peripheral circuit have the second highest priority order.

23. A method according to claim 21, wherein in the test, said peripheral circuit is tested first, said test circuit is tested second, and said memory cells are tested last.

24. A method according to claim 21, wherein the test of said peripheral circuit is performed for a portion corresponding to a memory cell line along at least one diagonal line of said memory cells on the matrix.

25. A method according to claim 21, wherein the test of said peripheral circuit is performed for a portion corresponding to a memory cell line along at least one diagonal line, a portion corresponding to a memory cell line along at least one word line, and a portion corresponding to a memory cell line along at least one bit line, of said memory cells on the matrix.

26. A method according to claim 21, wherein the test of said peripheral circuit is performed for a portion corresponding to a memory cell line along at least one word line, and a portion corresponding to a memory cell line along at least one bit line, of said memory cells on the matrix.

27. A method according to claim 21, wherein the test data and the expected value data for the test are externally input data.

28. A method according to claim 21, wherein the test data and the expected value data for the test are data stored in an internal memory element which is externally selected to perform a corresponding test.

29. A method according to claim 21, wherein the test is divided into a plurality of steps depending on portions to be tested, and a result of each test is checked after each step of the test is completed.

30. A method according to claim 21, wherein the test is divided into a plurality of steps depending on portions to be tested, and a result of each test is checked during each step of the test.

31. A method according to claim 21, wherein said memory cells arranged in the matrix comprise a plurality of main memory cells and a plurality of supplementary memory cells for defect remedy, a plurality of bit lines, a plurality of supplementary bit lines, a plurality of word lines and a plurality of supplementary word lines connected to said plurality of main memory cells and supplementary memory cells for performing read/write access of data to said memory cells, and said semiconductor memory further having a supplementary row decoder and supplementary column decoder, a supplementary sense circuit, supplementary multiplexer and supplementary word driver, and further comprises:

said simultaneous write means writes the test data in said plurality of main memory cells and supplementary memory cells connected to a selected word line, said plurality of supplementary memory cells connected to a selected supplementary word line, said simultaneous write means being constituted by plurality of test data write control gates, formed at a pair of bit lines and a pair of supplementary bit lines, the total of said test data write control gates corresponding to all pairs of bit lines and all pairs of supplementary bit lines in said matrix, and a pair of bit lines and a pair of supplementary bit lines being directly connected to said test data write control gate, said simultaneous comparison means compares the expected value data with the test data written in said plurality of main memory cells and supplementary memory cells connected to a selected word line and the test data written in said plurality of supplementary memory cells connected to a selected supplementary word line, said simultaneous comparison means being constituted by logic circuits receiving a plurality of outputs from a plurality of comparators, each comparator being formed at a respective pair of bit lines and at a pair of supplementary bit lines, the total of said plurality of said comparators corresponding to all pairs of bit lines and all pairs or supplementary bit lines, and each of said pairs of bit lines and each of said pairs of supplementary bit lines being directly connected to a respective one of said comparators, said method comprising:

sequentially testing predetermined portions by said test circuit in a predetermined order and inhibiting subsequent tests when the defect remedy cannot be performed by substituting a defective memory cell with the supplementary memory cell, and simultaneously writing test data in predetermined memory cells connected to bit lines and supplementary bit lines intersecting one word line or one supplementary word line when said main memory cells and said supplementary memory cells serve as objects to be tested, and thereafter, comparing readout data with expected value data to check the memory cells connected to said word line or said supplementary word line.

32. A method according to claim 31, wherein in the test, said peripheral circuit has a highest priority order, and circuits other than said peripheral circuit have the second highest priority order.

33. A method according to claim 31, wherein in the test, said peripheral circuit is tested first, said test circuit is tested second, and said memory cells are tested last.

34. A method according to claim 31, wherein the test of said peripheral circuit is performed for a portion corresponding to a memory cell line along at least one diagonal line of said memory cells on the matrix.

35. A method according to claim 31, wherein the test of said peripheral circuit is performed for a portion corresponding to a memory cell line along at least one diagonal line, a portion corresponding to a memory cell line along at least one word line, and a portion corresponding to a memory cell line along at least one bit line, of said memory cells on the matrix.

36. A method according to claim 31, wherein the test of said peripheral circuit is performed for a portion corresponding to a portion corresponding to a memory cell line along at least one word line, and a portion corresponding to a memory cell line along at least one bit line, of said memory cells on the matrix.

* * * * *